US012635411B2

(12) United States Patent
Nüllen et al.

(10) Patent No.: US 12,635,411 B2
(45) Date of Patent: May 19, 2026

(54) ORGANIC ELECTROLUMINESCENT DEVICE COMPRISING A COMPOUND OF FORMULA (I) AND AN ORGANIC ELECTRONIC DEVICE COMPRISING THE ORGANIC ELECTROLUMINESCENT DEVICE

(71) Applicant: Novaled GmbH, Dresden (DE)

(72) Inventors: Max Peter Nüllen, Dresden (DE); Benjamin Schulze, Dresden (DE); Jakob Jacek Wudarczyk, Dresden (DE); Regina Luschtinetz, Dresden (DE)

(73) Assignee: Novaled GmbH, Dresden (DE)

(*) Notice: Subject to any disclaimer, the term of this patent is extended or adjusted under 35 U.S.C. 154(b) by 15 days.

(21) Appl. No.: 18/262,485

(22) PCT Filed: Jun. 1, 2023

(86) PCT No.: PCT/EP2023/064698

§ 371 (c)(1),
(2) Date: Jul. 21, 2023

(87) PCT Pub. No.: WO2023/232946

PCT Pub. Date: Dec. 7, 2023

(65) Prior Publication Data

US 2025/0089558 A1 Mar. 13, 2025

(30) Foreign Application Priority Data

Jun. 3, 2022 (EP) .................................... 22177221

(51) Int. Cl.

| | |
|---|---|
| *H01L 51/54* | (2006.01) |
| *H10K 85/60* | (2023.01) |
| *H10K 50/19* | (2023.01) |
| *H10K 101/20* | (2023.01) |
| *H10K 101/30* | (2023.01) |

(52) U.S. Cl.

CPC ........... *H10K 85/657* (2023.02); *H10K 50/19* (2023.02); *H10K 2101/20* (2023.02); *H10K 2101/30* (2023.02)

(58) Field of Classification Search

None

See application file for complete search history.

(56) References Cited

U.S. PATENT DOCUMENTS

2020/0087311 A1 3/2020 Cui et al.

FOREIGN PATENT DOCUMENTS

| | | |
|---|---|---|
| EP | 2722908 A1 | 4/2014 |
| KR | 20210053130 A | 5/2021 |

OTHER PUBLICATIONS

International Search Report and Written Opinion issued in international application No. PCT/EP2023/064698, mailed Aug. 25, 2023 (11 pages).

Tlach et al., Tuning the Optical and Electronic Properties of 4,8-Disubstituted Benzobisoxazoles via Alkyne Substitution, J. Org. Chem. 2011, 76, 8670-8681.

Extended European Search Reporting issued in European application No. 22177221.3, dated Nov. 21, 2022, 7 pages.

International Preliminary Report on Patentability issued in international application No. PCT/EP2023/064698, dated Nov. 7, 2024 (6 pages).

*Primary Examiner* — Andrew K Bohaty

(74) *Attorney, Agent, or Firm* — Eversheds Sutherland (US) LLP

(57) ABSTRACT

The present invention relates to an organic electroluminescent device comprising a compound of Formula (I):

(I)

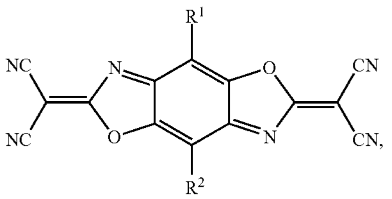

and an organic electronic device comprising the organic electroluminescent device.

28 Claims, 3 Drawing Sheets

ORGANIC ELECTROLUMINESCENT DEVICE COMPRISING A COMPOUND OF FORMULA (I) AND AN ORGANIC ELECTRONIC DEVICE COMPRISING THE ORGANIC ELECTROLUMINESCENT DEVICE

CROSS-REFERENCE TO RELATED APPLICATIONS

This application is a U.S. national phase entry of PCT/EP2023/064698, filed Jun. 1, 2023, which claims priority to European Patent Application No. 22177221.3, filed Jun. 3, 2022. The content of these applications is incorporated by referenced herein.

TECHNICAL FIELD

The present invention relates to an organic electroluminescent device comprising a compound of Formula (I) and an organic electronic device comprising the organic electroluminescent device.

BACKGROUND ART

Organic electronic devices, such as organic light-emitting diodes OLEDs, which are self-emitting devices, have a wide viewing angle, excellent contrast, quick response, high brightness, excellent operating voltage characteristics, and color reproduction. A typical OLED comprises an anode, a hole transport layer HTL, an emission layer EML, an electron transport layer ETL, and a cathode, which are sequentially stacked on a substrate. In this regard, the HTL, the EML, and the ETL are thin films formed from organic compounds.

When a voltage is applied to the anode and the cathode, holes injected from the anode move to the EML, via the HTL, and electrons injected from the cathode move to the EML, via the ETL. The holes and electrons recombine in the EML to generate excitons. When the excitons drop from an excited state to a ground state, light is emitted. The injection and flow of holes and electrons should be balanced, so that an OLED having the above-described structure has excellent efficiency and/or a long lifetime.

Performance of an organic light emitting diode may be affected by characteristics of the semiconductor layer, and among them, may be affected by characteristics of metal complexes which are also contained in the semiconductor layer.

There remains a need to improve performance of organic semiconductor materials, semiconductor layers, as well as organic electroluminescent devices and organic electronic devices comprising an organic electroluminescent device, in particular to achieve improved operating voltage, improved efficiency, improved lifetime and/or improved voltage stability over time through improving the characteristics of the compounds comprised therein. In addition, there remains a need to improved LUMO energy, improve the dipole moment and/or improve the thermal properties compared to comparative examples, in particular to improve thermal stability and/or processing properties at elevated temperatures.

DISCLOSURE

An aspect of the present invention provides an organic electroluminescent device comprising an anode layer, a cathode layer, an organic semiconductor layer, at least one first or more charge generation layers, at least two or more light-emitting units, wherein each light-emitting unit comprises a light-emitting layer;

at least one charge generation layer comprises a p-type charge generation layer, wherein the organic semiconductor layer is arranged closer to the anode layer than the p-type charge generation layer, and wherein the organic semiconductor layer comprises an organic hole transport material and a compound of Formula (I), and the p-type charge generation layer comprises an organic hole transport material and a compound of Formula (I):

(I)

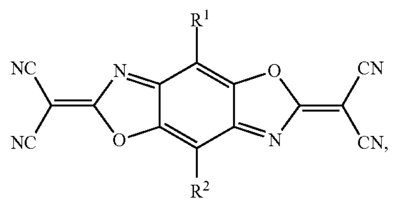

$R^1$ and $R^2$ are independently selected from the group comprising of substituted or unsubstituted phenyl, substituted or unsubstituted pyridinyl, substituted or unsubstituted pyrimidyl, substituted or unsubstituted triazinyl, wherein the one or more substituents on $R^1$ and $R^2$ are independently selected from the group comprising of partially fluorinated or perfluorinated $C_1$ to $C_6$ alkyl, $CF_3$, partially fluorinated or perfluorinated $C_1$ to $C_4$ alkoxy, $OCF_3$, partially fluorinated or perfluorinated $C_1$ to $C_4$ alkylsulfonyl, $SO_2CF_3$, F, CN, $NO_2$, $SF_5$, D and H; or $R^1$ has the Formula (IIa):

(IIa)

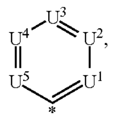

and $R^2$ has the Formula (IIb),

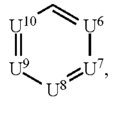

wherein $U^1$ is selected from $CQ^1$ or N; $U^2$ is selected from $CQ^2$ or N; $U^3$ is selected from $CQ^3$ or N; $U^4$ is selected from $CQ^4$ or N; $U^8$ is selected from $CQ^5$ or N; $U^6$ is selected from $CQ^6$ or N; $U^7$ is selected from $CQ^7$ or N; $U^8$ is selected from $CQ^8$ or N; $U^9$ is selected from $CQ^9$ or N; $U^{10}$ is selected from $CQ^{10}$ or N; wherein $Q^1$, $Q^2$, $Q^3$, $Q^4$, $Q^5$, $Q^6$, $Q^7$, $Q^8$, $Q^9$ and $Q^{10}$ are independently selected from the group comprising partially fluorinated or perfluorinated $C_1$ to $C_6$ alkyl, $CF_3$, partially fluorinated or perfluorinated $C_1$ to $C_4$ alkoxy, $OCF_3$, partially fluorinated or perfluorinated $C_1$ to $C_4$ alkylsulfonyl, $SO_2CF_3$, F, CN, $NO_2$, $SF_5$, D and H; and wherein the asterisk "*" denotes the binding position; and wherein the organic semiconductor layer and the p-type charge generation layer comprises the same compound according to Formula (I).

It should be noted that throughout the application and the claims any $R^1$, $R^2$, $Q^1$, $Q^2$, $Q^3$, $Q^4$, $Q^5$, $Q^6$, $Q^7$, $Q^8$, $Q^9$ and $Q^{10}$ etc. always refer to the same moieties, unless otherwise noted.

In the present specification, when a definition is not otherwise provided, "partially fluorinated" refers to a $C_1$ to $C_6$ alkyl group in which only part of the hydrogen atoms are replaced by fluorine atoms.

In the present specification, when a definition is not otherwise provided, "perfluorinated" refers to a $C_1$ to $C_6$ alkyl group in which all hydrogen atoms are replaced by fluorine atoms.

In the present specification, when a definition is not otherwise provided, "substituted" refers to one substituted with a partially fluorinated or perfluorinated $C_1$ to $C_6$ alkyl, $CF_3$, partially fluorinated or perfluorinated $C_1$ to $C_4$ alkoxy, $OCF_3$, partially fluorinated or perfluorinated $C_1$ to $C_4$ alkylsulfonyl, $SO_2CF_3$, F, CN, $NO_2$, $SF_5$, D and H.

In the present specification, when a definition is not otherwise provided, an "alkyl group" refers to a saturated aliphatic hydrocarbyl group. The alkyl group may be a $C_1$ to $C_6$ alkyl group. For example, a $C_1$ to $C_4$ alkyl group includes 1 to 4 carbons in alkyl chain, and may be selected from methyl, ethyl, propyl, iso-propyl, n-butyl, iso-butyl, sec-butyl, and tert-butyl.

Specific examples of the alkyl group may be a methyl group, an ethyl group, a propyl group, an isopropyl group, a butyl group, an iso-butyl group, a sec-butyl group, a tert-butyl group, a pentyl group, a hexyl group.

The term "fused aryl rings" or "condensed aryl rings" is understood the way that two aryl rings are considered fused or condensed when they share at least two common $sp^2$-hybridized carbon atoms.

The term "six-member ring" is understood to mean a ring formed by 6 atoms. The ring-forming atoms of the "six-member ring" may be bonded to further atoms outside the ring, for example hydrogen atoms.

The term "five-member ring" is understood to mean a ring formed by 5 atoms. The ring-forming atoms of the "five-member ring" may be bonded to further atoms outside the ring, for example hydrogen atoms.

In the present specification, the single bond refers to a direct bond.

The term "free of", "does not contain", "does not comprise" does not exclude impurities which may be present in the compounds prior to deposition. Impurities have no technical effect with respect to the object achieved by the present invention.

The term "contacting sandwiched" refers to an arrangement of three layers whereby the layer in the middle is in direct contact with the two adjacent layers.

The terms "light-absorbing layer" and "light absorption layer" are used synonymously.

The terms "light-emitting layer", "light emission layer" and "emission layer" are used synonymously.

The terms "p-type charge generation layer" and "p-CGL" are used synonymously.

The terms "n-type charge generation layer" and "n-CGL" are used synonymously.

The terms "OLED", "organic light-emitting diode" and "organic light-emitting device" are used synonymously.

The terms "anode", "anode layer" and "anode electrode" are used synonymously.

The terms "cathode", "cathode layer" and "cathode electrode" are used synonymously.

In the specification, hole characteristics refer to an ability to donate an electron to form a hole when an electric field is applied and that a hole formed in the anode may be easily injected into the emission layer and transported in the emission layer due to conductive characteristics according to a highest occupied molecular orbital (HOMO) level.

In addition, electron characteristics refer to an ability to accept an electron when an electric field is applied and that electrons formed in the cathode may be easily injected into the emission layer and transported in the emission layer due to conductive characteristics according to a lowest unoccupied molecular orbital (LUMO) level.

ADVANTAGEOUS EFFECTS

Surprisingly, it was found that the organic compound of the present invention according to Formula (I) solves the problem underlying the present invention by enabling devices in various aspects superior over the organic electroluminescent devices known in the art, with respect to operating voltage, efficiency and/or lifetime, and in particular with respect to operating voltage, efficiency and voltage stability over time. It has be further surprisingly found that compounds of Formula (I) may have improved LUMO energy, improved dipole moment and/or improved thermal properties compared to comparative examples, in particular improved thermal stability and/or processing properties at elevated temperatures.

Without being bound by theory, the thermal properties may be improved when Formula (I) is selected in the claimed weight-% range based on the total weight of the organic semiconductor layer. Thereby, the thermal stability, as determined by TGA5%, and volatility, as determined by the rate onset temperature, may be in the range required for mass production.

Surprisingly, it was found that the LUMO energy may be in the range required for efficient hole injection and/or hole generation.

Organic Electroluminescent Device

According to one embodiment of the present invention, the organic electroluminescent device comprising an anode layer, a cathode layer, an organic semiconductor layer, at least one first or more charge generation layers, at least two or more light-emitting units, wherein

- each light-emitting unit comprises a light-emitting layer;
- at least one charge generation layer comprises a n-type charge generation layer and a p-type charge generation layer, wherein the organic semiconductor layer is arranged closer to the anode layer than the p-type charge generation layer, and wherein the organic semiconductor layer comprises an organic hole transport material and a compound of Formula (I), and the p-type charge generation layer comprises an organic hole transport material and a compound of Formula (I):

(I)

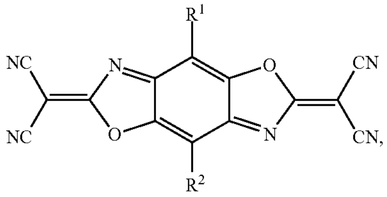

$R^1$ and $R^2$ are independently selected from the group comprising of substituted or unsubstituted phenyl, substituted or unsubstituted pyridinyl, substituted or unsubstituted pyrimidyl, substituted or unsubstituted triazinyl, wherein the one or more substituents on $R^1$ and $R^2$ are independently selected from the group comprising of partially fluorinated or perfluorinated $C_1$ to $C_6$ alkyl, $CF_3$, partially fluorinated or perfluorinated $C_1$ to $C_4$ alkoxy, $OCF_3$, partially fluorinated or perfluorinated $C_1$ to $C_4$ alkylsulfonyl, $SO_2CF_3$, F, CN, $NO_2$, $SF_5$, D and H; or $R^1$ has the Formula (IIa):

(IIa)

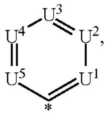

and

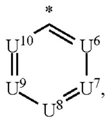

wherein $U^1$ is selected from $CQ^1$ or N; $U^2$ is selected from $CQ^2$ or N; $U^3$ is selected from $CQ^3$ or N; $U^4$ is selected from $CQ^4$ or N; $U^5$ is selected from $CQ^5$ or N; $U^6$ is selected from $CQ^6$ or N; $U^7$ is selected from $CQ^7$ or N; $U^8$ is selected from $CQ^8$ or N; $U^9$ is selected from $CQ^9$ or N; $U^{10}$ is selected from $CQ^{10}$ or N; wherein $Q^1$, $Q^2$, $Q^3$, $Q^4$, $Q^5$, $Q^6$, $Q^7$, $Q^8$, $Q^9$ and $Q^{10}$ are independently selected from the group comprising of the group comprising of partially fluorinated or perfluorinated $C_1$ to $C_6$ alkyl, $CF_3$, partially fluorinated or perfluorinated $C_1$ to $C_4$ alkoxy, $OCF_3$, partially fluorinated or perfluorinated $C_1$ to $C_4$ alkylsulfonyl, $SO_2CF_3$, F, CN, $NO_2$, $SF_5$, D and H; and wherein the asterisk "*" denotes the binding position; and wherein the organic semiconductor layer and the p-type charge generation layer comprises the same compound according to Formula (I).

According to one embodiment of the present invention, the organic electroluminescent device comprising an anode layer, a cathode layer, an organic semiconductor layer, at least one first or more charge generation layers, at least two or more light-emitting units, wherein each light-emitting unit comprises a light-emitting layer; at least one charge generation layer comprises a p-type charge generation layer, wherein the organic semiconductor layer is arranged closer to the anode layer than the p-type charge generation layer, and wherein the organic semiconductor layer comprises an organic hole transport material and a compound of Formula (I), and the p-type charge generation layer comprises an organic hole transport material and a compound of Formula (I):

(I)

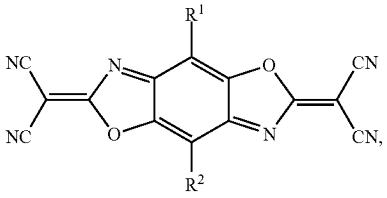

$R^1$ and $R^2$ are independently selected from the group comprising of substituted or unsubstituted phenyl, substituted or unsubstituted pyridinyl, substituted or unsubstituted pyrimidyl, substituted or unsubstituted triazinyl, wherein the one or more substituents on $R^1$ and $R^2$ are independently selected from the group comprising of partially fluorinated or perfluorinated $C_1$ to $C_3$ alkyl, $CF_3$, $C_2F_5$, partially fluorinated or perfluorinated $C_1$ to $C_2$ alkoxy, $OC_2F_5$, $OCF_3$, partially fluorinated or perfluorinated $C_1$ to $C_4$ alkylsulfonyl, $SO_2C_2F_5$, $SO_2CF_3$, F, CN, $NO_2$, $SF_5$; or $R^1$ has the Formula (IIa):

(IIa)

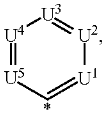

and $R^2$ has the Formula (IIb),

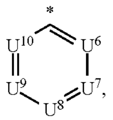

wherein $U^1$ is selected from $CQ^1$ or N; $U^2$ is selected from $CQ^2$ or N; $U^3$ is selected from $CQ^3$ or N; $U^4$ is selected from $CQ^4$ or N; $U^5$ is selected from $CQ^5$ or N; $U^6$ is selected from $CQ^6$ or N; $U^7$ is selected from $CQ^7$ or N; $U^8$ is selected from $CQ^8$ or N; $U^9$ is selected from $CQ^9$ or N; $U^{10}$ is selected from $CQ^{10}$ or N; wherein $Q^1$, $Q^2$, $Q^3$, $Q^4$, $Q^5$, $Q^6$, $Q^7$, $Q^8$, $Q^9$ and $Q^{10}$ are independently selected from the group comprising of partially fluorinated or perfluorinated $C_1$ to $C_3$ alkyl, $CF_3$, $C_2F_5$, partially fluorinated or perfluorinated $C_1$ to $C_2$ alkoxy, $OC_2F_5$, $OCF_3$, partially fluorinated or perfluorinated $C_1$ to $C_4$ alkylsulfonyl, $SO_2C_2F_5$, $SO_2CF_3$, F, CN, $NO_2$, $SF_5$;

wherein the asterisk "*" denotes the binding position; and wherein the organic semiconductor layer and the p-type charge generation layer comprises the same compound according to Formula (I).

An aspect of the present invention provides an organic electroluminescent device comprising an anode layer, a cathode layer, an organic semiconductor layer, at least one first or more charge generation layers, at least two or more light-emitting units, wherein each light-emitting unit comprises a light-emitting layer;

at least one charge generation layer comprises a p-type charge generation layer and at least one n-type charge generation layer, wherein the n-type charge generation layer and the p-type charge generation layer of the charge generation layer are arranged in a direct contact;

wherein the organic semiconductor layer is arranged closer to the anode layer than the p-type charge generation layer, and wherein the organic semiconductor layer comprises an organic hole transport material and a compound of Formula (I), and the p-type charge generation layer comprises an organic hole transport material and a compound of Formula (I):

(I)

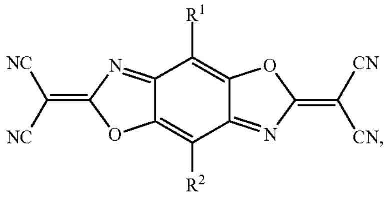

$R^1$ and $R^2$ are independently selected from the group comprising of substituted or unsubstituted phenyl, substituted or unsubstituted pyridinyl, substituted or unsubstituted pyrimidyl, substituted or unsubstituted triazinyl, wherein the one or more substituents on $R^1$ and $R^2$ are independently selected from the group comprising of partially fluorinated or perfluorinated $C_1$ to $C_6$ alkyl, $CF_3$, partially fluorinated or perfluorinated $C_1$ to $C_4$ alkoxy, $OCF_3$, partially fluorinated or perfluorinated $C_1$ to $C_4$ alkylsulfonyl, $SO_2CF_3$, F, CN, $NO_2$, $SF_5$, D and H; or $R^1$ has the Formula (IIa):

(IIa)

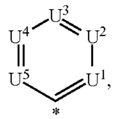

and $R^2$ has the Formula (IIb),

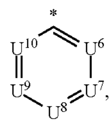

wherein $U^1$ is selected from $CQ^1$ or N; $U^2$ is selected from $CQ^2$ or N; $U^3$ is selected from $CQ^3$ or N; $U^4$ is selected from $CQ^4$ or N; $U^5$ is selected from $CQ^5$ or N; $U^6$ is selected from $CQ^6$ or N; $U^7$ is selected from $CQ^7$ or N; $U^8$ is selected from $CQ^8$ or N; $U^9$ is selected from $CQ^9$ or N; $U^{10}$ is selected from $CQ^{10}$ or N; wherein $Q^1$, $Q^2$, $Q^3$, $Q^4$, $Q^5$, $Q^6$, $Q^7$, $Q^8$, $Q^9$ and $Q^{10}$ are independently selected from the group comprising of the group comprising of partially fluorinated or perfluorinated $C_1$ to $C_6$ alkyl, $CF_3$, partially fluorinated or perfluorinated $C_1$ to $C_4$ alkoxy, $OCF_3$, partially fluorinated or perfluorinated $C_1$ to $C_4$ alkylsulfonyl, $SO_2CF_3$, F, CN, $NO_2$, $SF_5$, D and H; and wherein the asterisk "*" denotes the binding position; and wherein the organic semiconductor layer and the p-type charge generation layer comprises the same compound according to Formula (I).

According to one embodiment of the present invention, the organic electroluminescent device comprising an anode layer, a cathode layer, an organic semiconductor layer, at least one first or more charge generation layers, at least two or more light-emitting units, wherein each light-emitting unit comprises a light-emitting layer;

at least one charge generation layer comprises a p-type charge generation layer, wherein the organic semiconductor layer is arranged closer to the anode layer than the p-type charge generation layer, and wherein the organic semiconductor layer comprises an organic hole transport material and a compound of Formula (I), and the p-type charge generation layer comprises an organic hole transport material and a compound of Formula (I):

(I)

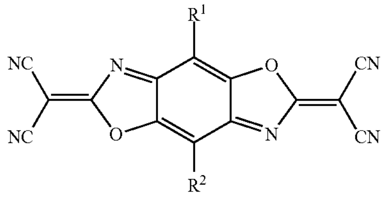

$R^1$ and $R^2$ are independently selected from the group comprising of substituted or unsubstituted phenyl, substituted or unsubstituted pyridinyl, substituted or unsubstituted pyrimidyl, substituted or unsubstituted triazinyl, wherein the one or more substituents on $R^1$ and $R^2$ are independently selected from the group comprising of partially fluorinated or perfluorinated $C_1$ to $C_3$ alkyl, $CF_3$, $C_2F_5$, partially fluorinated or perfluorinated $C_1$ to $C_2$ alkoxy, $OC_2F_5$, $OCF_3$, partially fluorinated or perfluorinated $C_1$ to $C_4$ alkylsulfonyl, $SO_2C_2F_5$, $SO_2CF_3$, F, CN, $NO_2$, $SF_5$; or $R^1$ has the Formula (IIa):

(IIa)

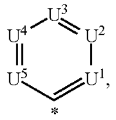

and $R^2$ has the Formula (IIb),

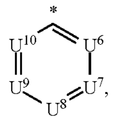

wherein $U^1$ is selected from $CQ^1$ or N; $U^2$ is selected from $CQ^2$ or N; $U^3$ is selected from $CQ^3$ or N; $U^4$ is selected from $CQ^4$ or N; $U^5$ is selected from $CQ^5$ or N; $U^6$ is selected from $CQ^6$ or N; $U^7$ is selected from $CQ^7$ or N; $U^8$ is selected from $CQ^8$ or N; $U^9$ is selected from $CQ^9$ or N; $U^{10}$ is selected from $CQ^{10}$ or N; wherein $Q^1$, $Q^2$, $Q^3$, $Q^4$, $Q^5$, $Q^6$, $Q^7$, $Q^8$, $Q^9$ and $Q^{10}$ are independently selected from the group comprising of partially fluorinated or perfluorinated $C_1$ to $C_3$ alkyl, $CF_3$, $C_2F_5$, partially fluorinated or perfluorinated $C_1$ to $C_2$ alkoxy, $OC_2F_5$, $OCF_3$, partially fluorinated or perfluorinated $C_1$ to $C_4$ alkylsulfonyl, $SO_2C_2F_5$, $SO_2CF_3$, F, CN, $NO_2$, $SF_5$;

wherein the asterisk "*" denotes the binding position; and wherein $R^1$ and $R^2$ are selected the same; and wherein the organic semiconductor layer and the p-type charge generation layer comprises the same compound according to Formula (I).

According to one embodiment of the present invention, the organic electroluminescent device comprising an anode layer, a cathode layer, an organic semiconductor layer, at least one first or more charge generation layers, at least two or more light-emitting units, wherein each light-emitting unit comprises a light-emitting layer;

at least one charge generation layer comprises a p-type charge generation layer, wherein the organic semiconductor layer is arranged closer to the anode layer than the p-type charge generation layer, and wherein the organic semiconductor layer comprises an organic hole transport material and a compound of Formula (I), and the p-type charge generation layer comprises an organic hole transport material and a compound of Formula (I):

(I)

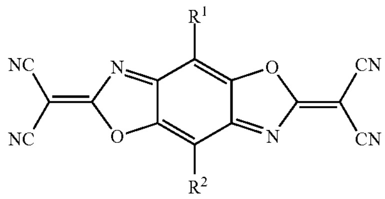

$R^1$ and $R^2$ are independently selected from the group comprising of substituted or unsubstituted phenyl, substituted or unsubstituted pyridinyl, substituted or unsubstituted pyrimidyl, substituted or unsubstituted triazinyl, wherein the one or more substituents on $R^1$ and $R^2$ are independently selected from the group comprising of partially fluorinated or perfluorinated $C_1$ to $C_3$ alkyl, $CF_3$, $C_2F_5$, partially fluorinated or perfluorinated $C_1$ to $C_2$ alkoxy, $OC_2F_5$, $OCF_3$, partially fluorinated or perfluorinated $C_1$ to $C_4$ alkylsulfonyl, $SO_2C_2F_5$, $SO_2CF_3$, F, CN, $NO_2$, $SF_5$; or $R^1$ has the Formula (IIa):

(IIa)

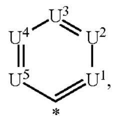

and $R^2$ has the Formula (IIb),

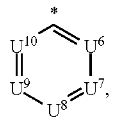

wherein $U^1$ is selected from $CQ^1$ or N; $U^2$ is selected from $CQ^2$ or N; $U^3$ is selected from $CQ^3$ or N; $U^4$ is selected from $CQ^4$ or N; $U^5$ is selected from $CQ^5$ or N; $U^6$ is selected from $CQ^6$ or N; $U^7$ is selected from $CQ^7$ or N; $U^8$ is selected from $CQ^8$ or N; $U^9$ is selected from $CQ^9$ or N; $U^{10}$ is selected from $CQ^{10}$ or N; wherein $Q^1$, $Q^2$, $Q^3$, $Q^4$, $Q^5$, $Q^6$, $Q^7$, $Q^8$, $Q^9$ and $Q^{10}$ are independently selected from the group comprising of partially fluorinated or perfluorinated $C_1$ to $C_3$ alkyl, $CF_3$, $C_2F_5$, partially fluorinated or perfluorinated $C_1$ to $C_2$ alkoxy, $OC_2F_5$, $OCF_3$, partially fluorinated or perfluorinated $C_1$ to $C_4$ alkylsulfonyl, $SO_2C_2F_5$, $SO_2CF_3$, F, CN, $NO_2$, $SF_5$;

wherein the asterisk "*" denotes the binding position, and wherein the compound of Formula (I) is free of a non-hetero five member ring; and wherein the organic semiconductor layer and the p-type charge generation layer comprises the same compound according to Formula (I).

According to one embodiment of the present invention, the organic electroluminescent device comprising an anode layer, a cathode layer, an organic semiconductor layer, at least one first or more charge generation layers, at least two or more light-emitting units, wherein each light-emitting unit comprises a light-emitting layer;

at least one charge generation layer comprises a p-type charge generation layer, wherein the organic semiconductor layer is arranged closer to the anode layer than the p-type charge generation layer, and wherein the organic semiconductor layer comprises an organic hole transport material and a compound of Formula (I), and the p-type charge generation layer comprises an organic hole transport material and a compound of Formula (I):

(I)

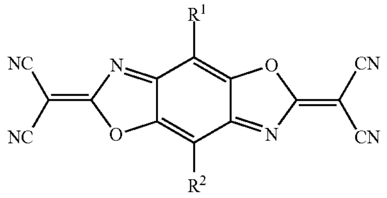

$R^1$ and $R^2$ are independently selected from the group comprising of substituted or unsubstituted phenyl, substituted or unsubstituted pyridinyl, substituted or unsubstituted pyrimidyl, substituted or unsubstituted triazinyl, wherein the one or more substituents on $R^1$ and $R^2$ are independently selected from the group comprising of partially fluorinated or perfluorinated $C_1$ to $C_3$ alkyl, $CF_3$, $C_2F_5$, partially fluorinated or perfluorinated $C_1$ to $C_2$ alkoxy, $OC_2F_5$, $OCF_3$, partially fluorinated or perfluorinated $C_1$ to $C_4$ alkylsulfonyl, $SO_2C_2F_5$, $SO_2CF_3$, F, CN, $NO_2$, $SF_5$; or $R^1$ has the Formula (IIa):

(IIa)

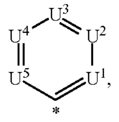

and $R^2$ has the Formula (IIb),

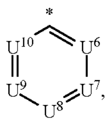

wherein $U^1$ is selected from $CQ^1$ or N; $U^2$ is selected from $CQ^2$ or N; $U^3$ is selected from $CQ^3$ or N; $U^4$ is selected from $CQ^4$ or N; $U^5$ is selected from $CQ^5$ or N; $U^6$ is selected from $CQ^6$ or N; $U^7$ is selected from $CQ^7$ or N; $U^8$ is selected from $CQ^8$ or N; $U^9$ is selected from $CQ^9$ or N; $U^{10}$ is selected from $CQ^{10}$ or N; wherein $Q^1$, $Q^2$, $Q^3$, $Q^4$, $Q^5$, $Q^6$, $Q^7$, $Q^8$, $Q^9$ and $Q^{10}$ are independently selected from the group comprising of partially fluorinated or perfluorinated $C_1$ to $C_3$ alkyl, $CF_3$, $C_2F_5$, partially fluorinated or perfluorinated $C_1$ to $C_2$ alkoxy, $OC_2F_5$, $OCF_3$, partially fluorinated or perfluorinated $C_1$ to $C_4$ alkylsulfonyl, $SO_2C_2F_5$, $SO_2CF_3$, F, CN, $NO_2$, $SF_5$; wherein the asterisk "*" denotes the binding position, and wherein the compound of Formula (I) comprises three 6-member aromatic rings only, wherein at least one of the three 6-member aromatic ring is a $C_6$-member aromatic ring and 0, 1 or 2 of the 6-member aromatic rings comprises one or two N-ring atoms; and wherein the organic semiconductor layer and the p-type charge generation layer comprises the same compound according to Formula (I).

According to one embodiment of the present invention, the organic electroluminescent device comprising an anode layer, a cathode layer, an organic semiconductor layer, at least one first or more charge generation layers, at least two or more light-emitting units, wherein each light-emitting unit comprises a light-emitting layer;

at least one charge generation layer comprises a p-type charge generation layer, wherein the organic semiconductor layer is arranged closer to the anode layer than the p-type charge generation layer, and wherein the organic semiconductor layer comprises an organic hole transport material and a compound of Formula (I), and the p-type charge generation layer comprises an organic hole transport material and a compound of Formula (I):

(I)

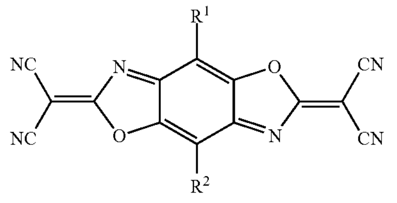

$R^1$ and $R^2$ are independently selected from the group comprising of substituted or unsubstituted phenyl, substituted or unsubstituted pyridinyl, substituted or unsubstituted pyrimidyl, substituted or unsubstituted triazinyl, wherein the one or more substituents on $R^1$ and $R^2$ are independently selected from the group comprising of partially fluorinated or perfluorinated $C_1$ to $C_3$ alkyl, $CF_3$, $C_2F_5$, partially fluorinated or perfluorinated $C_1$ to $C_2$ alkoxy, $OC_2F_5$, $OCF_3$, partially fluorinated or perfluorinated $C_1$ to $C_4$ alkylsulfonyl, $SO_2C_2F_5$, $SO_2CF_3$, F, CN, $NO_2$, $SF_5$; or $R^1$ has the Formula (IIa):

(IIa)

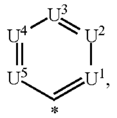

and $R^2$ has the Formula (IIb),

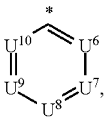

wherein $U^1$ is selected from $CQ^1$ or N; $U^2$ is selected from $CQ^2$ or N; $U^3$ is selected from $CQ^3$ or N; $U^4$ is selected from $CQ^4$ or N; $U^5$ is selected from $CQ^5$ or N; $U^6$ is selected from $CQ^6$ or N; $U^7$ is selected from $CQ^7$ or N; $U^8$ is selected from $CQ^8$ or N; $U^9$ is selected from $CQ^9$ or N; $U^{10}$ is selected from $CQ^{10}$ or N; wherein $Q^1$, $Q^2$, $Q^3$, $Q^4$, $Q^5$, $Q^6$, $Q^7$, $Q^8$, $Q^9$ and $Q^{10}$ are independently selected from the group comprising of partially fluorinated or perfluorinated $C_1$ to $C_3$ alkyl, $CF_3$, $C_2F_5$, partially fluorinated or perfluorinated $C_1$ to $C_2$ alkoxy, $OC_2F_5$, $OCF_3$, partially fluorinated or perfluorinated $C_1$ to $C_4$ alkylsulfonyl, $SO_2C_2F_5$, $SO_2CF_3$, F, CN, $NO_2$, $SF_5$; wherein the asterisk "*" denotes the binding position, and wherein the substituted $R^1$ and $R^2$ comprises at least 2 to 10 F atoms, preferably 3 to 9 F atoms and/or at least 1 to 2 —CN groups; and wherein the organic semiconductor layer and the p-type charge generation layer comprises the same compound according to Formula (I).

According to one embodiment of the present invention, the organic electroluminescent device comprising an anode layer, a cathode layer, an organic semiconductor layer, at least one first or more charge generation layers, at least two or more light-emitting units, wherein each light-emitting unit comprises a light-emitting layer;

at least one charge generation layer comprises a p-type charge generation layer, wherein the organic semiconductor layer is arranged closer to the anode layer than the p-type charge generation layer, and wherein the organic semiconductor layer comprises an organic hole transport material and a compound of Formula (I), and the p-type charge generation layer comprises an organic hole transport material and a compound of Formula (I):

(I)

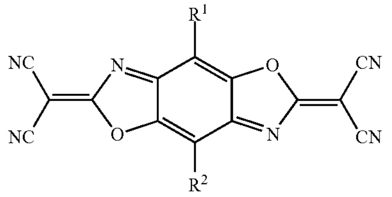

$R^1$ and $R^2$ are independently selected from the group comprising of substituted or unsubstituted phenyl, substituted or unsubstituted pyridinyl, substituted or unsubstituted pyrimidyl, substituted or unsubstituted triazinyl, wherein the one or more substituents on $R^1$ and $R^2$ are independently selected from the group comprising of partially fluorinated or perfluorinated $C_1$ to $C_3$ alkyl, $CF_3$, $C_2F_5$, partially fluorinated or perfluorinated $C_1$ to $C_2$ alkoxy, $OC_2F_5$, $OCF_3$, partially fluorinated or perfluorinated $C_1$ to $C_4$ alkylsulfonyl, $SO_2C_2F_5$, $SO_2CF_3$, F, CN, $NO_2$, $SF_5$; or $R^1$ has the Formula (IIa):

(IIa)

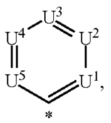

and $R^2$ has the Formula (IIb),

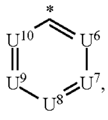

wherein $U^1$ is selected from $CQ^1$ or N; $U^2$ is selected from $CQ^2$ or N; $U^3$ is selected from $CQ^3$ or N; $U^4$ is selected from $CQ^4$ or N; $U^5$ is selected from $CQ^5$ or N; $U^6$ is selected from $CQ^6$ or N; $U^7$ is selected from $CQ^7$ or N; $U^8$ is selected from $CQ^8$ or N; $U^9$ is selected from $CQ^9$ or N; $U^{10}$ is selected from $CQ^{10}$ or N; wherein $Q^1$, $Q^2$, $Q^3$, $Q^4$, $Q^5$, $Q^6$, $Q^7$, $Q^8$, $Q^9$ and $Q^{10}$ are independently selected from the group comprising of partially fluorinated or perfluorinated $C_1$ to $C_3$ alkyl, $CF_3$, $C_2F_5$, partially fluorinated or perfluorinated $C_1$ to $C_2$ alkoxy, $OC_2F_5$, $OCF_3$, partially fluorinated or perfluorinated $C_1$ to $C_4$ alkylsulfonyl, $SO_2C_2F_5$, $SO_2CF_3$, F, CN, $NO_2$, $SF_5$; wherein the asterisk "*" denotes the binding position, and wherein the compound of Formula (I) comprises three 6-member aromatic rings only, wherein at least one of the three 6-member aromatic ring is a $C_6$-member aromatic ring and 0, 1 or 2 of the 6-member aromatic rings comprises one or two N-ring atoms; and wherein the substituted $R^1$ and $R^2$ comprises at least 2 to 10 F atoms, preferably 3 to 9 F atoms and/or at least 1 to 2 —CN groups; and wherein the organic semiconductor layer and the p-type charge generation layer comprises the same compound according to Formula (I).

According to one embodiment wherein the organic semiconductor layer and the p-type charge generation layer comprises the same compound according to Formula (I).

According to one embodiment wherein the charge generation layer or each charge generation layer comprises a n-type charge generation layer and a p-type charge generation layer.

$R^1$ and $R^2$

According to one embodiment $R^1$ and $R^2$ are independently selected or selected the same from the group comprising of substituted or unsubstituted phenyl, substituted or unsubstituted pyridinyl, substituted or unsubstituted pyrimidyl, substituted or unsubstituted triazinyl wherein the one or more substituents on $R^1$ or $R^2$ are independently selected from the group comprising of partially fluorinated or perfluorinated $C_1$ to $C_6$ alkyl, $CF_3$, $OCF_3$, $SO_2CF_3$, F, CN, $NO_2$, $SF_5$, D and H.

According to one embodiment $R^1$ and $R^2$ may be independently selected from the group comprising of substituted or unsubstituted phenyl, substituted or unsubstituted pyridinyl, substituted or unsubstituted pyrimidyl, substituted or unsubstituted triazinyl wherein the one or more substituents on $R^1$ or $R^2$ are independently selected from the group comprising of partially fluorinated or perfluorinated $C_1$ to $C_6$ alkyl, $CF_3$, $OCF_3$, $SO_2CF_3$, F, CN, $NO_2$, $SF_5$, D and H.

According to one embodiment $R^1$ and $R^2$ may be preferably selected the same from the group comprising of substituted or unsubstituted phenyl, substituted or unsubstituted pyridinyl, substituted or unsubstituted pyrimidyl, substituted or unsubstituted triazinyl wherein the one or more substituents on $R^1$ or $R^2$ are independently selected from the group comprising of partially fluorinated or perfluorinated $C_1$ to $C_6$ alkyl, $CF_3$, $OCF_3$, $SO_2CF_3$, F, CN, $NO_2$, $SF_5$, D and H.

According to one embodiment $R^1$ and $R^2$ may be independently selected from the group comprising of substituted phenyl, substituted pyridinyl, substituted pyrimidyl, or substituted triazinyl wherein the one or more substituents on $R^1$ or $R^2$ are independently selected from the group comprising of partially fluorinated or perfluorinated $C_1$ to $C_6$ alkyl, $CF_3$, $OCF_3$, $SO_2CF_3$, F, CN, $NO_2$, $SF_5$, D and H.

According to one embodiment $R^1$ and $R^2$ may be preferably selected the same from the group comprising of substituted phenyl, substituted pyridinyl, substituted pyrimidyl, or substituted triazinyl wherein the one or more substituents on $R^1$ or $R^2$ are independently selected from the group comprising of partially fluorinated or perfluorinated $C_1$ to $C_6$ alkyl, $CF_3$, $OCF_3$, $SO_2CF_3$, F, CN, $NO_2$, $SF_5$, D and H.

According to one embodiment $R^1$ and $R^2$ are independently selected or selected the same from the group comprising of substituted or unsubstituted phenyl, substituted or unsubstituted pyridinyl, substituted or unsubstituted pyrimidyl, substituted or unsubstituted triazinyl wherein the one or more substituents on $R^1$ or $R^2$ are independently selected from the group comprising of partially fluorinated or perfluorinated $C_1$ to $C_4$ alkyl, $CF_3$, $OCF_3$, $SO_2CF_3$, F, CN, preferably $R^1$ and $R^2$ are selected the same.

According to one embodiment $R^1$ and $R^2$ may be independently selected from the group comprising of substituted phenyl, substituted pyridinyl, substituted pyrimidyl, or substituted triazinyl wherein the one or more substituents on $R^1$ or $R^2$ are independently selected from the group comprising of partially fluorinated or perfluorinated $C_1$ to $C_4$ alkyl, $CF_3$, $OCF_3$, $SO_2CF_3$, F, CN.

According to one embodiment $R^1$ and $R^2$ may be preferably selected the same from the group comprising of substituted phenyl, substituted pyridinyl, substituted pyrimidyl, or substituted triazinyl wherein the one or more substituents on $R^1$ or $R^2$ are independently selected from the group comprising of partially fluorinated or perfluorinated $C_1$ to $C_4$ alkyl, $CF_3$, $OCF_3$, $SO_2CF_3$, F, CN.

According to one embodiment $R^1$ and $R^2$ may be independently selected from the group comprising of substituted phenyl, substituted pyridinyl, substituted pyrimidyl, or substituted triazinyl wherein the one or more substituents on $R^1$ or $R^2$ are independently selected from the group comprising of $C_2F_5$, $CF_3$, $OCF_3$, $OC_2F_5$, $SO_2CF_3$, F, CN.

According to one embodiment $R^1$ and $R^2$ may be preferably selected the same from the group comprising of substituted phenyl, substituted pyridinyl, substituted pyrimidyl, or substituted triazinyl wherein the one or more substituents on $R^1$ or $R^2$ are independently selected from the group comprising of $C_2F_5$, $CF_3$, $OCF_3$, $OC_2F_5$, $SO_2CF_3$, F, CN.

According to one embodiment $R^1$ and $R^2$ may be independently selected from the group comprising of substituted or unsubstituted phenyl, wherein the one or more substituents on $R^1$ or $R^2$ are independently selected from the group comprising of partially fluorinated or perfluorinated $C_1$ to $C_6$ alkyl or $CF_3$; and preferably wherein $R^1$ and $R^2$ are independently selected from the group comprising of substituted phenyl, wherein the one or more substituents on $R^1$ or $R^2$ are independently selected from the group comprising of partially fluorinated or perfluorinated $C_1$ to $C_6$ alkyl or $CF_3$.

According to one embodiment $R^1$ and $R^2$ may be independently selected from the group comprising of substituted phenyl, wherein the one or more substituents on $R^1$ or $R^2$ are independently selected from the group comprising of partially fluorinated or perfluorinated $C_1$ to $C_6$ alkyl or $CF_3$; and preferably wherein $R^1$ and $R^2$ are independently selected from the group comprising of substituted phenyl, wherein the one or more substituents on $R^1$ or $R^2$ are independently selected from the group comprising of $C_2F_5$, $CF_3$, $OCF_3$, $OC_2F_5$, $SO_2CF_3$, F, CN $NO_2$, $SF_5$.

According to one embodiment $R^1$ and $R^2$ may be independently selected from the group comprising of substituted pyridinyl, wherein the one or more substituents on $R^1$ or $R^2$ are independently selected from the group comprising of partially fluorinated or perfluorinated $C_1$ to $C_6$ alkyl or $CF_3$; and preferably wherein $R^1$ and $R^2$ are independently selected from the group comprising of substituted pyridinyl, wherein the one or more substituents on $R^1$ or $R^2$ are independently selected from the group comprising of $C_2F_5$, $CF_3$, $OCF_3$, $OC_2F_5$, $SO_2CF_3$, F, CN $NO_2$, $SF_5$.

According to one embodiment $R^1$ and $R^2$ may be independently selected from the group comprising of substituted pyrimidyl, wherein the one or more substituents on $R^1$ or $R^2$ are independently selected from the group comprising of partially fluorinated or perfluorinated $C_1$ to $C_6$ alkyl or $CF_3$; and preferably wherein $R^1$ and $R^2$ are independently selected from the group comprising of substituted pyrimidyl, wherein the one or more substituents on $R^1$ or $R^2$ are independently selected from the group comprising of $C_2F_5$, $CF_3$, $OCF_3$, $OC_2F_5$, $SO_2CF_3$, F, CN $NO_2$, $SF_5$.

According to one embodiment $R^1$ and $R^2$ may be independently selected from the group comprising of substituted triazinyl, wherein the one or more substituents on $R^1$ or $R^2$ are independently selected from the group comprising of partially fluorinated or perfluorinated $C_1$ to $C_6$ alkyl or $CF_3$; and preferably wherein $R^1$ and $R^2$ are independently selected from the group comprising of substituted triazinyl, wherein the one or more substituents on $R^1$ or $R^2$ are independently selected from the group comprising of $C_2F_5$, $CF_3$, $OCF_3$, $OC_2F_5$, $SO_2CF_3$, F, CN $NO_2$, $SF_5$.

Formulae (IIc)

According to one embodiment, wherein compound of Formula (I) is represented by Formulae (IIc):

(IIc)

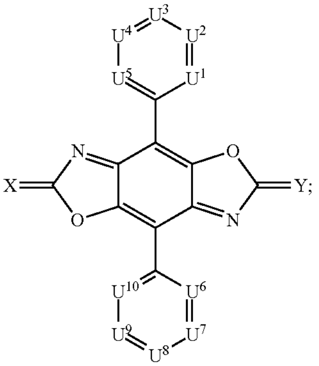

wherein X and Y are $C(CN)_2$.

According to one embodiment, wherein compound of Formula (I) is represented by Formulae (IIc):

(IIc)

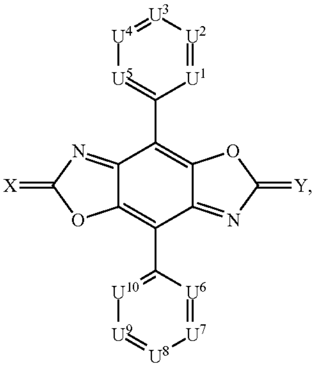

wherein $U^1$ is selected from $CQ^1$ or N;

$U^2$ is selected from $CQ^2$ or N;

$U^3$ is selected from $CQ^3$ or N;

$U^4$ is selected from $CQ^4$ or N;

$U^5$ is selected from $CQ^5$ or N;

$U^6$ is selected from $CQ^6$ or N;

$U^7$ is selected from $CQ^7$ or N;

$U^8$ is selected from $CQ^8$ or N;

$U^9$ is selected from $CQ^9$ or N;

$U^{10}$ is selected from $CQ^{10}$ or N;

$Q^1$, $Q^2$, $Q^3$, $Q^4$, $Q^5$, $Q^6$, $Q^7$, $Q^8$, $Q^9$, $Q^{10}$ are independently selected from the group comprising of partially fluorinated or perfluorinated $C_1$ to $C_6$ alkyl, $CF_3$, partially fluorinated or perfluorinated $C_1$ to $C_4$ alkoxy, $OCF_3$, partially fluorinated or perfluorinated $C_1$ to $C_4$ alkylsulfonyl, $SO_2CF_3$, F, CN, $NO_2$, $SF_5$, D and H;

X and Y are $C(CN)_2$.

According to one embodiment, wherein compound of Formula (I) is represented by Formulae (IIc):

(IIc)

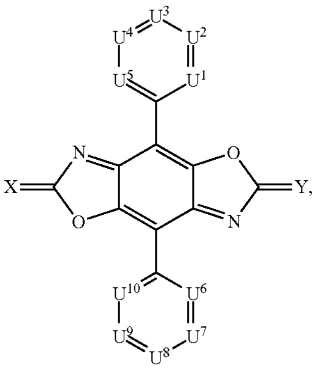

wherein $U^1$ is selected from $CQ^1$ or N;
$U^2$ is selected from $CQ^2$ or N;
$U^3$ is selected from $CQ^3$ or N;
$U^4$ is selected from $CQ^4$ or N;
$U^5$ is selected from $CQ^5$ or N;
$U^6$ is selected from $CQ^6$ or N;
$U^7$ is selected from $CQ^7$ or N;
$U^8$ is selected from $CQ^8$ or N;
$U^9$ is selected from $CQ^9$ or N;
$U^{10}$ is selected from $CQ^{10}$ or N;

$Q^1$, $Q^2$, $Q^3$, $Q^4$, $Q^5$, $Q^6$, $Q^7$, $Q^8$, $Q^9$, $Q^{10}$ are independently selected from the group comprising of partially fluorinated or perfluorinated $C_1$ to $C_4$ alkyl, $CF_3$, partially fluorinated or perfluorinated $C_1$ to $C_4$ alkoxy, $OCF_3$, $SO_2CF_3$, F, CN, D, and H; and X and Y are $C(CN)_2$.

According to one embodiment, wherein compound of Formula (I) is represented by Formulae (IIc):

(IIc)

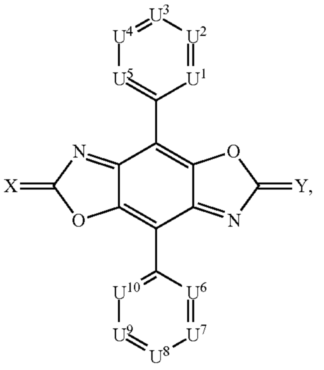

wherein $U^1$ is selected from $CQ^1$ or N;
$U^2$ is selected from $CQ^2$ or N;
$U^3$ is selected from $CQ^3$ or N;
$U^4$ is selected from $CQ^4$ or N;
$U^5$ is selected from $CQ^5$ or N;
$U^6$ is selected from $CQ^6$ or N;
$U^7$ is selected from $CQ^7$ or N;

$U^8$ is selected from $CQ^8$ or N;
$U^9$ is selected from $CQ^9$ or N;
$U^{10}$ is selected from $CQ^{10}$ or N;

$Q^1$, $Q^2$, $Q^3$, $Q^4$, $Q^5$, $Q^6$, $Q^7$, $Q^8$, $Q^9$, $Q^{10}$ are independently selected from the group comprising of $C_2F_5$, $CF_3$, $OCF_3$, $OC_2F_5$, $SO_2CF_3$, F, CN, $NO_2$, $SF_5$, D and H; X and Y are $C(CN)_2$.

According to one embodiment $U^1$ is selected from $CQ^1$; $U^2$ is selected from $CQ^2$; $U^3$ is selected from $CQ^3$; $U^4$ is selected from $CQ^4$; $U^5$ is selected from $CQ^5$; $U^6$ is selected from $CQ^6$; $U^7$ is selected from $CQ^7$; $U^8$ is selected from $CQ^8$; $U^9$ is selected from $CQ^9$; $U^{10}$ is selected from $CQ^{10}$, wherein $Q^1$, $Q^2$, $Q^3$, $Q^4$, $Q^5$, $Q^6$, $Q^7$, $Q^8$, $Q^9$, $Q^{10}$ are independently selected from the group comprising of $C_2F_5$, $CF_3$, $OCF_3$, $OC_2F_5$, $SO_2CF_3$, F, CN, $NO_2$, $SF_5$, D and H; and X and Y are $C(CN)_2$.

According to one embodiment $U^1$ is selected from N; $U^2$ is selected from $CQ^2$; $U^3$ is selected from $CQ^3$; $U^4$ is selected from $CQ^4$; $U^5$ is selected from $CQ^5$; $U^6$ is selected from N; $U^7$ is selected from $CQ^7$; $U^8$ is selected from $CQ^8$; $U^9$ is selected from $CQ^9$; $U^{10}$ is selected from $CQ^{10}$ or N, wherein $Q^2$, $Q^3$, $Q^4$, $Q^5$, $Q^7$, $Q^8$, $Q^9$, $Q^{10}$ are independently selected from the group comprising of $C_2F_5$, $CF_3$, $OCF_3$, $OC_2F_5$, $SO_2CF_3$, F, CN, $NO_2$, $SF_5$, D and H; and X and Y are $C(CN)_2$.

According to one embodiment $U^1$ is selected from $CQ^1$; $U^2$ is selected from N; $U^3$ is selected from $CQ^3$; $U^4$ is selected from $CQ^4$; $U^5$ is selected from $CQ^5$; $U^6$ is selected from $CQ^6$; $U^7$ is selected from N; $U^8$ is selected from $CQ^8$; $U^9$ is selected from $CQ^9$; $U^{10}$ is selected from $CQ^{10}$ or N, wherein $Q^1$, $Q^3$, $Q^4$, $Q^5$, $Q^6$' $Q^8$, $Q^9$, $Q^{10}$ are independently selected from the group comprising of $C_2F_5$, $CF_3$, $OCF_3$, $OC_2F_5$, $SO_2CF_3$, F, CN, $NO_2$, $SF_5$, D and H; and X and Y are $C(CN)_2$.

According to one embodiment $U^1$ is selected from $CQ^1$; $U^2$ is selected from $CQ^2$; $U^3$ is selected from N; $U^4$ is selected from $CQ^4$; $U^5$ is selected from $CQ^5$; $U^6$ is selected from $CQ^6$; $U^7$ is selected from $CQ^7$; $U^8$ is selected from N; $U^9$ is selected from $CQ^9$; $U^{10}$ is selected from $CQ^{10}$ or N, wherein $Q^1$, $Q^2$, $Q^4$, $Q^5$, $Q^6$, $Q^9$, $Q^{10}$ are independently selected from the group comprising of $C_2F_5$, $CF_3$, $OCF_3$, $OC_2F_5$, $SO_2CF_3$, F, CN, $NO_2$, $SF_5$, D and H; and X and Y are $C(CN)_2$.

According to one embodiment at least one of $U^1$, $U^2$, $U^3$, $U^4$, $U^5$, $U^6$, $U^7$, $U^8$, $U^9$, $U^{10}$ is selected from N. According to one embodiment at least two of $U^1$, $U^2$, $U^3$, $U^4$, $U^5$, $U^6$, $U^7$, $U^8$, $U^9$, $U^{10}$ are selected from N. According to one embodiment at least three of $U^1$, $U^2$, $U^3$, $U^4$, $U^5$, $U^6$, $U^7$, $U^8$, $U^9$, $U^{10}$ are selected from N. According to one embodiment at least four of $U^1$, $U^2$, $U^3$, $U^4$, $U^5$, $U^6$, $U^7$, $U^8$, $U^9$, $U^{10}$ are selected from N. According to one embodiment at least five of $U^1$, $U^2$, $U^3$, $U^4$, $U^5$, $U^6$, $U^7$, $U^8$, $U^9$, $U^{10}$ are selected from N. According to one embodiment at least six of $U^1$, $U^2$, $U^3$, $U^4$, $U^5$, $U^6$, $U^7$, $U^8$, $U^9$, $U^{10}$ are selected from N.

According to one embodiment at least one of $U^1$, $U^2$, $U^3$, $U^4$, $U^5$ and/or at least one of $U^6$, $U^7$, $U^8$, $U^9$, $U^{10}$ is selected from N. According to one embodiment at least two of $U^1$, $U^2$, $U^3$, $U^4$, $U^5$ and/or at least two of $U^6$, $U^7$, $U^8$, $U^9$, $U^{10}$ are selected from N. According to one embodiment at least three of $U^1$, $U^2$, $U^3$, $U^4$, $U^5$ and/or at least three of $U^6$, $U^7$, $U^8$, $U^9$, $U^{10}$ are selected from N.

According to one embodiment, wherein $R^1$ and $R^2$ are independently selected or selected the same from the group comprising B1 to B47:

(B1)
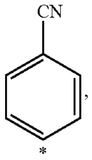
(B2)
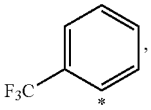
(B3)
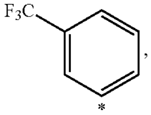
(B4)
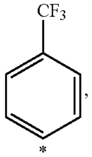
(B5)
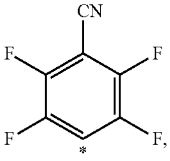
(B6)
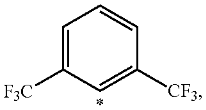
(B7)
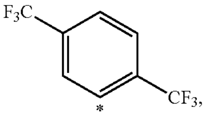
(B8)
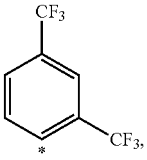
(B9)
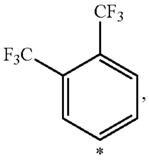
(B10)
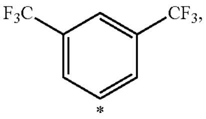
-continued
(B11)
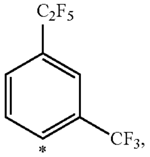
(B12)
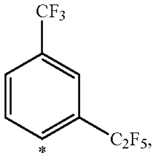
(B13)
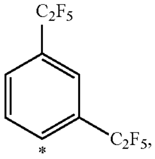
(B14)
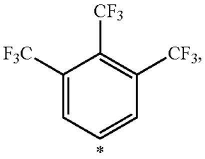
(B15)
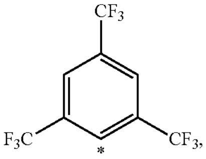
(B16)
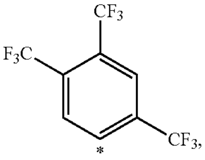
(B17)
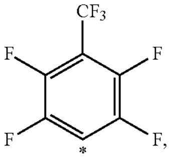
(B18)
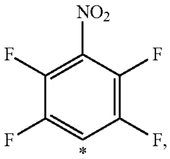
(B19)
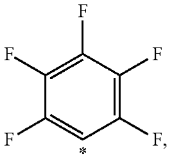

-continued
(B20)
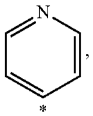
(B21)
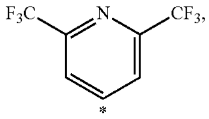
(B22)
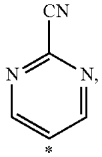
(B23)
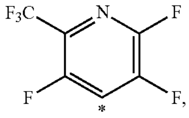
(B24)
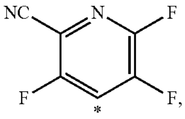
(B25)
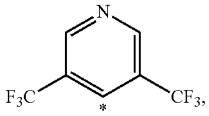
(B26)
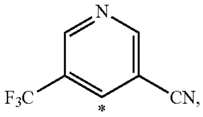
(B27)
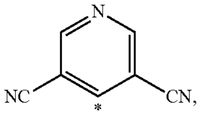
(B28)
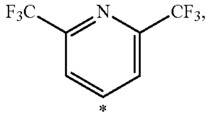
(B29)
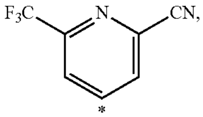
(B30)
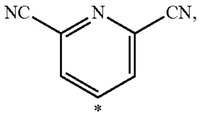
-continued
(B31)
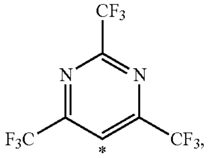
(B32)
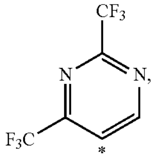
(B33)
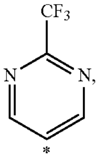
(B34)
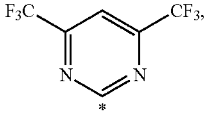
(B35)
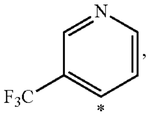
(B36)
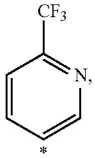
(B37)
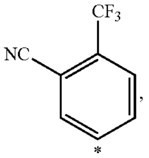
(B38)
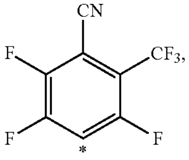
(B39)
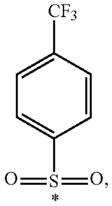

-continued (B40)

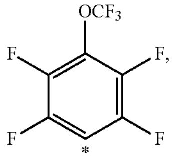

(B41)

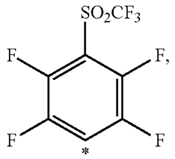

(B42)

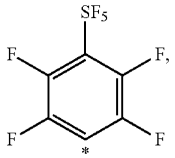

(B43)

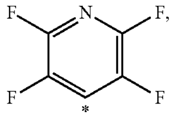

(B44)

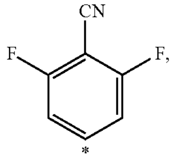

(B45)

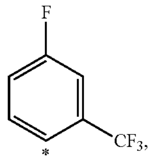

(B46)

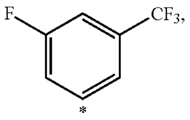

(B47)

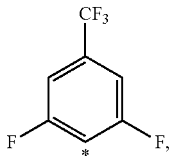

wherein the asterisk "*" denotes the binding position.

According to one embodiment $R^1$ and $R^2$ may be independently selected from the group comprising B1 to B47. According to one embodiment $R^1$ and $R^2$ may be selected the same from the group comprising B1 to B47. According to one embodiment $R^1$ and $R^2$ may be independently selected or selected the same from the group comprising B1 to B20 and B24 to B44; preferably $R^1$ and $R^2$ may be selected the same. According to one embodiment $R^1$ and $R^2$ may be independently selected or selected the same from the group comprising B1, B6 to B12, B14 to B18, B20 to B38 and B43; preferably $R^1$ and $R^2$ may be selected the same. According to one embodiment $R^1$ and $R^2$ may be independently selected or selected the same from the group comprising B6 to B13; preferably $R^1$ and $R^2$ may be selected the same.

According to one embodiment, wherein the substituents $R^1$ and $R^2$ of Formula (I) may be selected as follows:

$R^1$=B1 and $R^2$=B1,
$R^1$=B2 and $R^2$=B2,
$R^1$=B3 and $R^2$=B3,
$R^1$=B4 and $R^2$=B4,
$R^1$=B2 and $R^2$=B3,
$R^1$=B2 and $R^2$=B4,
$R^1$=B3 and $R^2$=B4,
$R^1$=B5 and $R^2$=B5,
$R^1$=B6 and $R^2$=B6,
$R^1$=B7 and $R^2$=B7,
$R^1$=B8 and $R^2$=B8,
$R^1$=B9 and $R^2$=B9,
$R^1$=B10 and $R^2$=B10,
$R^1$=B6 and $R^2$=B7,
$R^1$=B6 and $R^2$=B8,
$R^1$=B6 and $R^2$=B9,
$R^1$=B6 and $R^2$=B10,
$R^1$=B7 and $R^2$=B7,
$R^1$=B7 and $R^2$=B8,
$R^1$=B7 and $R^2$=B9,
$R^1$=B7 and $R^2$=B10,
$R^1$=B8 and $R^2$=B8,
$R^1$=B8 and $R^2$=B9,
$R^1$=B8 and $R^2$=B10,
$R^1$=B8 and $R^2$=B11,
$R^1$=B12 and $R^2$=B12,
$R^1$=B13 and $R^2$=B13,
$R^1$=B14 and $R^2$=B14,
$R^1$=B15 and $R^2$=B15,
$R^1$=B16 and $R^2$=B16,
$R^1$=B17 and $R^2$=B17,
$R^1$=B18 and $R^2$=B18,
$R^1$=B19 and $R^2$=B19,
$R^1$=B20 and $R^2$=B20,
$R^1$=B21 and $R^2$=B21,
$R^1$=B22 and $R^2$=B22,
$R^1$=B23 and $R^2$=B23,
$R^1$=B24 and $R^2$=B24,
$R^1$=B25 and $R^2$=B25,
$R^1$=B26 and $R^2$=B26,
$R^1$=B27 and $R^2$=B27,
$R^1$=B28 and $R^2$=B28,
$R^1$=B29 and $R^2$=B29,
$R^1$=B30 and $R^2$=B30,
$R^1$=B31 and $R^2$=B31
$R^1$=B32 and $R^2$=B32,
$R^1$=B33 and $R^2$=B33,
$R^1$=B34 and $R^2$=B34,
$R^1$=B35 and $R^2$=B35,
$R^1$=B36 and $R^2$=B36,
$R^1$=B37 and $R^2$=B37,
$R^1$=B38 and $R^2$=B38,
$R^1$=B39 and $R^2$=B39,
$R^1$=B40 and $R^2$=B40,
$R^1$=B41 and $R^2$=B41,
$R^1$=B42 and $R^2$=B42,
$R^1$=B43 and $R^2$=B43,
$R^1$=B44 and $R^2$=B44; preferably $R^1$=B8 and $R^2$=B8, wherein Formula (I) is represented by Formula (IId):

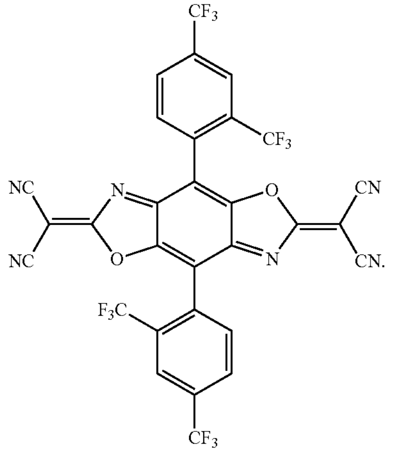
(IId)
According to an embodiment of the present invention, wherein $R^1$ and $R^2$ of the compound of Formula (I) are selected from table I.
TABLE I
| $R^1$ | $R^2$ | B3LYP/6-31G* [eV]/LUMO |
|---|---|---|
| 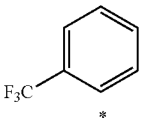 | 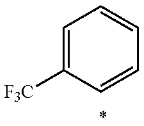 | −5.10 |
| 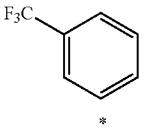 | 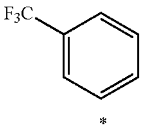 | −5.22 |
| 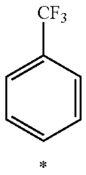 | 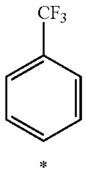 | −5.39 |
| 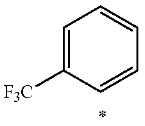 | 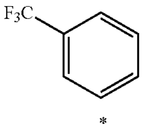 | −5.12 |
| 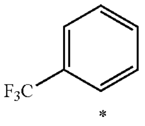 | 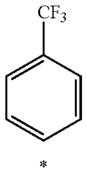 | −5.25 |
TABLE I-continued
| $R^1$ | $R^2$ | B3LYP/6-31G* [eV]/LUMO |
|---|---|---|
| 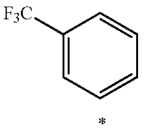 | 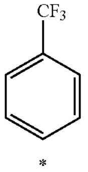 | −5.35 |
| 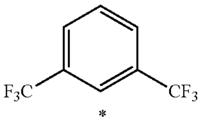 | 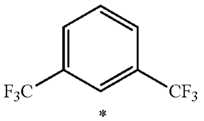 | −5.11 |
| 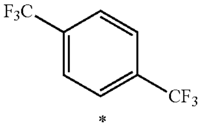 | 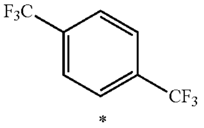 | −5.30 |
| 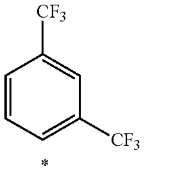 | 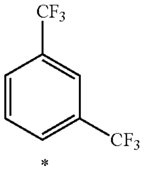 | −5.35 |
| 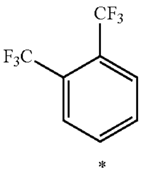 | 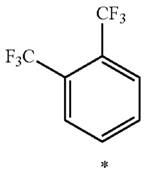 | −5.57 |
| 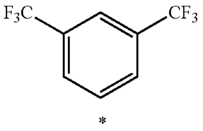 | 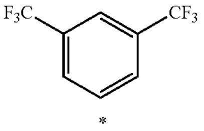 | −5.53 |
| 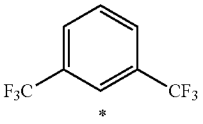 | 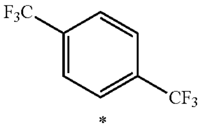 | −5.21 |
| 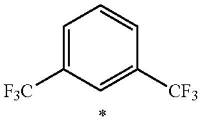 | 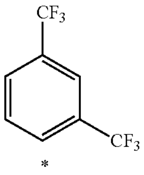 | −5.23 |
| 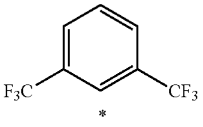 | 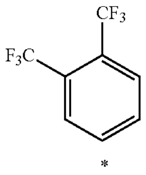 | −5.34 |

TABLE I-continued
| $R^1$ | $R^2$ | B3LYP/6-31G* [eV]/LUMO |
|---|---|---|
| 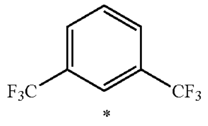 | 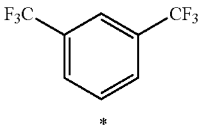 | −5.32 |
| 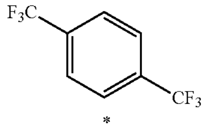 | 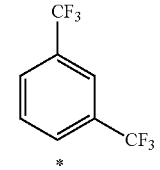 | −5.32 |
| 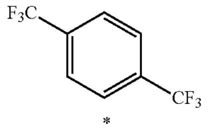 | 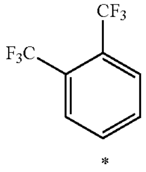 | −5.44 |
| 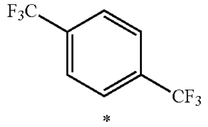 | 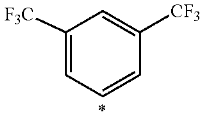 | −5.42 |
| 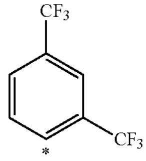 | 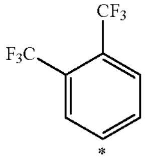 | −5.46 |
| 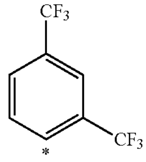 | 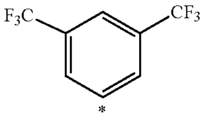 | −5.45 |
| 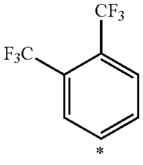 | 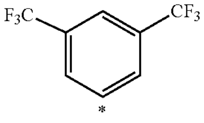 | −5.55 |
| 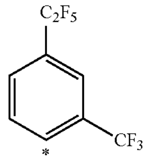 | 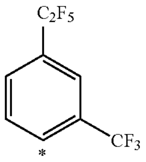 | −5.35 |
TABLE I-continued
| $R^1$ | $R^2$ | B3LYP/6-31G* [eV]/LUMO |
|---|---|---|
| 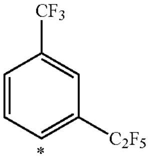 | 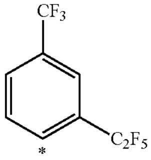 | −5.35 |
| 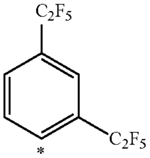 | 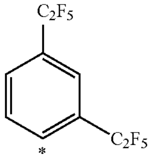 | −5.33 |
| 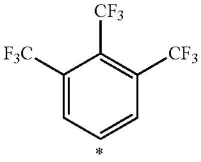 | 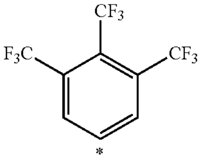 | −5.73 |
| 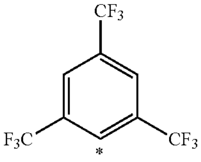 | 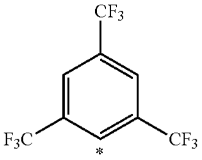 | −5.34 |
| 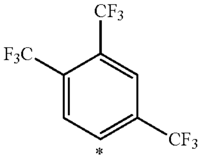 | 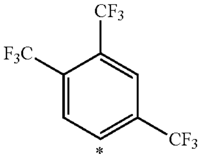 | −5.51 |
| 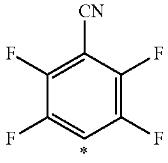 | 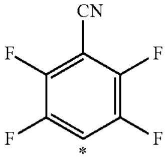 | −5.72 |
| 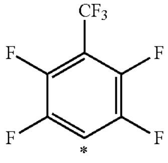 | 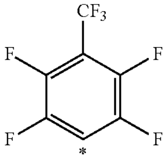 | −5.57 |
| 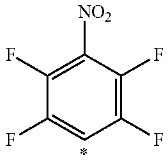 | 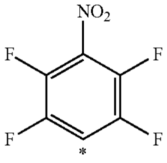 | −5.73 |

TABLE I-continued
| $R^1$ | $R^2$ | B3LYP/6-31G* [eV]/LUMO |
|---|---|---|
| 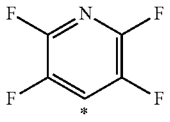 | 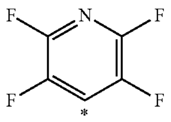 | −5.65 |
| 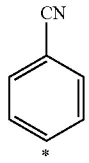 | 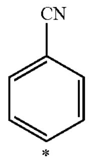 | −5.46 |
| 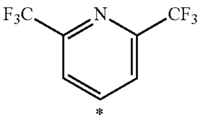 | 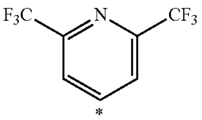 | −5.87 |
| 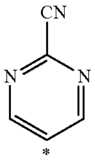 | 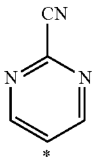 | −5.93 |
| 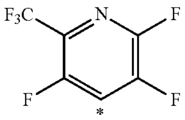 | 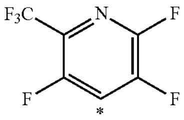 | −5.73 |
| 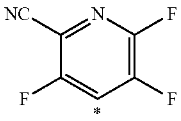 | 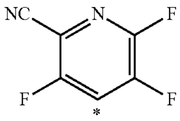 | −5.87 |
| 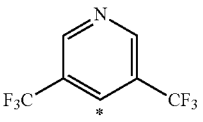 | 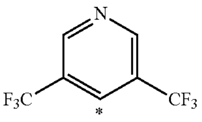 | −5.53 |
| 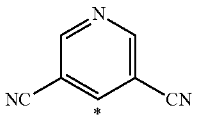 | 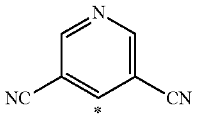 | −5.65 |
| 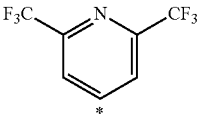 | 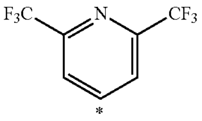 | −5.87 |
| 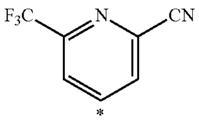 | 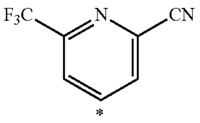 | −5.99 |
| 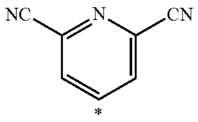 | 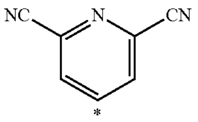 | −6.11 |
| 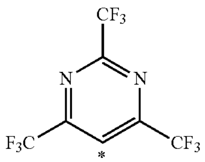 | 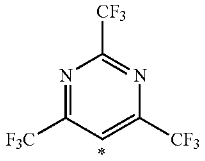 | −5.64 |
| 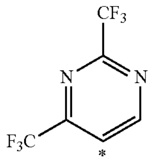 | 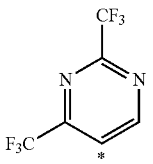 | −5.62 |
| 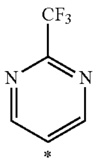 | 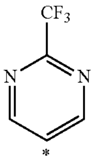 | −5.78 |
| 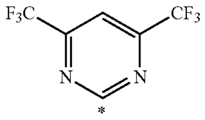 | 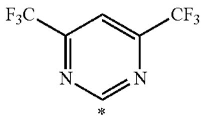 | −5.38 |
| 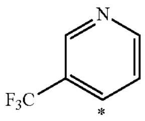 | 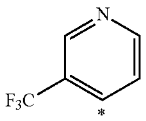 | −5.39 |
| 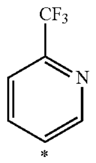 | 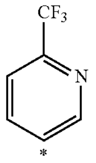 | −5.67 |
| 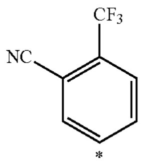 | 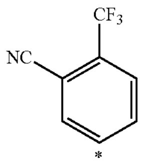 | −5.71 |
| 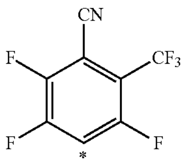 | 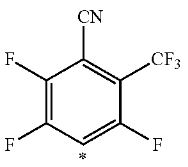 | −5.68 |

TABLE I-continued
| $R^1$ | $R^2$ | B3LYP/6-31G* [eV]/LUMO |
|---|---|---|
| 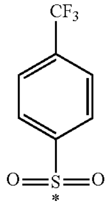 | 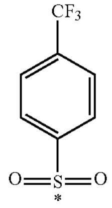 | −5.76 |
| 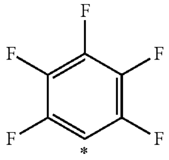 | 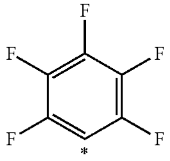 | −5.43 |
| 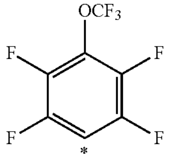 | 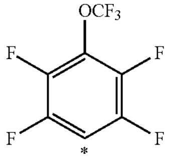 | −5.49 |
| 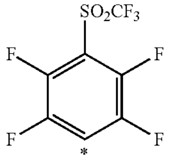 | 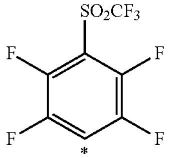 | −5.74 |
| 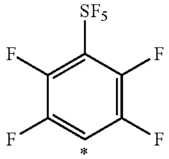 | 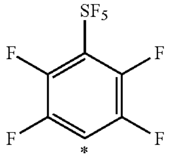 | −5.67 |
| 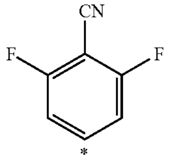 | 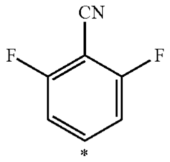 | −5.80 |
The asterics "*" denotes the binding position of $R^1$ and $R^2$.
According to an embodiment of the present invention, wherein $R^1$ and $R^2$ of the compound of Formula (I) are preferably selected from table II.
TABLE II
| $R^1$ | $R^2$ | B3LYP/6-31G* [eV]/ LUMO |
|---|---|---|
| 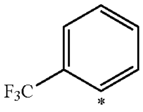 | 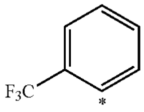 | −5.10 |
TABLE II-continued
| $R^1$ | $R^2$ | B3LYP/6-31G* [eV]/ LUMO |
|---|---|---|
| 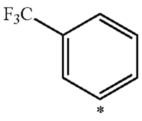 | 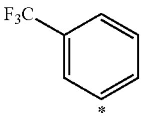 | −5.22 |
| 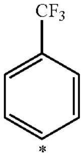 | 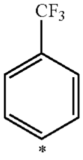 | −5.39 |
| 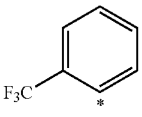 | 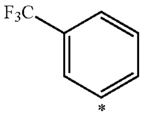 | −5.12 |
| 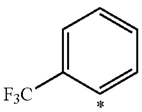 | 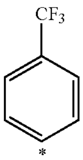 | −5.25 |
| 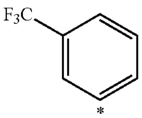 | 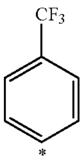 | −5.35 |
| 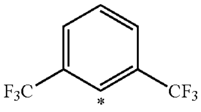 | 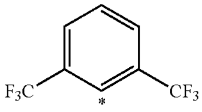 | −5.11 |
| 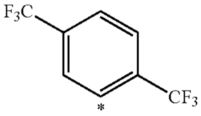 | 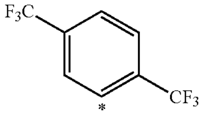 | −5.30 |
| 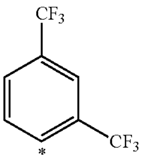 | 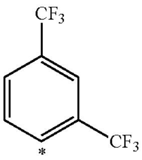 | −5.35 |
| 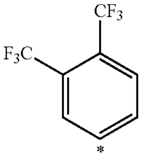 | 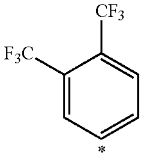 | −5.57 |

TABLE II-continued
| R¹ | R² | B3LYP/6-31G* [eV]/ LUMO |
|---|---|---|
| 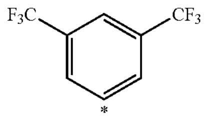 | 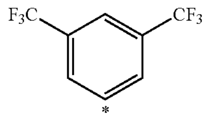 | −5.53 |
| 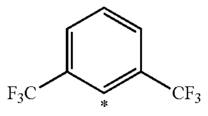 | 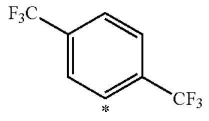 | −5.21 |
| 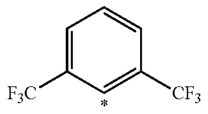 | 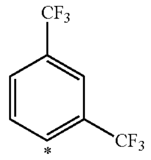 | −5.23 |
| 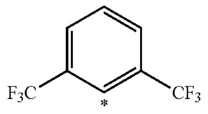 | 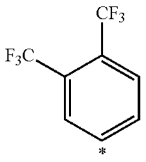 | −5.34 |
| 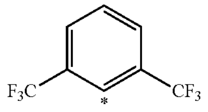 | 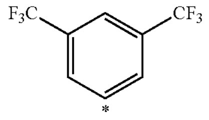 | −5.32 |
| 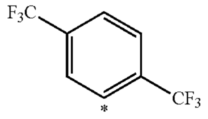 | 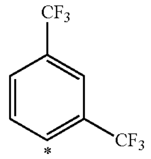 | −5.32 |
| 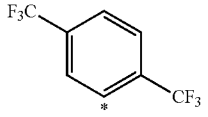 | 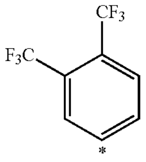 | −5.44 |
| 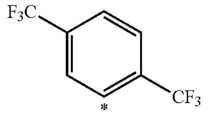 | 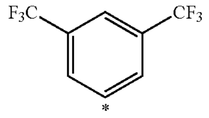 | −5.42 |
| 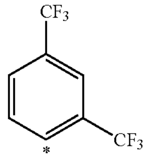 | 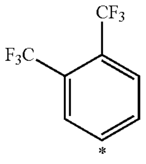 | −5.46 |
TABLE II-continued
| R¹ | R² | B3LYP/6-31G* [eV]/ LUMO |
|---|---|---|
| 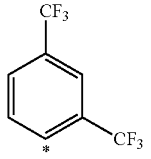 | 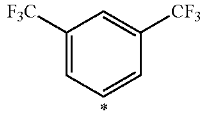 | −5.45 |
| 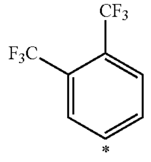 | 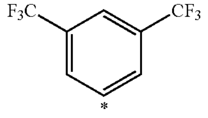 | −5.55 |
| 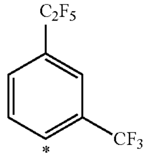 | 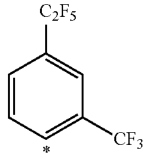 | −5.35 |
| 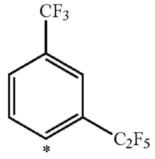 | 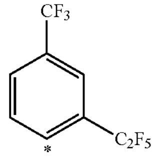 | −5.35 |
| 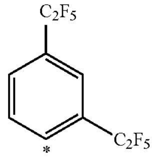 | 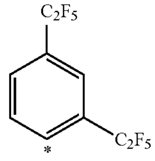 | −5.35 |
| 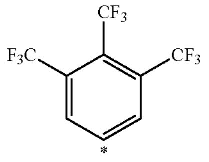 | 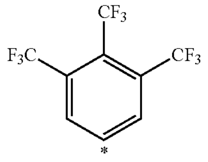 | −5.73 |
| 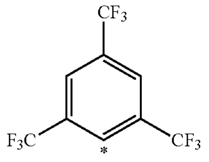 | 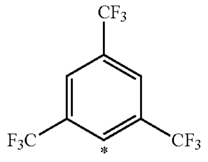 | −5.34 |
| 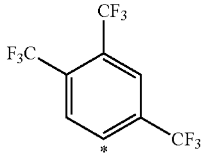 | 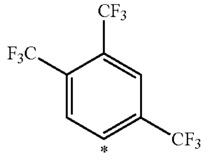 | −5.51 |

TABLE II-continued
| $R^1$ | $R^2$ | B3LYP/6-31G* [eV]/ LUMO |
|---|---|---|
| 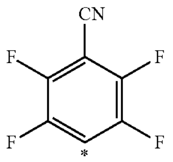 | 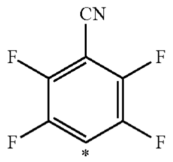 | −5.72 |
| 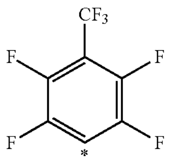 | 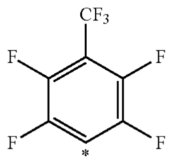 | −5.57 |
| 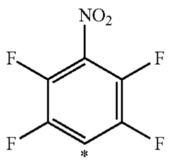 | 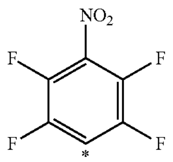 | −5.73 |
| 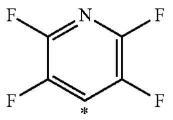 | 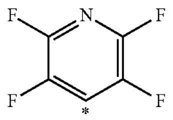 | −5.65 |
| 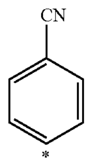 | 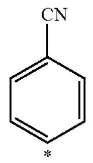 | −5.46 |
| 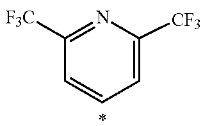 | 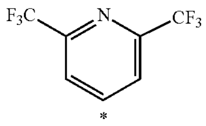 | −5.87 |
| 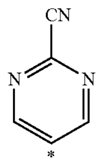 | 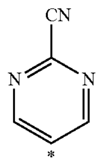 | −5.93 |
| 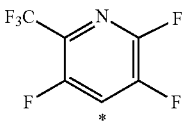 | 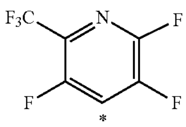 | −5.73 |
| 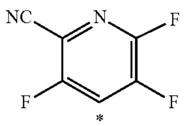 | 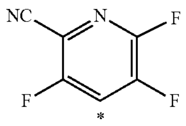 | −5.87 |
TABLE II-continued
| $R^1$ | $R^2$ | B3LYP/6-31G* [eV]/ LUMO |
|---|---|---|
| 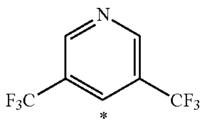 | 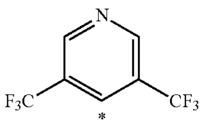 | −5.40 |
| 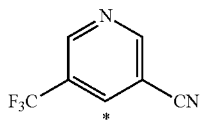 | 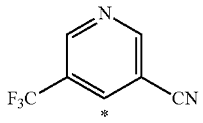 | −5.53 |
| 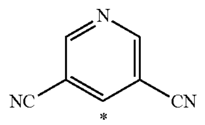 | 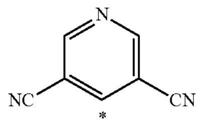 | −5.65 |
| 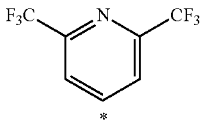 | 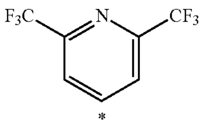 | −5.87 |
| 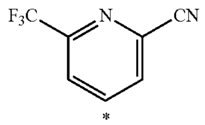 | 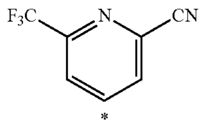 | −5.99 |
| 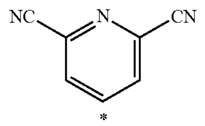 | 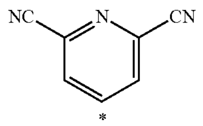 | −6.11 |
| 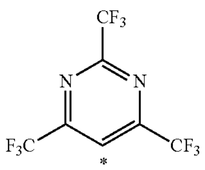 | 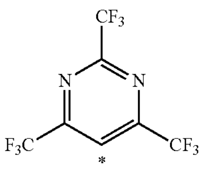 | −5.64 |
| 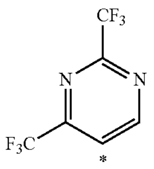 | 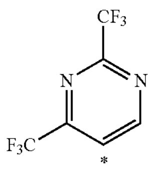 | −5.62 |
| 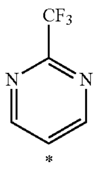 | 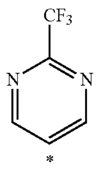 | −5.78 |

TABLE II-continued
| $R^1$ | $R^2$ | B3LYP/6-31G* [eV]/ LUMO |
|---|---|---|
| 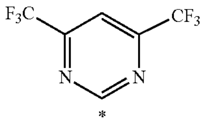 | 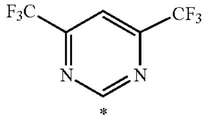 | −5.38 |
| 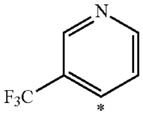 | 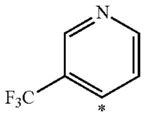 | −5.39 |
| 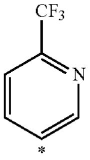 | 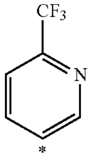 | −5.67 |
| 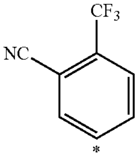 | 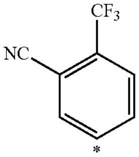 | −5.71 |
| 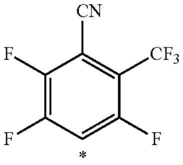 | 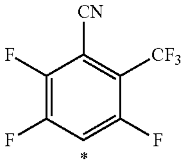 | −5.68 |
| 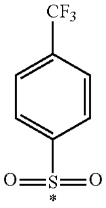 | 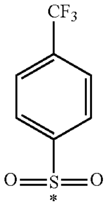 | −5.76 |
The Asterics "*" denotes the binding position of $R^1$ and $R^2$.
According to an embodiment of the present invention, wherein $R^1$ and $R^2$ of the compound of Formula (I) are preferably selected from table III.
TABLE III
| $R^1$ | $R^2$ | B3LYP/6-31G* [eV]/ LUMO |
|---|---|---|
| 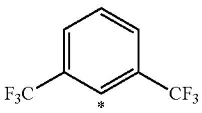 | 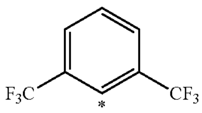 | −5.11 |
TABLE III-continued
| $R^1$ | $R^2$ | B3LYP/6-31G* [eV]/ LUMO |
|---|---|---|
| 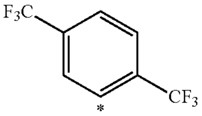 | 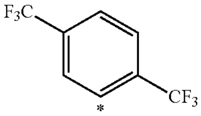 | −5.30 |
| 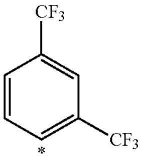 | 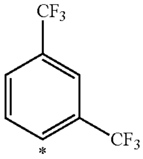 | −5.35 |
| 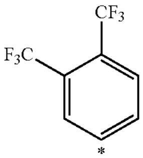 | 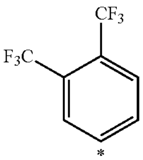 | −5.57 |
| 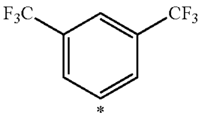 | 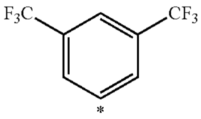 | −5.53 |
| 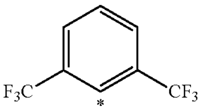 | 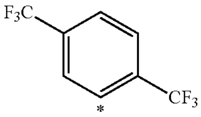 | −5.21 |
| 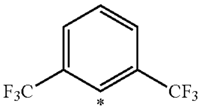 | 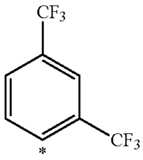 | −5.23 |
| 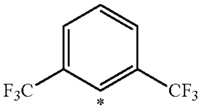 | 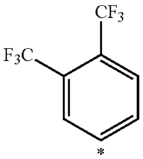 | −5.34 |
| 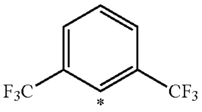 | 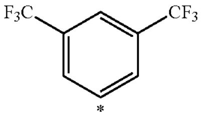 | −5.32 |
| 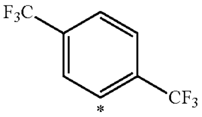 | 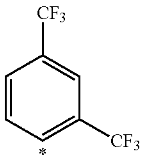 | −5.32 |

TABLE III-continued
| R[1] | R[2] | B3LYP/6-31G* [eV]/LUMO |
|---|---|---|
| 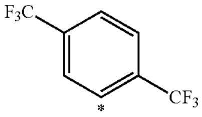 | 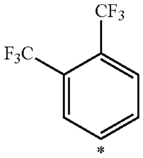 | −5.44 |
| 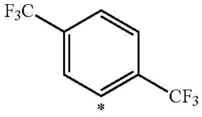 | 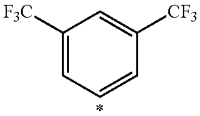 | −5.42 |
| 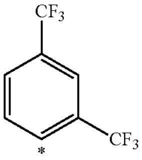 | 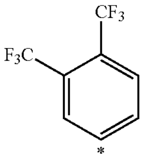 | −5.45 |
| 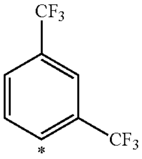 | 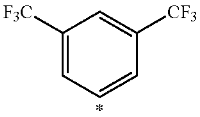 | −5.45 |
| 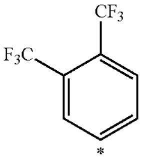 | 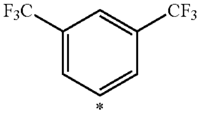 | −5.55 |
| 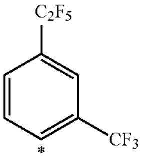 | 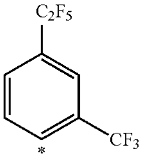 | −5.35 |
| 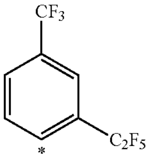 | 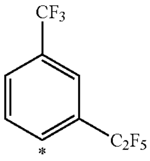 | −5.35 |
| 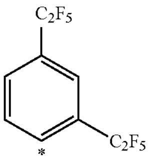 | 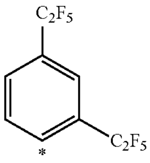 | −5.33 |
TABLE III-continued
| R[1] | R[2] | B3LYP/6-31G* [eV]/LUMO |
|---|---|---|
| 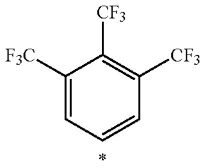 | 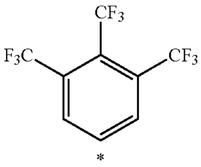 | −5.73 |
| 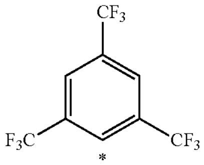 | 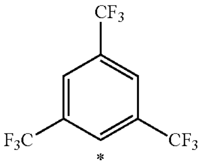 | −5.34 |
| 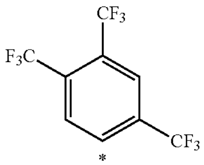 | 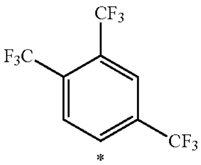 | −5.51 |
| 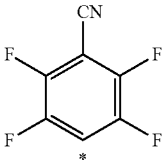 | 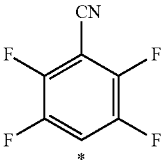 | −5.72 |
| 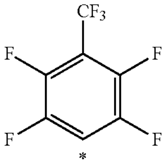 | 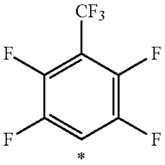 | −5.57 |
| 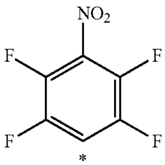 | 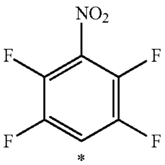 | −5.73 |
| 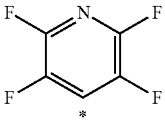 | 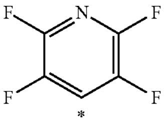 | −5.65 |
| 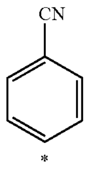 | 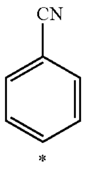 | −5.46 |

TABLE III-continued
| $R^1$ | $R^2$ | B3LYP/6-31G* [eV]/ LUMO |
|---|---|---|
| 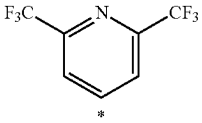 | 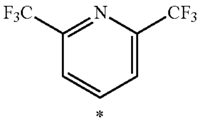 | −5.87 |
| 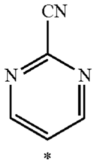 | 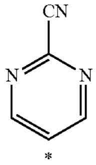 | −5.93 |
| 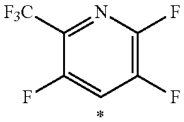 | 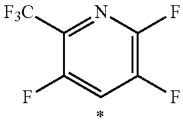 | −5.73 |
| 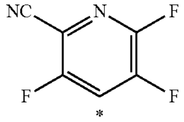 | 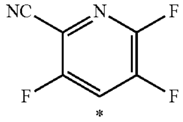 | −5.87 |
| 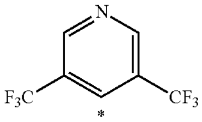 | 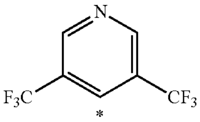 | −5.40 |
| 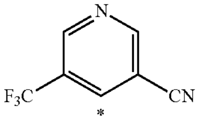 | 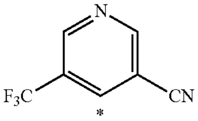 | −5.53 |
| 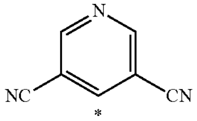 | 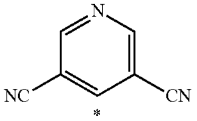 | −5.65 |
| 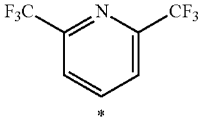 | 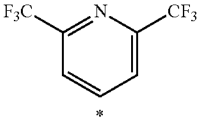 | −5.87 |
| 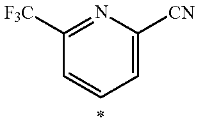 | 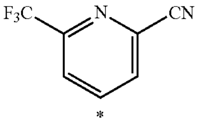 | −5.99 |
| 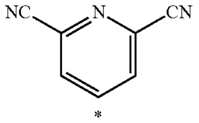 | 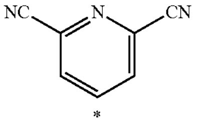 | −6.11 |
TABLE III-continued
| $R^1$ | $R^2$ | B3LYP/6-31G* [eV]/ LUMO |
|---|---|---|
| 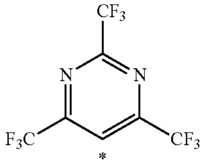 | 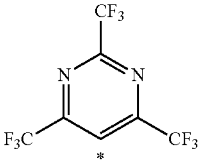 | −5.64 |
| 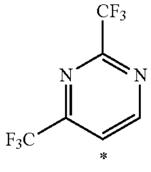 | 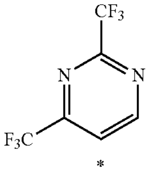 | −5.62 |
| 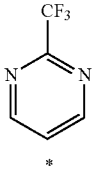 | 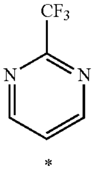 | −5.78 |
| 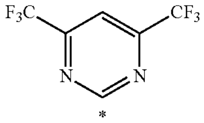 | 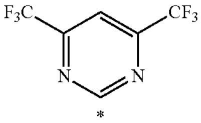 | −5.38 |
| 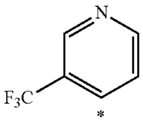 | 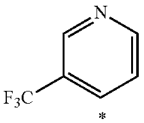 | −5.39 |
| 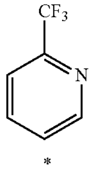 | 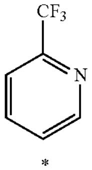 | −5.67 |
| 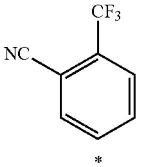 | 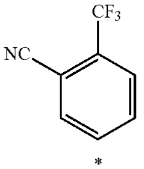 | −5.71 |
| 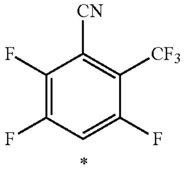 | 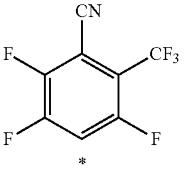 | −5.68 |
The Asterics "*" denotes the binding position of $R^1$ and $R^2$.
According to an embodiment of the present invention, wherein $R^1$ and $R^2$ of the compound of Formula (I) are preferably selected from table IV.

TABLE IV
| $R^1$ | $R^2$ | B3LYP/6-31G* [eV]/LUMO |
|---|---|---|
| 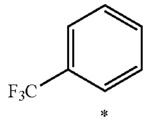 | 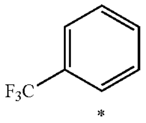 | −5.10 |
| 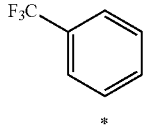 | 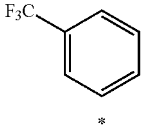 | −5.22 |
| 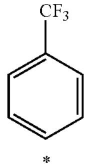 | 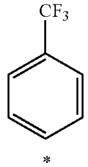 | −5.39 |
| 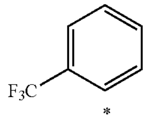 | 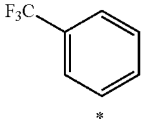 | −5.12 |
| 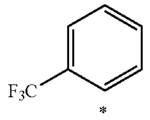 | 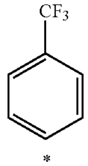 | −5.25 |
| 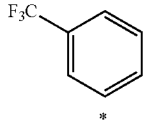 | 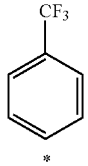 | −5.35 |
| 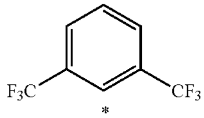 | 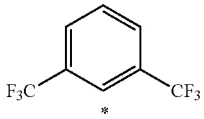 | −5.11 |
| 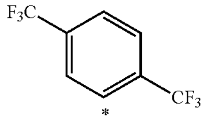 | 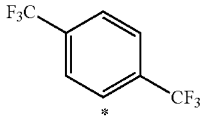 | −5.30 |
| 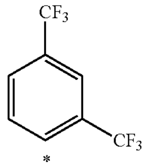 | 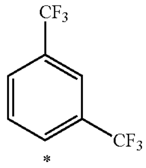 | −5.35 |
TABLE IV-continued
| $R^1$ | $R^2$ | B3LYP/6-31G* [eV]/LUMO |
|---|---|---|
| 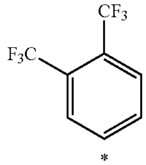 | 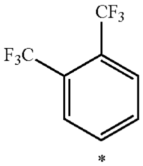 | −5.57 |
| 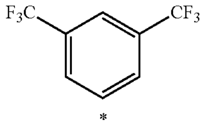 | 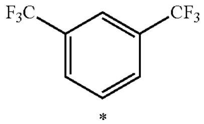 | −5.53 |
| 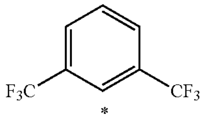 | 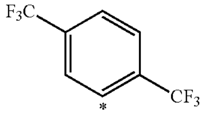 | −5.21 |
| 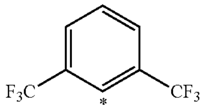 | 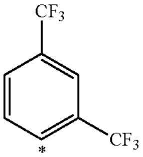 | −5.23 |
| 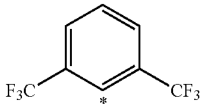 | 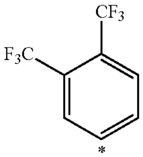 | −5.34 |
| 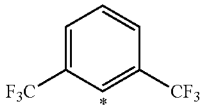 | 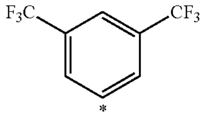 | −5.32 |
| 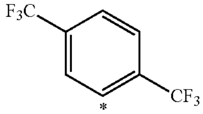 | 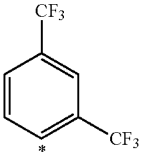 | −5.32 |
| 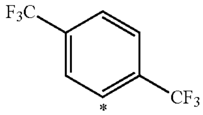 | 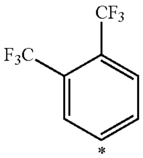 | −5.44 |
| 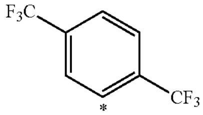 | 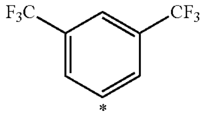 | −5.42 |

TABLE IV-continued
| $R^1$ | $R^2$ | B3LYP/6-31G* [eV]/ LUMO |
|---|---|---|
| 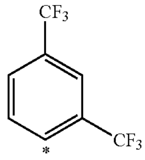 | 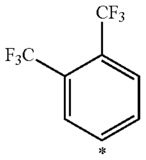 | −5.46 |
| 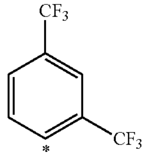 | 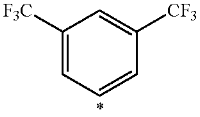 | −5.45 |
| 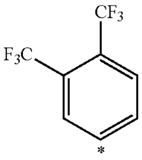 | 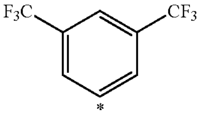 | −5.55 |
| 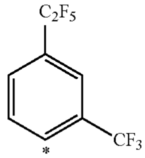 | 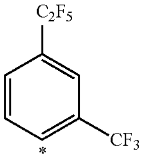 | −5.35 |
| 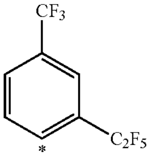 | 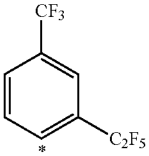 | −5.35 |
| 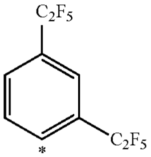 | 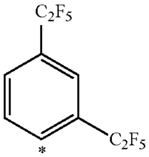 | −5.33 |
The Asterics "*" denotes the binding position of $R^1$ and $R^2$.
According to an embodiment of the present invention, wherein $R^1$ and $R^2$ of the compound of Formula (I) are preferably selected from table V.
TABLE V
| $R^1$ | $R^2$ | B3LYP/6-31G* [eV]/ LUMO |
|---|---|---|
| 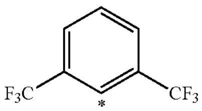 | 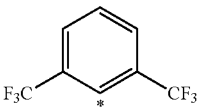 | −5.11 |
TABLE V-continued
| $R^1$ | $R^2$ | B3LYP/6-31G* [eV]/ LUMO |
|---|---|---|
| 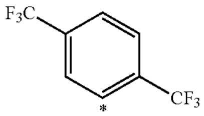 | 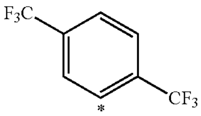 | −5.30 |
| 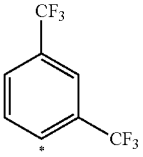 | 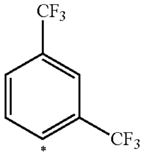 | −5.35 |
| 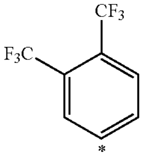 | 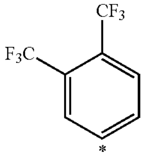 | −5.57 |
| 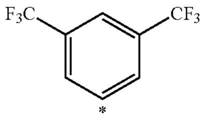 | 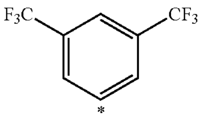 | −5.53 |
| 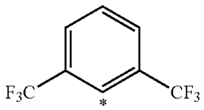 | 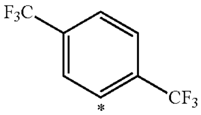 | −5.21 |
| 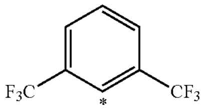 | 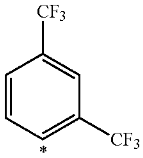 | −5.23 |
| 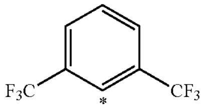 | 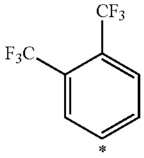 | −5.34 |
| 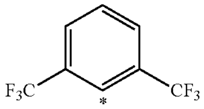 | 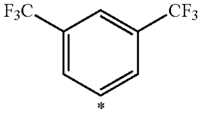 | −5.32 |
| 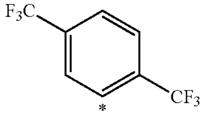 | 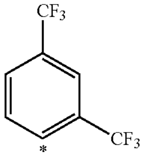 | −5.32 |

TABLE V-continued

| $R^1$ | $R^2$ | B3LYP/6-31G* [eV]/ LUMO |
|---|---|---|
| 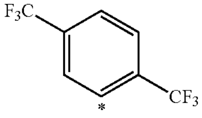 | 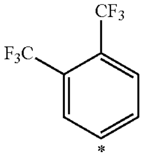 | −5.44 |
| 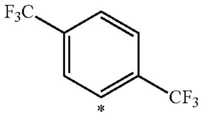 | 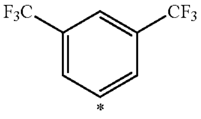 | −5.42 |
| 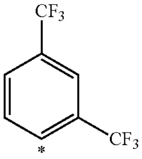 | 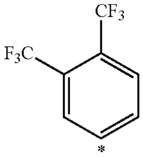 | −5.46 |
| 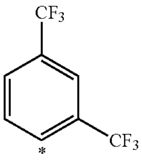 | 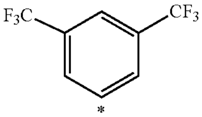 | −5.45 |
| 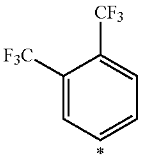 | 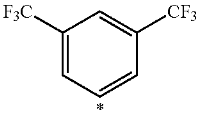 | −5.55 |

The Asterics "*" denotes the binding position of $R^1$ and $R^2$.

According to an embodiment of the present invention, wherein $R^1$ and $R^2$ of the compound of Formula (I) are preferably selected from table VI.

TABLE VI

| R1 | R2 | B3LYP/6-31G* [eV]/ LUMO |
|---|---|---|
| 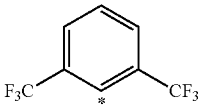 | 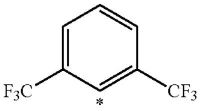 | −5.11 |
| 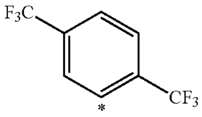 | 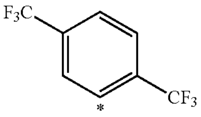 | −5.30 |

TABLE VI-continued

| R1 | R2 | B3LYP/6-31G* [eV]/ LUMO |
|---|---|---|
| 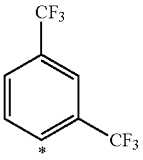 | 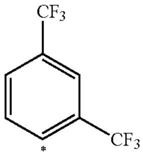 | −5.35 |
| 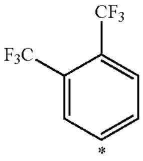 | 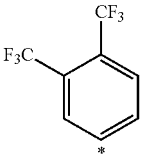 | −5.57 |
| 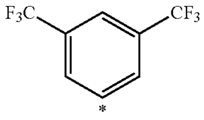 | 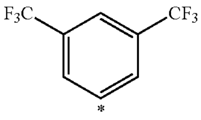 | −5.53 |

The Asterics "*" denotes the binding position of R1 and R2.

According to an embodiment, wherein $R^1$ and $R^2$ of the compound of Formula (I) are preferably selected from table VII.

TABLE VII

| $R^1$ | $R^2$ | B3LYP/6-31G* [eV]/ LUMO |
|---|---|---|
| 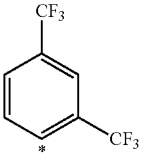 | 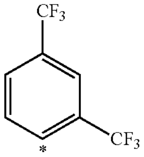 | −5.35 |

According to one embodiment of the present invention, the calculated LUMO of the compound of Formula (I) is in the range of ≤−4.9 eV to ≥−5.75 eV, when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase, of ≤−4.70 eV to ≥−5.75 eV preferably ≤−4.80 eV to ≥−5.75 eV, further preferred ≤−4.90 eV to ≥−5.75 eV, also preferred ≤−5.00 eV to ≥−5.75 eV, in addition preferred ≤−5.10 eV to ≥−5.75 eV, more preferred ≤−5.15 eV to ≥−5.75 eV, even more preferred ≤−5.25 eV to ≥−5.75 eV, or ≤−5.20 eV to ≥−5.6 eV.

According to an embodiment, wherein Formula (I) having the chemical structure IId:

(IId)

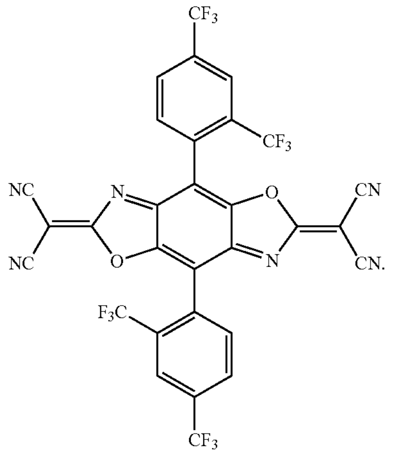

Organic Semiconductor Layer

According to one embodiment the organic electroluminescent device comprises an organic semiconductor layer, whereby the organic semiconductor layer comprises a compound of Formula (I). According to one embodiment the organic semiconductor layer comprises an organic hole transport material and a compound of Formula (I). According to one embodiment the organic electroluminescent device comprises comprises at least one organic semiconductor layer that comprises an organic hole transport material and a compound of Formula (I).

According to one embodiment of the present invention the organic semiconductor layer is preferably a hole injection layer.

According to one embodiment the organic electroluminescent device comprises an organic semiconductor layer, whereby the organic semiconductor layer comprises a compound according to Formula (I), (IIa), (IIb), (IIc) and/or (IId).

According to one embodiment compounds of Formulae (I), (IIa), (IIb), (IIc), (IId) may have a LUMO expressed in the absolute scale referring to vacuum energy level being zero when calculated with the program package TURBOMOLE V6.5 (TURBOMOLE GmbH, Litzenhardtstrasse 19, 76135 Karlsruhe, Germany) by applying the hybrid functional B3LYP with a 6-31G* basis set in the gas phase in the range from ≥−6.00 eV to ≤−4.70 eV, preferably ≥−5.90 eV to ≤−4.80 eV, more preferably ≥−5.80 eV to ≤−4.90 eV, more preferably ≥−5.70 eV to ≤−5.00 eV, more preferably ≥−5.60 eV to ≤−5.10 eV, more preferably ≥−5.60 eV to ≤−5.10 eV, more preferably ≥−5.50 eV to ≤−5.10 eV, and preferably ≥−5.45 eV to ≤−5.10 eV.

In case the organic semiconductor layer comprises a compound according to Formula (I), throughout this application text the term "compound of Formula (I)" shall also intend to include a composition, wherein the composition comprises at least one compound according to the invention as described above.

According to one embodiment of the present invention the organic semiconductor layer and/or the compound of Formula (I) are non-emissive. According to one embodiment of the present invention the organic semiconductor layer, the compound of Formula (I) and the organic hole transport material are non-emissive.

According to one embodiment the organic semiconductor layer comprises a compound of Formula (I) in an amount of ≤99.9 wt.-%, preferably ≤99 wt.-%, more preferably ≤95 wt.-%, more preferably ≤90 wt.-%, more preferably ≤80 wt.-%, more preferably ≤70 wt.-%, more preferably ≤60 wt.-%, more preferably ≤50 wt.-%, more preferably ≤40 wt.-%, more preferably ≤30 wt.-%, more preferably ≤20 wt.-%, more preferably ≤10 wt.-%, more preferably ≤5 wt.-%, more preferably ≤3.0 wt.-%, more preferably ≤2.75 wt.-%, more preferably ≤2.5 wt.-%, more preferably ≤2.25 wt.-%, and most preferably ≤2.0 wt.-% based on the total weight of the organic semiconductor layer, wherein the organic semiconductor layer is preferably a hole injection layer.

According to one embodiment of the present invention, the compound of Formula (I) is present in the organic semiconductor layer in an amount of ≤99.9 wt. % based on the total weight of the organic semiconductor layer, preferably ≤99 wt. %, more preferably ≤95 wt. %, more preferably ≤90 wt. %, more preferably ≤80 wt. %, more preferably ≤70 wt. %, more preferably ≤60 wt. %, more preferably ≤50 wt. %, more preferably ≤40 wt. %, more preferably ≤30 wt. %, more preferably ≤20 wt. %, more preferably ≤10 wt.-%, more preferably ≤5 wt.-%, more preferably ≤3.0 wt.-%, more preferably ≤2.75 wt.-%, more preferably ≤2.5 wt.-%, more preferably ≤2.25 wt.-%, and most preferably ≤2.0 wt.-%.

In the context of the present specification the term "essentially non-emissive" or "non-emissive" means that the contribution of the compound or layer to the visible emission spectrum from the device is less than 10%, preferably less than 5% relative to the visible emission spectrum. The visible emission spectrum is an emission spectrum with a wavelength of about ≥380 nm to about ≤780 nm.

According to one embodiment of the invention, the at least one organic semiconductor layer may further comprise at least one organic hole transport material, also referred to as matrix compound, covalent matrix compound, or substantially covalent matrix compound.

Organic Hole Transport Material

The organic semiconductor layer may further comprises an organic hole transport material also named a covalent matrix compound or substantially covalent matrix compound. According to one embodiment the organic hole transport material may be selected from at least one organic compound.

According to one embodiment the organic semiconductor layer further comprises an organic hole transport material, wherein the organic hole transport material may be selected from organic compounds consisting substantially from covalently bound C, H, O, N, S, which optionally comprise in addition covalently bound B, P, As and/or Se.

Organometallic compounds comprising covalent bonds carbon-metal, metal complexes comprising organic ligands and metal salts of organic acids are further examples of organic compounds that may serve as organic hole transport material.

In one embodiment, the organic hole transport material lacks metal atoms and majority of its skeletal atoms may be selected from C, O, S, N. Alternatively, the organic hole transport material lacks metal atoms and majority of its skeletal atoms may be selected from C and N.

According to one embodiment, the organic hole transport material may have a molecular weight Mw of ≥400 and ≤2000 g/mol, preferably a molecular weight Mw of ≥450 and ≤1500 g/mol, further preferred a molecular weight Mw of ≥500 and ≤1000 g/mol, in addition preferred a molecular weight Mw of ≥550 and ≤900 g/mol, also preferred a molecular weight Mw of ≥600 and ≤800 g/mol.

Preferably, the organic hole transport material comprises at least one arylamine moiety, alternatively a diarylamine moiety, alternatively a triarylamine moiety.

Preferably, the organic hole transport material is free of metals and/or ionic bonds.

According to one embodiment of the present invention, the organic hole transport material is present in the organic semiconductor layer in an amount of ≥0.1 wt. % based on the total weight of the organic semiconductor layer, preferably ≥1 wt. %, more preferably ≥5 wt. %, more preferably ≥10 wt. %, more preferably ≥20 wt. %, more preferably ≥30 wt. %, more preferably ≥40 wt. %, more preferably ≥50 wt. %, more preferably ≥60 wt. %, more preferably ≥70 wt. %, more preferably ≥80 wt. %, more preferably ≥90 wt. %, more preferably ≥95 wt. %, more preferably ≥97.0 wt. %, more preferably ≥97.25 wt. %, more preferably ≥97.5 wt. %, more preferably ≥97.75 wt. % and most preferably ≥98.0 wt. %.

Compound of Formula (VI) or a compound of Formula (VII)

According to another aspect of the present invention, the at least one organic hole transport material, also referred to as "substantially covalent matrix compound", may comprises at least one arylamine compound, diarylamine compound, triarylamine compound, a compound of Formula (VI) or a compound of Formula (VII)

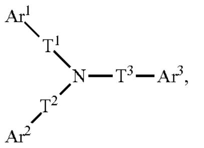

(VI)

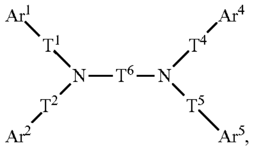

(VII)

wherein:

$T^1$, $T^2$, $T^3$, $T^4$ and $T^5$ are independently selected from a single bond, phenylene, biphenylene, terphenylene or naphthenylene, preferably a single bond or phenylene;

$T^6$ is phenylene, biphenylene, terphenylene or naphthenylene;

$Ar^1$, $Ar^2$, $Ar^3$, $Ar^4$ and $Ar^5$ are independently selected from substituted or unsubstituted $C_6$ to $C_{20}$ aryl, or substituted or unsubstituted $C_3$ to $C_{20}$ heteroarylene, substituted or unsubstituted biphenylene, substituted or unsubstituted fluorene, substituted 9-fluorene, substituted 9,9-fluorene, substituted or unsubstituted naphthalene, substituted or unsubstituted anthracene, substituted or unsubstituted phenanthrene, substituted or unsubstituted pyrene, substituted or unsubstituted perylene, substituted or unsubstituted triphenylene, substituted or unsubstituted tetracene, substituted or unsubstituted tetraphene, substituted or unsubstituted dibenzofurane, substituted or unsubstituted dibenzothiophene, substituted or unsubstituted xanthene, substituted or unsubstituted carbazole, substituted 9-phenylcarbazole, substituted or unsubstituted azepine, substituted or unsubstituted dibenzo[b,f]azepine, substituted or unsubstituted 9,9'-spirobi[fluorene], substituted or unsubstituted spiro[fluorene-9,9'-xanthene], or a substituted or unsubstituted aromatic fused ring system comprising at least three substituted or unsubstituted aromatic rings selected from the group comprising substituted or unsubstituted non-hetero, substituted or unsubstituted hetero 5-member rings, substituted or unsubstituted 6-member rings and/or substituted or unsubstituted 7-member rings, substituted or unsubstituted fluorene, or a fused ring system comprising 2 to 6 substituted or unsubstituted 5- to 7-member rings and the rings are selected from the group comprising (i) unsaturated 5- to 7-member ring of a heterocycle, (ii) 5- to 6-member of an aromatic heterocycle, (iii) unsaturated 5- to 7-member ring of a non-heterocycle, (iv) 6-member ring of an aromatic non-heterocycle;

wherein the substituents of $Ar^1$, $Ar^2$, $Ar^3$, $Ar^4$ and $Ar^5$ are selected the same or different from the group comprising H, D, F, $C({=}O)R^2$, CN, $Si(R^2)_3$, $P({=}O)(R^2)_2$, $OR^2$, $S({=}O)R^2$, $S({=}O)_2R^2$, substituted or unsubstituted straight-chain alkyl having 1 to 20 carbon atoms, substituted or unsubstituted branched alkyl having 1 to 20 carbon atoms, substituted or unsubstituted cyclic alkyl having 3 to 20 carbon atoms, substituted or unsubstituted alkenyl or alkynyl groups having 2 to 20 carbon atoms, substituted or unsubstituted alkoxy groups having 1 to 20 carbon atoms, substituted or unsubstituted aromatic ring systems having 6 to 40 aromatic ring atoms, and substituted or unsubstituted heteroaromatic ring systems having 5 to 40 aromatic ring atoms, unsubstituted $C_6$ to $C_{18}$ aryl, unsubstituted $C_3$ to $C_{18}$ heteroaryl, a fused ring system comprising 2 to 6 unsubstituted 5- to 7-member rings and the rings are selected from the group comprising unsaturated 5- to 7-member ring of a heterocycle, 5- to 6-member of an aromatic heterocycle, unsaturated 5- to 7-member ring of a non-heterocycle, and 6-member ring of an aromatic non-heterocycle, wherein $R^2$ may be selected from H, D, straight-chain alkyl having 1 to 6 carbon atoms, branched alkyl having 1 to 6 carbon atoms, cyclic alkyl having 3 to 6 carbon atoms, alkenyl or alkynyl groups having 2 to 6 carbon atoms, $C_6$ to $C_{18}$ aryl or $C_3$ to $C_{18}$ heteroaryl.

According to an embodiment, wherein $T^1$, $T^2$, $T^3$, $T^4$ and $T^5$ may be independently selected from a single bond, phenylene, biphenylene or terphenylene. According to an embodiment, wherein $T^1$, $T^2$, $T^3$, $T^4$ and $T^5$ may be independently selected from phenylene, biphenylene or terphenylene and one of $T^1$, $T^2$, $T^3$, $T^4$ and $T^5$ are a single bond. According to an embodiment, wherein $T^1$, $T^2$, $T^3$, $T^4$ and $T^5$ may be independently selected from phenylene or biphenylene and one of $T^1$, $T^2$, $T^3$, $T^4$ and $T^5$ are a single bond. According to an embodiment, wherein $T^1$, $T^2$, $T^3$, $T^4$ and $T^5$ may be independently selected from phenylene or biphenylene and two of $T^1$, $T^2$, $T^3$, $T^4$ and $T^5$ are a single bond.

According to an embodiment, wherein $T^1$, $T^2$ and $T^3$ may be independently selected from phenylene and one of $T^1$, $T^2$ and $T^3$ are a single bond. According to an embodiment, wherein $T^1$, $T^2$ and $T^3$ may be independently selected from phenylene and two of $T^1$, $T^2$ and $T^3$ are a single bond.

According to an embodiment, wherein $T^6$ may be phenylene, biphenylene, terphenylene. According to an embodiment, wherein $T^6$ may be phenylene. According to an embodiment, wherein $T^6$ may be biphenylene. According to an embodiment, wherein $T^6$ may be terphenylene.

According to an embodiment, wherein $Ar^1$, $Ar^2$, $Ar^3$, $Ar^4$ and $Ar^5$ may be independently selected from K1 to K16:

(K1)

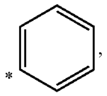

(K2)

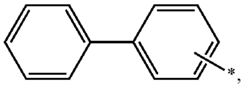

(K3)

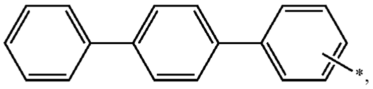

(K4)

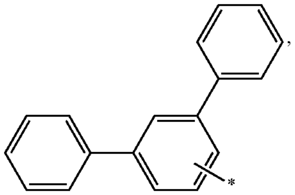

(K5)

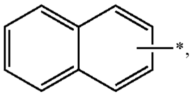

(K6)

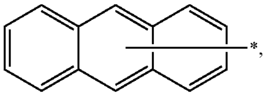

(K7)

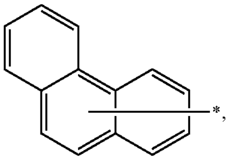

(K8)

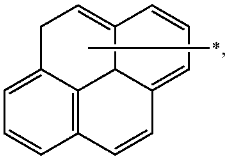

(K9)

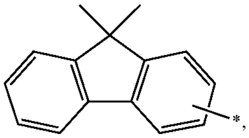

(K10)

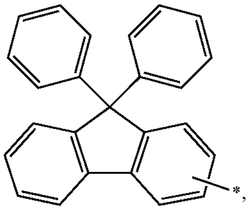

-continued (K11)

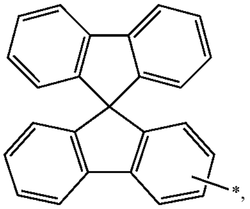

(K12)

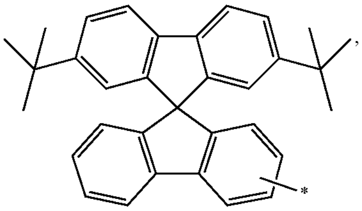

(K13)

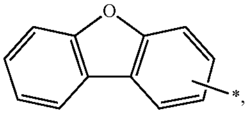

(K14)

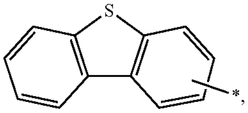

wherein the asterix "*" denotes the binding position.

According to an embodiment, wherein $Ar^1$, $Ar^2$, $Ar^3$, $Ar^4$ and $Ar^5$ may be independently selected from K1 to K15; alternatively selected from K1 to K10 and K13 to K15.

According to an embodiment, wherein $Ar^1$, $Ar^2$, $Ar^3$, $Ar^4$ and $Ar^5$ may be independently selected from the group consisting of K1, K2, K5, K7, K9, K10, K13 to K16.

The rate onset temperature may be in a range particularly suited to mass production, when $Ar^1$, $Ar^2$, $Ar^3$, $Ar^4$ and $Ar^5$ are selected in this range.

The organic hole transport material of Formula (VI) or Formula (VII) "may be also referred to as "hole transport compound".

According to one embodiment, the organic hole transport material comprises at least one naphthyl group, carbazole group, dibenzofuran group, dibenzothiophene group and/or substituted fluorenyl group, wherein the substituents are independently selected from methyl, phenyl or fluorenyl.

According to an embodiment of the electronic device, wherein the organic hole transport material of Formula (VI) or Formula (VII) are selected from L1 to L18:

(L1)

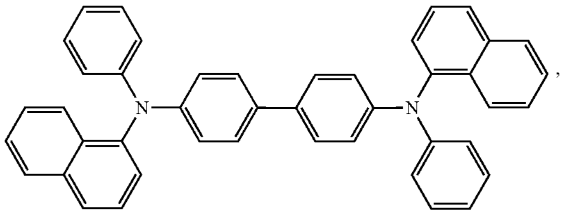

-continued
(L2)
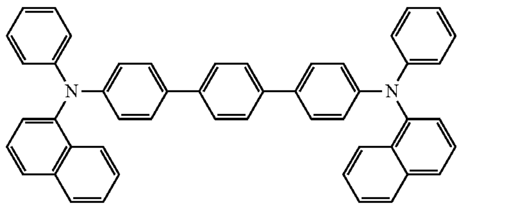
,
(L3)
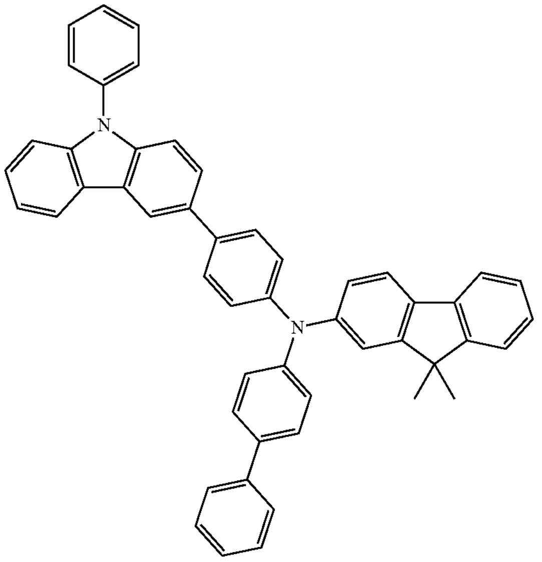
,
(L4)
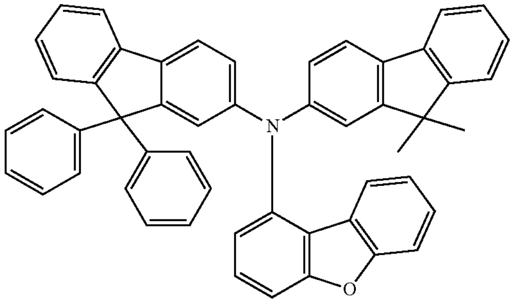
,
(L5)
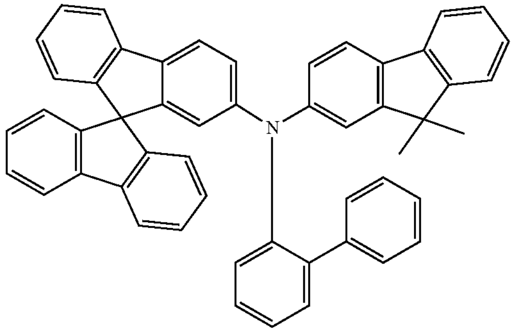
,
-continued
(L6)
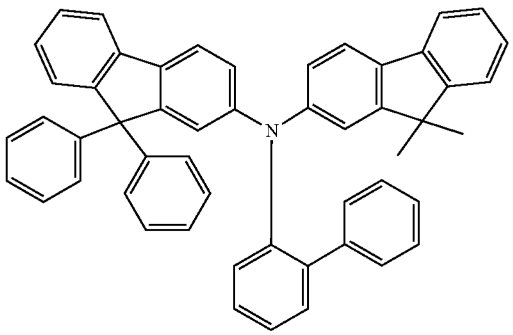
,
(L7)
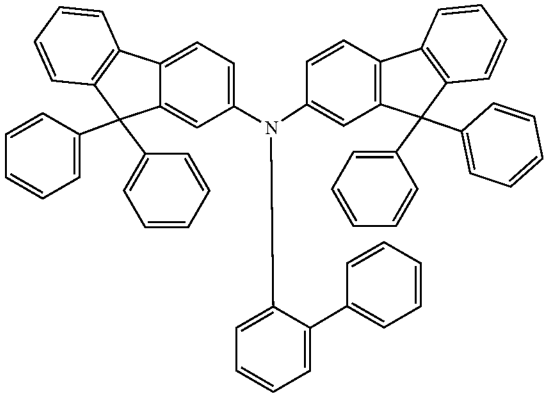
,
(L8)
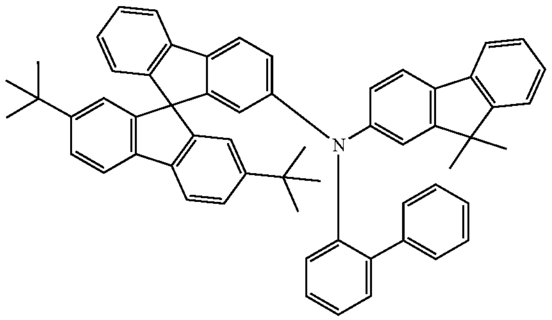
,
(L9)
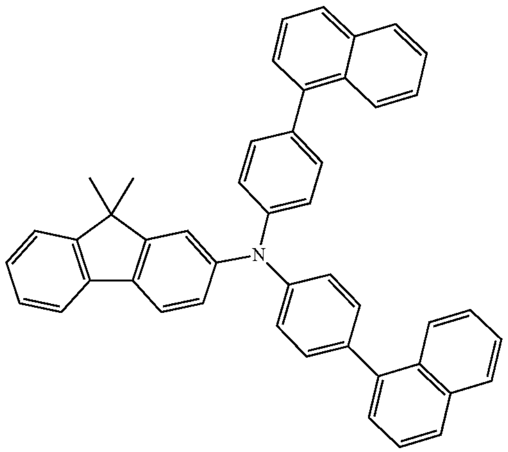
, -continued
(L10)
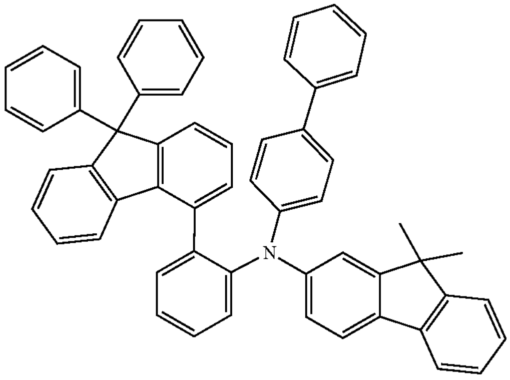
,
(L11)
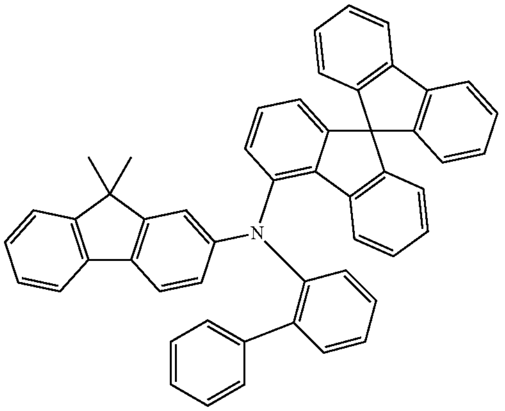
,
(L12)
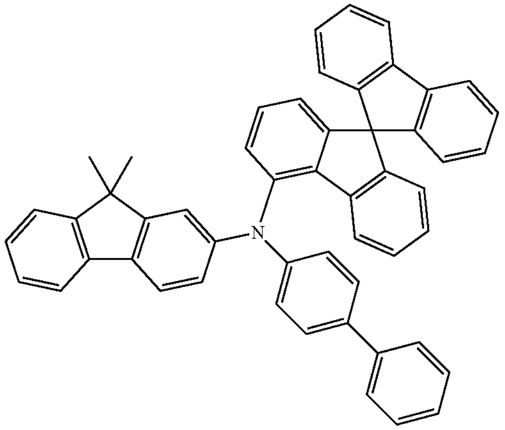
,
-continued
(L13)
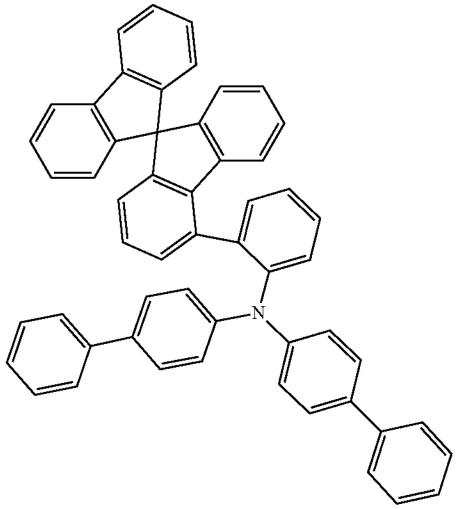
,
(L14)
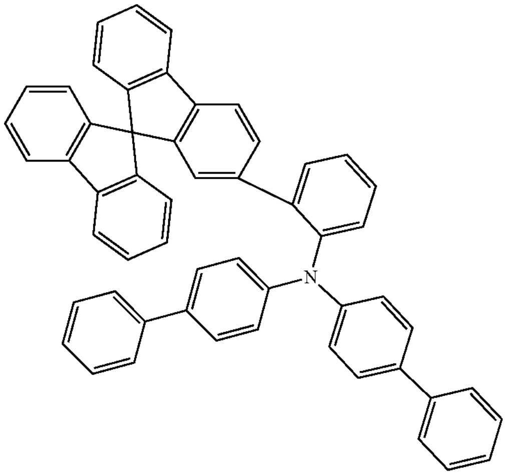
,
(L15)
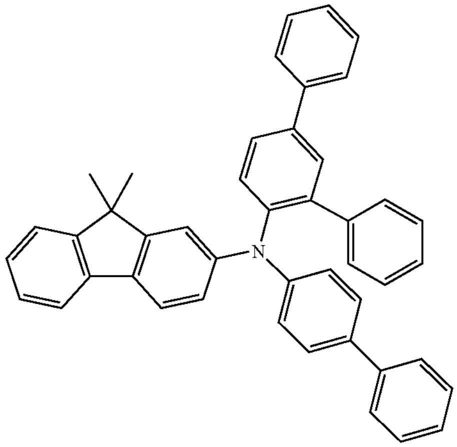
, -continued (L16)

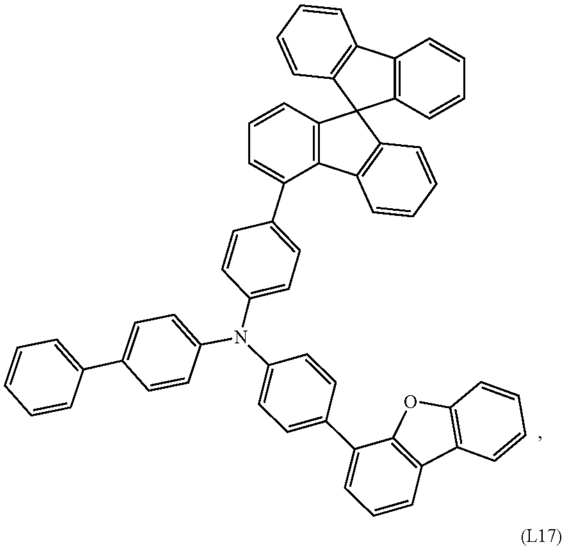

, (L17)

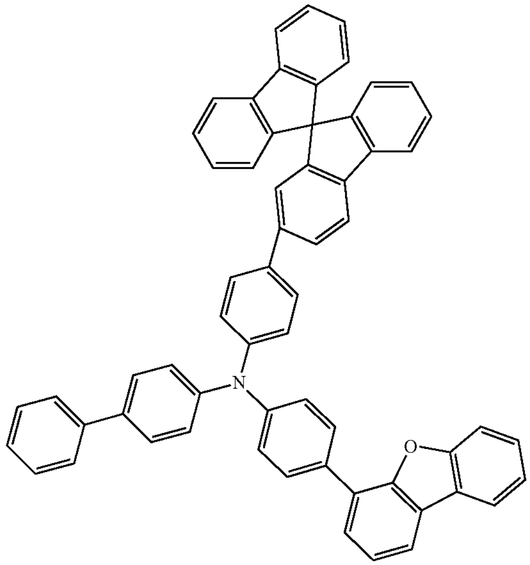

, (L18)

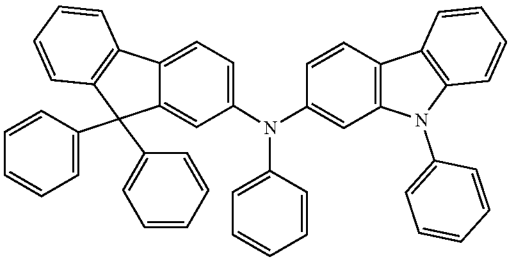

.

Light-Emitting Unit

According to one embodiment, wherein a light-emitting unit comprises at least one hole transport layer, optional at least one electron blocking layer, at least one emission layer, optional at least one hole blocking layer, and at least one an electron transport layer.

According to one embodiment, wherein a light-emitting unit comprises at least one hole transport layer, at least one electron blocking layer, at least one emission layer, optional at least one hole blocking layer, and at least one an electron transport layer.

According to one embodiment, wherein at least one or more light-emitting unit comprises each at least one hole transport layer, at least one electron blocking layer, at least one emission layer, at least one hole blocking layer, and at least one an electron transport layer.

According to one embodiment, wherein each of the light-emitting units comprises each at least one hole transport layer, at least one electron blocking layer, at least one emission layer, at least one hole blocking layer, and at least one an electron transport layer.

Organic Electroluminescent Device

The present invention furthermore relates to an organic electroluminescent device comprising an anode layer, a cathode layer, and at least one organic semiconductor layer, wherein the at least one organic semiconductor layer is arranged between the anode layer and the cathode layer, and wherein the at least one organic semiconductor layer is the organic semiconductor layer according to the present invention. Preferably the organic semiconductor layer is a hole injection layer.

According to one embodiment of the organic electroluminescent device whereby the anode layer comprises at least a first anode sub-layer and a second anode sub-layer.

According to one embodiment of the present invention, wherein the organic electroluminescent device further comprises at least one photoactive layer, wherein the at least one photoactive layer is arranged between the anode layer and the cathode layer and at least one of the at least one organic semiconductor layers is arranged between the anode layer and the at least one photoactive layer.

According to one embodiment of the present invention, wherein the organic semiconductor layer is a hole injection layer.

According to one embodiment of the present invention, the hole injection layer is in direct contact with the anode layer.

According to one embodiment of the present invention, the hole injection layer is in direct contact with the anode layer and the anode layer is in direct contact with the substrate, wherein the substrate is selected from a glass substrate, a plastic substrate, a metal substrate or a backplane.

According to one embodiment of the present invention, wherein the photoactive layer is a light emitting layer.

According to one embodiment of the present invention, wherein the organic electroluminescent device is an organic electronic device, an organic light emitting diode (OLED), a light emitting device, thin film transistor, a battery, a display device or an organic photovoltaic cell (OPV). According to one embodiment, wherein organic electronic device comprises an electroluminescent device, an organic light emitting diode (OLED), a light emitting device, thin film transistor, a battery, a display device or an organic photovoltaic cell (OPV), and preferably an organic light emitting diode (OLED). According to one embodiment the organic electronic device is preferably a display device comprising an organic electroluminescent device according to the present invention.

According to one embodiment of the present invention, wherein the composition of the p-type charge generation layer are selected identical with the organic semiconductor layer.

According to one embodiment of the present invention, the organic electroluminescent device comprises at least two emission layers, wherein at least one of the at least one organic semiconductor layers is arranged between the first and the second emission layer.

According to one embodiment of the present invention, the organic electroluminescent device is preferably an organic light emitting diode.

According to one embodiment of the present invention, the organic electroluminescent device further comprises a substrate.

According to one embodiment of the invention, the organic electroluminescent device comprises an anode layer, a cathode layer, an organic semiconductor layer, at least one first or more charge generation layers, at least two or more light-emitting units, wherein each light-emitting units comprises a light-emitting layer, and charge generation layer comprises a p-type charge generation layer, wherein the organic semiconductor layer is arranged closer to the anode layer than the p-type charge generation layer, and wherein the organic semiconductor layer comprises an organic hole transport material and a compound of Formula (I), and the p-type charge generation layer comprises an organic hole transport material and a compound of Formula (I).

According to one embodiment of the invention, the organic electroluminescent device comprises an anode layer, a cathode layer, an organic semiconductor layer, at least one first or more charge generation layers, at least two or more light-emitting units, wherein each light-emitting units comprises a light-emitting layer, and charge generation layer comprises a p-type charge generation layer, wherein the organic semiconductor layer is arranged closer to the anode layer than the p-type charge generation layer, and wherein the organic semiconductor layer is a hole injection layer that comprises an organic hole transport material and a compound of Formula (I), and the p-type charge generation layer comprises an organic hole transport material and a compound of Formula (I).

According to one embodiment of the invention, the organic electroluminescent device comprises an anode layer, a cathode layer, an organic semiconductor layer, at least one first or more charge generation layers, at least two or more light-emitting units, wherein each light-emitting units comprises a light-emitting layer, and charge generation layer comprises a p-type charge generation layer, wherein the organic semiconductor layer is arranged closer to the anode layer than the p-type charge generation layer, and wherein the organic semiconductor layer is a hole injection layer that comprises an organic hole transport material and a compound of Formula (I), and the p-type charge generation layer comprises an organic hole transport material and a compound of Formula (I).

According to one embodiment of the invention, the organic electroluminescent device comprises an anode layer, a cathode layer, an organic semiconductor layer, at least one first or more charge generation layers, at least two or more light-emitting units, wherein each light-emitting units comprises a light-emitting layer, and charge generation layer comprises a p-type charge generation layer, wherein the organic semiconductor layer is arranged closer to the anode layer than the p-type charge generation layer, and wherein the organic semiconductor layer is a hole injection layer that comprises an organic hole transport material and a compound of Formula (I), and the p-type charge generation layer comprises an organic hole transport material and a compound of Formula (I), and wherein the organic semiconductor layer, preferably hole injection layer, and the p-type charge generation layer comprise the identical compound of Formula (I).

According to one embodiment of the invention, the organic electroluminescent device comprises an anode layer, a cathode layer, an organic semiconductor layer, at least one first or more charge generation layers, at least two or more light-emitting units, wherein each light-emitting units comprises a light-emitting layer, and charge generation layer comprises a p-type charge generation layer, wherein the organic semiconductor layer is arranged closer to the anode layer than the p-type charge generation layer, and wherein the organic semiconductor layer is a hole injection layer that comprises an organic hole transport material and a compound of Formula (I), and the p-type charge generation layer comprises an organic hole transport material and a compound of Formula (I), and wherein the organic semiconductor layer, preferably hole injection layer, and the p-type charge generation layer comprise the identical compound of Formula (I) and the identical organic hole transport material.

According to one embodiment, wherein the organic electroluminescent device comprises at least two light-emitting units. According to one embodiment, wherein the organic electroluminescent device comprises at least one or more light-emitting unit comprises each at least one hole transport layer, at least one electron blocking layer, at least one emission layer, at least one hole blocking layer, and at least one an electron transport layer. According to one embodiment, wherein the organic electroluminescent device comprises at least two light-emitting units of a first light-emitting unit and a second light-emitting unit, and wherein the first light-emitting unit is arranged closer to the anode than the second light-emitting unit, wherein each light-emitting unit is free of a hole injection layer, and wherein the semiconductor layer is a hole injection layer and arranged between the anode and the first light emitting unit.

According to one embodiment of the organic electroluminescent device, wherein the at least two light emitting units and the first charge generation layer are arranged between the anode layer and the cathode layer, wherein the first charge generation layer is disposed on the first light emitting unit, and the first light emitting unit of the at least two light emitting units is disposed on the semiconductive layer, wherein the semiconductive layer is preferably a hole injection layer, and the second light emitting unit is disposed on the first charge generation layer.

According to one embodiment of the organic electroluminescent device, wherein the organic electroluminescent device comprises at least three light-emitting units. According to one embodiment of the organic electroluminescent device, wherein the organic electroluminescent device comprises at least three light-emitting units of a first light-emitting unit, a second light emitting unit and a third light-emitting unit, and wherein the first light-emitting unit is arranged closer to the anode than the second light-emitting unit, and wherein the third light emitting unit is arranged closer to the cathode layer than the second light-emitting unit, wherein each light-emitting are free of a hole injection layer, and wherein the semiconductor layer is a hole injection layer and arranged between the anode and the first light emitting unit.

According to one embodiment of the organic electroluminescent device, wherein the organic electroluminescent device comprises at least three light-emitting units, and at least two charge generation layers, wherein the first charge generation layer is disposed between a set of two adjacent light-emitting units and the second charge generation layer is disposed between two adjacent light-emitting units, wherein between two adjacent light emitting units not more than one charge generation is arranged.

According to one embodiment, wherein the organic electroluminescent device comprises at least four light-emitting units. According to one embodiment of the organic electroluminescent device, wherein the organic electroluminescent device comprises at least four light-emitting units and at least three charge generation layers, wherein the first charge generation layers is disposed between a set of adjacent two light-emitting units, and the second charge generation layer is disposed between two adjacent light-emitting units, and the third charge generation layer is disposed between two adjacent light-emitting units, wherein between two adjacent light emitting units not more than one charge generation is arranged.

According to one embodiment, wherein the organic electroluminescent device comprises:

- at least three light emitting units and at least two charge generation layer, wherein the first charge generation layer is disposed on the first light emitting unit, and the second charge generation layer is disposed on the second light emitting unit wherein the first light emitting unit is arranged closer to the anode layer, the third light emitting unit is arranged closer to the cathode layer and the second light emitting unit is arranged between the first light emitting unit and the second light emitting unit; or
- at least four light emitting units and at least three charge generation layer, wherein the first charge generation layer is disposed on the first light emitting unit, and the second charge generation layer is disposed on the second light emitting unit the third charge generation layer is disposed on the third light emitting unit, and the fourth light-emitting unit is disposed over the third charge generation layer, wherein the first light emitting unit is arranged closer to the anode layer, the fourth light emitting unit is arranged closer to the cathode layer, the second light emitting unit and third light emitting unit are arranged between the first light emitting unit and the fourth light emitting unit, wherein the second light emitting unit is arranged closer to the first light emitting unit and the third light emitting unit is arranged closer to the fourth light emitting unit.

According to one embodiment, wherein the organic electroluminescent device comprises at least five light-emitting units. According to one embodiment, wherein organic electroluminescent device comprises at least sixth light-emitting units.

According to one embodiment of the organic electroluminescent device, wherein between adjacent light-emitting units a charge generation layer is disposed, preferably a first charge generation layer is disposed between a first light-emitting unit and a second light-emitting unit, wherein the first light-emitting unit is arranged closer to the anode than the second light-emitting unit.

According to one embodiment of the organic electroluminescent device, wherein a charge generation layer comprises a n-type charge generation layer and a p-type charge generation layer, preferably the n-type charge generation layer and the p-type charge generation layer of a charge generation layer are arranged in a direct contact, and further preferred the n-type charge generation layer is arranged closer to the anode layer than the p-type charge generation layer.

According to one embodiment of the organic electroluminescent device, wherein electron transport layer is in direct contact to the n-CGL, and/or the p-type charge generation is in direct contact to a hole transport layer, and/or the electron transport layer is in direct contact to the n-CGL and the p-type charge generation is in direct contact to a hole transport layer.

According to one embodiment of the organic electroluminescent device, wherein electron transport layer is free of a metal dopant, preferably the electron transport layer is free of a metal dopant wherein the metal of the metal dopant has the oxidation state 0.

According to one embodiment of the organic electroluminescent device, wherein at least to charge generation layers contain the same compound of Formula (I), preferably at least three charge generation layers contain the same compound of Formula (I), further preferred four charge generation layers contain the same compound of Formula (I), or all charge generation layers contains the same compound of Formula (I).

Further Layers

In accordance with the invention, the organic electroluminescent device may comprise, besides the layers already mentioned above, further layers. Exemplary embodiments of respective layers are described in the following:

Substrate

The substrate may be any substrate that is commonly used in manufacturing of, electronic devices, such as organic light-emitting diodes. If light is to be emitted through the substrate, the substrate shall be a transparent or semitransparent material, for example a glass substrate or a transparent plastic substrate. If light is to be emitted through the top surface, the substrate may be both a transparent as well as a non-transparent material, for example a glass substrate, a plastic substrate, a metal substrate, a silicon substrate or a backplane.

Anode Layer

The anode layer may be formed by depositing or sputtering a material that is used to form the anode layer. The material used to form the anode layer may be a high work-function material, so as to facilitate hole injection. The anode material may also be selected from a low work function material (i.e. aluminum). The anode electrode may be a transparent or reflective electrode. Transparent conductive oxides, such as indium tin oxide (ITO), indium zinc oxide (IZO), tin-dioxide ($SnO2$), aluminum zinc oxide (AlZO) and zinc oxide (ZnO), may be used to form the anode electrode. The anode layer may also be formed using metals, typically silver (Ag), gold (Au), or metal alloys.

According to one embodiment of the present invention, the anode layer comprises a first anode sub-layer and a second anode sub-layer, wherein

- the first anode sub-layer comprises a first metal having a work function in the range of ≥4 and ≤6 eV, and
- the second anode sub-layer comprises a transparent conductive oxide; and
- the second anode sub-layer is arranged closer to the hole injection layer.

According to one embodiment of the present invention, the first metal of the first anode sub-layer may be selected from the group comprising Ag, Mg, Al, Cr, Pt, Au, Pd, Ni, Nd, Ir, preferably Ag, Au or Al, and more preferred Ag.

According to one embodiment of the present invention, the first anode sub-layer has have a thickness in the range of 5 to 200 nm, alternatively 8 to 180 nm, alternatively 8 to 150 nm, alternatively 100 to 150 nm.

According to one embodiment of the present invention, the first anode sub-layer is formed by depositing the first metal via vacuum thermal evaporation.

It is to be understood that the first anode layer is not part of the substrate.

According to one embodiment of the present invention, the transparent conductive oxide of the second anode sub layer is selected from the group selected from the group comprising indium tin oxide or indium zinc oxide, more preferred indium tin oxide.

According to one embodiment of the present invention, the second anode sub-layer may has a thickness in the range of 3 to 200 nm, alternatively 3 to 180 nm, alternatively 3 to 150 nm, alternatively 3 to 20 nm.

According to one embodiment of the present invention, the second anode sub-layer may be formed by sputtering of the transparent conductive oxide.

According to one embodiment of the present invention, anode layer of the organic electroluminescent device comprises in addition a third anode sub-layer comprising a transparent conductive oxide, wherein the third anode sub-layer is arranged between the substrate and the first anode sub-layer.

According to one embodiment of the present invention, the third anode sub-layer comprises a transparent oxide, preferably from the group selected from the group comprising indium tin oxide or indium zinc oxide, more preferred indium tin oxide.

According to one embodiment of the present invention, the third anode sub-layer may has a thickness in the range of 3 to 200 nm, alternatively 3 to 180 nm, alternatively 3 to 150 nm, alternatively 3 to 20 nm.

According to one embodiment of the present invention, the third anode sub-layer may be formed by sputtering of the transparent conductive oxide.

It is to be understood that the third anode layer is not part of the substrate.

According to one embodiment of the present invention, the anode layer comprises a first anode sub-layer comprising of Ag, a second anode sub-layer comprising of transparent conductive oxide, preferably ITO, and a third anode sub-layer comprising of transparent conductive oxide, preferably ITO; wherein the first anode sub-layer is arranged between the second and the third anode sub-layer.

Hole Transport Layer

According to one embodiment of the present invention, the organic electroluminescent device comprises a hole transport layer, wherein the hole transport layer is arranged between the hole injection layer and the at least one first emission layer.

According to one embodiment of the present invention, the hole transport layer is arranged in direct contact with the p-type charge generation layer (p-CGL).

According to one embodiment of the organic electroluminescent device, wherein a hole transport layer is arranged in direct contact with a p-type charge generation layer, preferably the hole transport layer is arranged closer to the cathode than the p-type charge generation layer.

The hole transport layer (HTL) may be formed on the HIL by vacuum deposition, spin coating, slot-die coating, printing, casting, Langmuir-Blodgett (LB) deposition, or the like. When the HTL is formed by vacuum deposition or spin coating, the conditions for deposition and coating may be similar to those for the formation of the HIL. However, the conditions for the vacuum or solution deposition may vary, according to the compound that is used to form the HTL.

The HTL may be formed of any compound that is commonly used to form a HTL. Compounds that can be suitably used are disclosed for example in Yasuhiko Shirota and Hiroshi Kageyama, Chem. Rev. 2007, 107, 953-1010 and incorporated by reference. Examples of the compound that may be used to form the HTL are: carbazole derivatives, such as N-phenyl-carbazole or polyvinylcarbazole; benzidine derivatives, such as N,N'-bis(3-methylphenyl)-N,N'-diphenyl-[1,1-biphenyl]-4,4'-diamine (TPD), or N,N'-di(naphthalen-1-yl)-N,N'-diphenyl benzidine (alpha-NPD); and triphenylamine-based compound, such as 4,4',4"-tris(N-carbazolyl)triphenylamine (TCTA). Among these compounds, TCTA can transport holes and inhibit excitons from being diffused into the EML.

According to one embodiment of the present invention, the hole transport layer may comprise a substantially covalent matrix compound as described above.

According to one embodiment of the present invention, the hole transport layer may comprise a compound of Formula (VI) or (VII) as described above.

According to one embodiment of the present invention, the hole injection layer and the hole transport layer comprises the same substantially covalent matrix compound as described above.

According to one embodiment of the present invention, the hole injection layer and the hole transport layer comprises the same compound of Formula (VI) or (VII) as described above.

The thickness of the HTL may be in the range of about 5 nm to about 250 nm, preferably, about 10 nm to about 200 nm, further about 20 nm to about 190 nm, further about 40 nm to about 180 nm, further about 60 nm to about 170 nm, further about 80 nm to about 160 nm, further about 100 nm to about 160 nm, further about 110 nm to about 140 nm.

When the thickness of the HTL is within this range, the HTL may have excellent hole transporting characteristics, without a substantial penalty in driving voltage.

Electron Blocking Layer

The function of an electron blocking layer (EBL) is to prevent electrons from being transferred from an emission layer to the hole transport layer and thereby confine electrons to the emission layer. Thereby, efficiency, operating voltage and/or lifetime are improved. Typically, the electron blocking layer comprises a triarylamine compound. The triarylamine compound may have a LUMO level closer to vacuum level than the LUMO level of the hole transport layer. The electron blocking layer may have a HOMO level that is further away from vacuum level compared to the HOMO level of the hole transport layer. The thickness of the electron blocking layer may be selected between 2 and 20 nm.

If the electron blocking layer has a high triplet level, it may also be described as triplet control layer.

The function of the triplet control layer is to reduce quenching of triplets if a phosphorescent green or blue emission layer is used. Thereby, higher efficiency of light emission from a phosphorescent emission layer can be achieved. The triplet control layer is selected from triarylamine compounds with a triplet level above the triplet level of the phosphorescent emitter in the adjacent emission layer. Suitable compounds for the triplet control layer, in particular the triarylamine compounds, are described in EP 2 722 908 A1.

Photoactive Layer (PAL)

The photoactive layer converts an electrical current into photons or photons into an electrical current. The PAL may be formed on the HTL by vacuum deposition, spin coating, slot-die coating, printing, casting, LB deposition, or the like. When the PAL is formed using vacuum deposition or spin coating, the conditions for deposition and coating may be similar to those for the formation of the HIL. However, the conditions for deposition and coating may vary, according to the compound that is used to form the PAL. It may be provided that the photoactive layer does not comprise the a metal complex according to Formula (I). The photoactive layer may be a light-emitting layer or a light-absorbing layer.

Emission Layer (EML)

The EML may be formed on the HTL by vacuum deposition, spin coating, slot-die coating, printing, casting, LB deposition, or the like. When the EML is formed using vacuum deposition or spin coating, the conditions for deposition and coating may be similar to those for the formation of the HIL. However, the conditions for deposition and coating may vary, according to the compound that is used to form the EML.

According to one embodiment of the present invention, the emission layer does not comprise the compound of Formula (I).

The emission layer (EML) may be formed of a combination of a host and an emitter dopant. Example of the host are Alq3,4,4'-N,N'-dicarbazole-biphenyl (CBP), poly(n-vinylcarbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBI), 3-tert-butyl-9,10-di-2-naphthylanthracenee (TBADN), distyrylarylene (DSA) and bis(2-(2-hydroxyphenyl)benzothiazolate)zinc (Zn(BTZ)2).

The emitter dopant may be a phosphorescent or fluorescent emitter. Phosphorescent emitters and emitters which emit light via a thermally activated delayed fluorescence (TADF) mechanism may be preferred due to their higher efficiency. The emitter may be a small molecule or a polymer.

Examples of red emitter dopants are PtOEP, Ir(piq)3, and Btp2lr(acac), but are not limited thereto. These compounds are phosphorescent emitters, however, fluorescent red emitter dopants could also be used.

Examples of phosphorescent green emitter dopants are Ir(ppy)3 (ppy=phenylpyridine), Ir(ppy)2(acac), Ir(mpyp)3.

Examples of phosphorescent blue emitter dopants are F2Irpic, (F2ppy)2Ir(tmd) and Ir(dfppz)3 and ter-fluorene. 4.4'-bis(4-diphenyl amiostyryl)biphenyl (DPAVBi), 2,5,8,11-tetra-tert-butyl perylene (TBPe) are examples of fluorescent blue emitter dopants.

The amount of the emitter dopant may be in the range from about 0.01 to about 50 parts by weight, based on 100 parts by weight of the host. Alternatively, the emission layer may consist of a light-emitting polymer. The EML may have a thickness of about 10 nm to about 100 nm, for example, from about 20 nm to about 60 nm. When the thickness of the EML is within this range, the EML may have excellent light emission, without a substantial penalty in driving voltage.

Hole Blocking Layer (HBL)

A hole blocking layer (HBL) may be formed on the EML, by using vacuum deposition, spin coating, slot-die coating, printing, casting, LB deposition, or the like, in order to prevent the diffusion of holes into the ETL. When the EML comprises a phosphorescent dopant, the HBL may have also a triplet exciton blocking function.

The HBL may also be named auxiliary ETL or a-ETL.

When the HBL is formed using vacuum deposition or spin coating, the conditions for deposition and coating may be similar to those for the formation of the HIL. However, the conditions for deposition and coating may vary, according to the compound that is used to form the HBL. Any compound that is commonly used to form a HBL may be used. Examples of compounds for forming the HBL include oxadiazole derivatives, triazole derivatives, phenanthroline derivatives and azine derivatives, preferably triazine or pyrimidine derivatives.

The HBL may have a thickness in the range from about 5 nm to about 100 nm, for example, from about 10 nm to about 30 nm. When the thickness of the HBL is within this range, the HBL may have excellent hole-blocking properties, without a substantial penalty in driving voltage.

A preferred HBL layer material is AN-2 having the Formula:

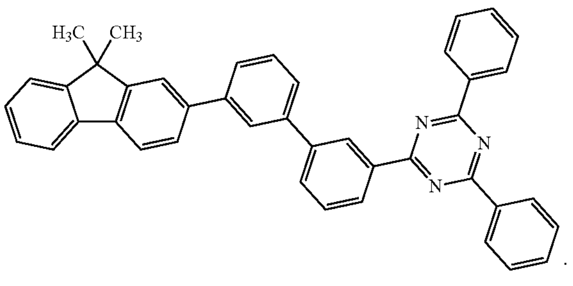 [SMILES: CC1(C)c2ccccc2-c2ccc(-c3cccc(-c4cccc(-c5nc(-c6ccccc6)nc(-c6ccccc6)n5)c4)c3)cc21]

AN-2 is named 2-(3'-(9,9-dimethyl-9H-fluoren-2-yl)-[1,1'-biphenyl]-3-yl)-4,6-diphenyl-1,3,5-triazin.

Electron Transport Layer (ETL)

The organic electroluminescent device according to the present invention may further comprise an electron transport layer (ETL).

According to one embodiment of the organic electroluminescent device, the electron transport layer (ETL) is arranged in direct contact with the n-type charge generation layer (n-CGL). According to one embodiment of the organic electroluminescent device, wherein the electron transport layer comprises an electron transport matrix material.

The electron transport matrix material may be selected from the group comprising azine compound, preferably a pyridine, pyrimidine or triazine compound, and most preferably a triazine compound.

The electron transport matrix material may be selected from the group comprising 2-([1,1'-biphenyl]-4-yl)-4-(9,9-diphenyl-9H-fluoren-4-yl)-6-phenyl-1,3,5-triazine, 2-(3-(2,6-dimethylpyridin-3-yl)-5-(phenanthren-9-yl)phenyl)-4,6-diphenyl-1,3,5-triazine, 3'-(4-phenyl-6-(spiro[fluorene-9,9'-xanthen]-2'-yl)-1,3,5-triazin-2-yl)-[1,1'-biphenyl]-4-carbonitrile, and 4'-(4-(4-(4,6-diphenyl-1,3,5-triazin-2-yl)phenyl)naphthalen-1-yl)-[1,1'-biphenyl]-4-carbonitrile.

According to one embodiment of the organic electroluminescent device, wherein the electron transport layer comprises an electron transport matrix material and dopant, preferably a metal organic dopant.

According to one embodiment of the organic electroluminescent device, wherein the electron transport layer is arranged closer to the anode than the n-type charge generation layer.

According to another embodiment of the present invention, the electron transport layer may further comprise an azine compound, preferably a pyridine, pyrimidine or triazine compound, and most preferably a triazine compound.

In one embodiment, the electron transport layer may further comprise a dopant selected from an alkali organic complex, preferably LiQ.

The thickness of the ETL may be in the range from about 15 nm to about 50 nm, for example, in the range from about 20 nm to about 40 nm. When the thickness of the EIL is within this range, the ETL may have satisfactory electron-injecting properties, without a substantial penalty in driving voltage.

According to another embodiment of the present invention, the organic electroluminescent device may further comprise a hole blocking layer and an electron transport layer, wherein the hole blocking layer and the electron transport layer comprise an azine compound. Preferably, the azine compound is a pyridine, pyrimidine or triazine compound, and most preferably the azine compound is a triazine compound.

Electron Injection Layer (EIL)

An optional EIL, which may facilitates injection of electrons from the cathode, may be formed on the ETL, preferably directly on the electron transport layer. Examples of materials for forming the EIL include lithium 8-hydroxyquinolinolate (LiQ), LiF, NaCl, CsF, Li2O, BaO, Ca, Ba, Yb, Mg which are known in the art. Deposition and coating conditions for forming the EIL are similar to those for formation of the HIL, although the deposition and coating conditions may vary, according to the material that is used to form the EIL.

The thickness of the EIL may be in the range from about 0.1 nm to about 10 nm, for example, in the range from about 0.5 nm to about 9 nm. When the thickness of the EIL is within this range, the EIL may have satisfactory electron-injecting properties, without a substantial penalty in driving voltage.

Charge Generation Layer

The organic electroluminescent device according to the present invention may further comprise a charge generation layer, wherein the organic semiconductor layer of the present invention is a p-type charge generation layer (p-CGL), wherein the p-type charge generation layer is arranged closer to the cathode layer.

The charge generation layer may further comprise a n-type charge generation layer (n-CGL), wherein the n-type charge generation layer is arranged between the p-type charge generation layer and the anode layer.

Preferably, the n-type charge generation layer and the p-type charge generation layer are arranged in direct contact.

The n-type charge generation layer (n-CGL) may comprises a metal dopant or a metal dopant and a host material. The n-type charge generation layer (n-CGL) comprises preferably a metal dopant and a host material.

According to one embodiment of the present invention, the host material is a compound that comprises at least one $C_2$ to $C_{24}$ N-heteroaryl or P═X group, with X being O, P, Se, with P═O especially preferred.

According to one embodiment of the organic electroluminescent device, wherein the host material of the n-CGL is used as a matrix material so that the metal dopant is embedded in this matrix martial. According to one embodiment of the organic electroluminescent device, wherein the host material of the n-CGL is used as a matrix material so that the metal dopant is embedded in this matrix martial and wherein this matrix material is an electron transport matrix material.

According to one embodiment of the organic electroluminescent device, wherein the host material of the n-CGL is used as a matrix martial so that the metal dopant is embedded in this matrix material, and wherein the host material is an electron transport matrix material.

According to one embodiment of the organic electroluminescent device, wherein the host material of the n-CGL is used as a matrix material so that the metal dopant is embedded in this matrix material, and wherein the host material is an electron transport matrix material, and wherein the host material of the n-CGL that is an electron transport matrix material and the electron transport matrix material of the electron transport layer are the same.

According to one embodiment of the organic electroluminescent device, wherein the organic electroluminescent device comprises at least two n-CGLs and at least two electron transport layers, wherein the host material of the two n-CGLs are used as a matrix material so that the metal dopant is embedded in this matrix material, and wherein the host material is an electron transport matrix material, and wherein the host material of the two n-CGLs that is an electron transport matrix material and the electron transport matrix material of the two electron transport layers are the same. According to one embodiment of the organic electroluminescent device, wherein the organic electroluminescent device comprises at least three n-CGLs and at least three electron transport layers, wherein the host material of the three n-CGLs are used as a matrix material so that the metal dopant is embedded in this matrix material, and wherein the host material is an electron transport matrix material, and wherein the host material of the three n-CGLs that is an electron transport matrix material and the electron transport matrix material of the three electron transport layers are the same. According to one embodiment of the organic electroluminescent device, wherein the organic electroluminescent device comprises at least four n-CGLs and at least four electron transport layers, wherein the host material of the four n-CGLs are used as a matrix material so that the metal dopant is embedded in this matrix material, and wherein the host material is an electron transport matrix material, and wherein the host material of the four n-CGLs that is an electron transport matrix material and the electron transport matrix material of the four electron transport layers are the same.

According to an embodiment of the present invention, the at least one $C_2$ to $C_{24}$ N-heteroaryl may be selected from a compound comprising at least one azine group, preferably at least two azine groups, also preferred three azine groups.

According to an embodiment of the present invention, the host material comprises at least one group selected from the list consisting of pyridine, pyrimidine, triazine, imidazole, benzimidazole, benzooxazole, quinone, benzoquinone, imidazo[1,5-a]pyridine, quinoxaline, benzoquinoxaline, acridine, phenanthroline, benzoacridine, dibenzoacridine, phosphine oxide, terpyridine.

According to an embodiment of the present invention, the host material comprises at least one phenanthroline group, preferably two phenanthroline groups, one ore more pyridine groups, one or more pyrimidine groups, one or more triazine groups, one ore more imidazo[1,5-a]pyridine groups, or one ore more phosphine oxide groups.

According to an embodiment of the present invention, the organic electron transport matrix compound comprises at least one phenanthroline group, preferably two phenanthroline groups, one ore more pyridine groups, one or more pyrimidine groups, or one ore more phosphine oxide groups.

According to an embodiment of the present invention, the host material comprises at least one phenanthroline group, preferably two phenanthroline groups, a pyridine group, a pyrimidine groups, or a phosphine oxide group.

According to an embodiment of the present invention, the host material matrix compound comprises at least one phenanthroline group, preferably two phenanthroline groups, one ore more pyridine groups, one or more pyrimidine groups, one or more triazine groups.

According to an embodiment of the present invention, the host material is selected from the group comprising 2,2'-(1,3-Phenylene)bis[9-phenyl-1,10-phenanthroline], (3-(10-(3-(2,6-diphenylpyrimidin-4-yl)phenyl)anthracen-9-yl)phenyl) dimethylphosphine oxide, 3-(3-(9,10-diphenylanthracen-2-yl)phenyl)-1-(pyridin-2-yl)imidazo[1,5-a]pyridine, 7-(3-(1,10-phenanthrolin-2-yl)phenyl)dibenzo[c,h]acridine, 7-(3-([2,2':6',2"-terpyridin]-4'-yl)phenyl)dibenzo[c,h]acridine, 4'-(4'-(4,6-diphenyl-1,3,5-triazin-2-yl)-[1,1'-biphenyl]-4-yl)-2,2': 6',2"-terpyridine, 4'-(4-(fluoranthen-3-yl)phenyl)-2,2': 6',2"-terpyridine, or 3-(9,10-di-2-naphthalenyl-2-anthracenyl)phenyl]dimethylphosphine oxide.

According to an embodiment of the present invention, the host material comprises at least one phenanthroline group, preferably two phenanthroline groups.

According to one embodiment the electron transport material of the ETL is not the same as the n-CGL matrix material.

According to one embodiment of the organic electroluminescent device, wherein the n-type charge generation layer comprises a metal dopant, preferably the metal dopant is selected from a metal with an electronegativity of ≤1.4 eV by Pauling scale or a metal alloy comprising a metal with an electronegativity of ≤1.4 eV by Pauling scale. According to one embodiment of the present invention, the metal dopant is selected from a metal with an electronegativity of ≤1.35 eV by Pauling scale or a metal alloy comprising a metal with an electronegativity of ≤1.35 eV by Pauling scale. Further preferred the metal dopant is a metal selected from the group comprising Li, Na, K, Rb, Cs, Mg, Ca, Sr, Ba, Sm, Eu an Yb or a metal alloy comprising a metal selected from the group consisting of Li, Na, K, Rb, Cs, Mg, Ca, Sr, Ba, Sm, Eu and Yb.

According to one embodiment of the present invention, the metal dopant is a metal selected from the group consisting of Li, Na, K, Cs, Mg, Ca, Ba, Sm, Eu and Yb or a metal alloy comprising a metal selected from the group consisting of Li, Na, K, Cs, Mg, Ca, Ba, Sm, Eu and Yb.

According to one embodiment of the present invention, the metal dopant is a metal selected from the group consisting of Li, Mg and Yb or a metal alloy comprising a metal selected from the group consisting of Li, Mg and Yb.

According to one embodiment of the present invention, the metal dopant is a metal selected from the group consisting of Li and Yb or metal alloy comprising a metal selected from the group consisting of Li, and Yb.

According to one embodiment of the present invention, the metal dopant is Yb or a metal alloy comprising a metal selected from the group consisting of Li and Yb.

According to one embodiment of the present invention, the metal dopant is Yb.

The thickness of the n-CGL may be in the range from about 0.5 nm to about 15 nm, for example, in the range from about 1 nm to about 10 nm. When the thickness of the n-CGL is within this range, the EIL may have satisfactory electron-injecting properties, without a substantial penalty in driving voltage.

The n-CGL also named n-type charge generation layer may comprise a metal dopant, wherein the metal dopant is selected from an alkali metal, alkaline earth metal or rare earth metal.

The n-CGL may comprise an azine compound. According to a preferred embodiment, the n-CGL may comprise an azine compound and a metal dopant, wherein the metal dopant is selected from an alkali metal, alkaline earth metal or rare earth metal.

According to one embodiment of the present invention, the metal dopant is present in the n-type charge generation layer in an amount of ≤99.9 wt. % based on the total weight of the organic semiconductor layer, preferably ≤99 wt. %, more preferably ≤95 wt. %, more preferably ≤90 wt. %, more preferably ≤80 wt. %, more preferably ≤70 wt. %, more preferably ≤60 wt. %, more preferably ≤50 wt. %, more preferably ≤40 wt. %, more preferably ≤30 wt. %, more preferably ≤20 wt. %, more preferably ≤10 wt.-%, more preferably ≤5 wt.-%, more preferably ≤3.0 wt.-%, more preferably ≤2.75 wt.-%, more preferably ≤2.5 wt.-%, more preferably ≤2.25 wt.-%, and most preferably ≤2.0 wt.-%.

According to one embodiment of the present invention, the organic electron transport material is present in the n-type charge generation layer in an amount of ≥0.1 wt. % based on the total weight of the organic semiconductor layer, preferably ≥1 wt. %, more preferably ≥5 wt. %, more preferably ≥10 wt. %, more preferably ≥20 wt. %, more preferably ≥30 wt. %, more preferably ≥40 wt. %, more preferably ≥50 wt. %, more preferably ≥60 wt. %, more preferably ≥70 wt. %, more preferably ≥80 wt. %, more preferably ≥90 wt. %, more preferably ≥95 wt. %, more preferably ≥97.0 wt. %, more preferably ≥97.25 wt. %, more preferably ≥97.5 wt. %, more preferably ≥97.75 wt. % and most preferably ≥98.0 wt. %.

According to one embodiment of the organic electroluminescent device, wherein the p-type charge generation layer comprises an organic hole transport material and a compound of Formula (I), preferably the p-type charge generation layer and the hole injection layer comprise a compound of Formula (I), further preferred the compound of Formula (I) of the p-type charge generation layer and the hole injection layer are identical.

The p-type charge generation layer (p-CGL) and the n-type charge generation layer (n-CGL) are arranged in direct contact.

The p-type charge generation layer comprises an organic hole transport material and a compound of Formula (I).

According to one embodiment of the organic electroluminescent device, wherein the organic hole transport material, also named hole transport material, is used as a matrix material so that the p-dopant is embedded in the organic hole transport material.

According to one embodiment of the organic electroluminescent device, wherein the hole transport layer (HTL) is in direct contact to the p-CGL. According to one embodiment of the organic electroluminescent device, wherein the hole transport layer (HTL) is in direct contact to the p-CGL and the hole injection layer is arranged in direct contact to the anode layer, wherein the hole injection layer is doped.

According to one embodiment of the present invention, the compound of Formula (I) is present in the p-type charge generation layer in an amount of ≤99.9 wt. % based on the total weight of the organic semiconductor layer, preferably ≤99 wt. %, more preferably ≤95 wt. %, more preferably ≤90 wt. %, more preferably ≤80 wt. %, more preferably ≤70 wt. %, more preferably ≤60 wt. %, more preferably ≤50 wt. %, more preferably ≤40 wt. %, more preferably ≤30 wt. %, more preferably ≤20 wt. %, more preferably ≤10 wt.-%, more preferably ≤5 wt.-%, more preferably ≤3.0 wt.-%, more preferably ≤2.75 wt.-%, more preferably ≤2.5 wt.-%, more preferably ≤2.25 wt.-%, and most preferably ≤2.0 wt.-%.

According to one embodiment of the present invention, the organic hole transport material is present in the p-type charge generation in an amount of ≥0.1 wt. % based on the total weight of the organic semiconductor layer, preferably ≥1 wt. %, more preferably ≥5 wt. %, more preferably ≥10 wt. %, more preferably ≥20 wt. %, more preferably ≥30 wt. %, more preferably ≥40 wt. %, more preferably ≥50 wt. %, more preferably ≥60 wt. %, more preferably ≥70 wt. %, more preferably ≥80 wt. %, more preferably ≥90 wt. %, more preferably ≥95 wt. %, more preferably ≥97.0 wt. %, more preferably ≥97.25 wt. %, more preferably ≥97.5 wt. %, more preferably ≥97.75 wt. % and most preferably ≥98.0 wt. %.

According to one embodiment of the organic electroluminescent device, wherein the p-CGL may be preferably not doped.

The p-type charge generation layer may comprise the compound of Formula (I) in an amount of ≤99.9 wt.-%, preferably ≤99 wt.-%, more preferably ≤95 wt.-%, more preferably ≤90 wt.-%, more preferably ≤80 wt.-%, more preferably ≤70 wt.-%, more preferably ≤60 wt.-%, more preferably ≤50 wt.-%, more preferably ≤40 wt.-%, more preferably ≤30 wt.-%, more preferably ≤20 wt.-%, more preferably ≤10 wt.-%, more preferably ≤5 wt.-%, more preferably ≤3.0 wt.-%, more preferably ≤2.75 wt.-%, more preferably ≤2.5 wt.-%, more preferably ≥2.25 wt.-%, and most preferably ≤2.0 wt.-%, based on the total weight of the p-type charge generation layer.

The p-type charge generation layer may comprise the compound of Formula (I) in an amount of ≤99.9 wt.-%, preferably ≤99 wt.-%, more preferably ≤95 wt.-%, more preferably ≤90 wt.-%, more preferably ≤80 wt.-%, more preferably ≤70 wt.-%, more preferably ≤60 wt.-%, more preferably ≤50 wt.-%, more preferably ≤40 wt.-%, more preferably ≤30 wt.-%, more preferably ≤20 wt.-%, more preferably ≤10 wt.-%, more preferably ≤5 wt.-%, more preferably ≤3.0 wt.-%, more preferably ≤2.75 wt.-%, more preferably ≤2.5 wt.-%, more preferably ≥2.25 wt.-%, and most preferably ≤2.0 wt.-%, based on the total weight of the p-type charge generation layer, and the organic semiconductor layer comprises a compound of Formula (I) in an amount of ≤99.9 wt.-%, preferably ≤99 wt.-%, more preferably ≤95 wt.-%, more preferably ≤90 wt.-%, more preferably ≤80 wt.-%, more preferably ≤70 wt.-%, more preferably ≤60 wt.-%, more preferably ≤50 wt.-%, more preferably ≤40 wt.-%, more preferably ≤30 wt.-%, more preferably ≤20 wt.-%, more preferably ≤10 wt.-%, more preferably ≤5 wt.-%, more preferably ≤3.0 wt.-%, more preferably ≤2.75 wt.-%, more preferably ≤2.5 wt.-%, more preferably ≤2.25 wt.-%, and most preferably ≤2.0 wt.-% based on the total weight of the organic semiconductor layer, wherein the organic semiconductor layer is preferably a hole injection layer.

According to one embodiment of the organic electroluminescent device, wherein the p-type charge generation layer and the hole injection layer comprise an identical covalent matrix compound.

Cathode Layer

The cathode layer is formed on the ETL or optional EIL. The cathode layer may be formed of a metal, an alloy, an electrically conductive compound, or a mixture thereof. The cathode electrode may have a low work function. For example, the cathode layer may be formed of lithium (Li), magnesium (Mg), aluminum (Al), aluminum (Al)-lithium (Li), calcium (Ca), barium (Ba), ytterbium (Yb), magnesium (Mg)-indium (In), magnesium (Mg)-silver (Ag), or the like. Alternatively, the cathode electrode may be formed of a transparent conductive oxide, such as ITO or IZO.

The thickness of the cathode layer may be in the range from about 5 nm to about 1000 nm, for example, in the range from about 10 nm to about 100 nm. When the thickness of the cathode layer is in the range from about 5 nm to about 50 nm, the cathode layer may be transparent or semitransparent even if formed from a metal or metal alloy.

It is to be understood that the cathode layer is not part of an electron injection layer or the electron transport layer.

Method of Manufacturing

According to another aspect of the present invention, there is provided a method of manufacturing an organic electroluminescent device, the method using:

at least one deposition source, preferably two deposition sources and more preferred at least three deposition sources.

The methods for deposition that can be suitable comprise:

deposition via vacuum thermal evaporation;

deposition via solution processing, preferably the processing is selected from spin-coating, printing, casting; and/or slot-die coating.

According to various embodiments of the present invention, there is provided a method using:

a first deposition source to release the compound of Formula (I) according to the invention, and a second deposition source to release the substantially covalent matrix compound;

the method comprising the steps of forming the hole injection layer; whereby for an organic light-emitting diode (OLED):

the hole injection layer is formed by releasing the compound of Formula (I) according to the invention from the first deposition source and the substantially covalent matrix compound from the second deposition source.

According to various embodiments of the present invention, the method may further include forming on the anode layer, at least one layer selected from the group consisting of forming a hole transport layer or forming a hole blocking layer, and an emission layer between the anode layer and the first electron transport layer.

According to various embodiments of the present invention, the method may further include the steps for forming an organic light-emitting diode (OLED), wherein on a substrate an anode layer is formed, on the anode layer a hole injection layer comprising a compound of Formula (I) is formed, on the hole injection layer comprising a compound of Formula (I) a hole transport layer is formed, on the hole transport layer an emission layer is formed, on the emission layer an electron transport layer is formed, optionally a hole blocking layer is formed on the emission layer, and finally a cathode layer is formed, optional a hole blocking layer is formed in that order between the first anode layer and the emission layer, optional an electron injection layer is formed between the electron transport layer and the cathode layer.

According to various embodiments, the OLED may have the following layer structure, wherein the layers having the following order:

anode layer, hole injection layer comprising a compound of Formula (I) according to the invention, first hole transport layer, second hole transport layer, emission layer, optional hole blocking layer, electron transport layer, optional electron injection layer, and cathode layer.

According to another aspect of the invention, it is provided an electronic device comprising at least one organic light emitting device according to any embodiment described throughout this application, preferably, the electronic device comprises the organic light emitting diode in one of embodiments described throughout this application. More preferably, the electronic device is a display device.

Hereinafter, the embodiments are illustrated in more detail with reference to examples. However, the present disclosure is not limited to the following examples. Reference will now be made in detail to the exemplary aspects.

DESCRIPTION OF THE DRAWINGS

The aforementioned components, as well as the claimed components and the components to be used in accordance with the invention in the described embodiments, are not subject to any special exceptions with respect to their size, shape, material selection and technical concept such that the selection criteria known in the pertinent field can be applied without limitations.

Additional details, characteristics and advantages of the object of the invention are disclosed in the dependent claims and the following description of the respective figures which in an exemplary fashion show preferred embodiments according to the invention. Any embodiment does not necessarily represent the full scope of the invention, however, and reference is made therefore to the claims and herein for interpreting the scope of the invention. It is to be understood that both the foregoing general description and the following detailed description are exemplary and explanatory only and are intended to provide further explanation of the present invention as claimed.

Hereinafter, the figures are illustrated in more detail with reference to examples. However, the present disclosure is not limited to the following figures.

Herein, when a first element is referred to as being formed or disposed "on" or "onto" a second element, the first element can be disposed directly on the second element, or one or more other elements may be disposed there between. When a first element is referred to as being formed or disposed "directly on" or "directly onto" a second element, no other elements are disposed there between.

Figure 1:
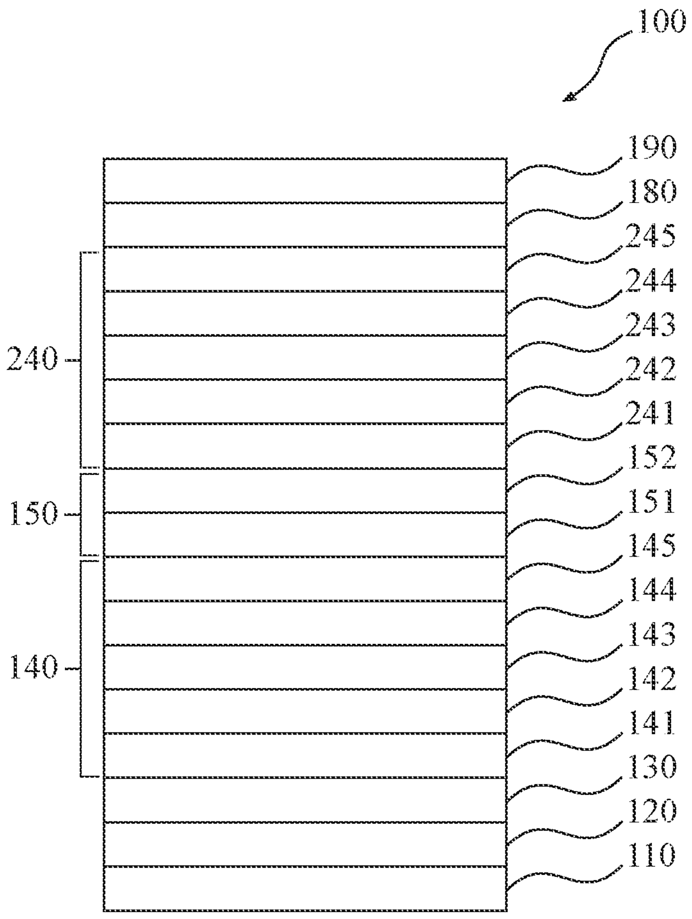
FIG. 1 is a schematic sectional view of an organic electroluminescent device according to an exemplary embodiment of the present invention.

FIG. 1 is a schematic sectional view of an organic electroluminescent device 100, according to one exemplary embodiment of the present invention.

Referring to FIG. 1 the organic electroluminescent device 100 includes a substrate 110, an anode layer 120, a hole injection layer (HIL) 130 comprising the compound of Formula (IId), and a first light-emitting unit 140, comprising a first hole transport layer (HTL1) 141, a first electron blocking layer (EBL1) 142, a first emission layer (EML1) 143, a first hole blocking layer (HBL1) 144, and a first electron transport layer (ETL1) 145. The organic electroluminescent device 100 further comprising a first charge generation layer (CGL1) 150 comprising a first n-type charge generation layer (n-CGL1) 151 and a first p-type charge generation layer (p-GCL1) 152, wherein the first p-type charge generation layer (p-CGL1) 152 comprises the compound of Formula (IId) and an organic hole transport material. The organic electroluminescent device 100 further comprising, a second light-emitting unit 240, comprising a second hole transport layer (HTL2) 241, a second electron blocking layer (EBL2) 242, a second emission layer (EML2) 243, a second hole blocking layer (HBL2) 244, and a second electron transport layer (ETL2) 245. The organic electroluminescent device 100 further comprising and electron injection layer (EIL) 180, a cathode layer (CAT) 190.

Figure 2:
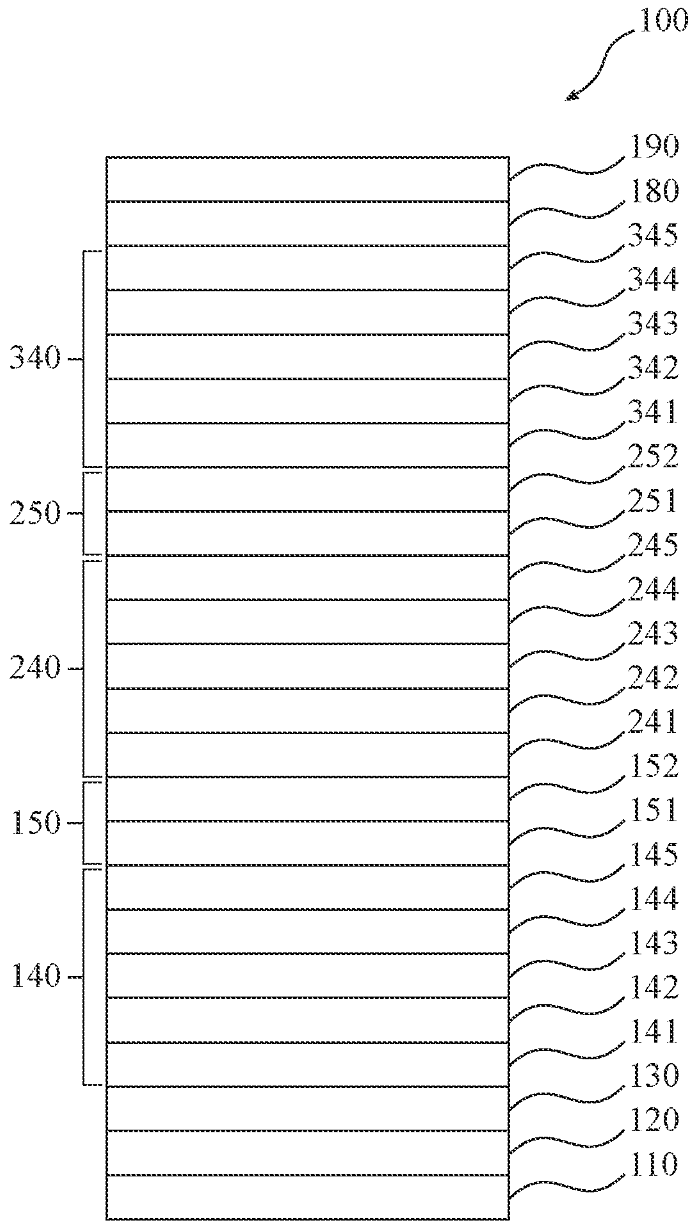
FIG. 2 is a schematic sectional view of a stacked organic electroluminescent device according to another exemplary embodiment of the present invention.

FIG. 2 is a schematic sectional view of a stacked organic electroluminescent device 100, according to another exemplary embodiment of the present invention. FIG. 2 differs from FIG. 1 in that the organic electroluminescent device 100 of FIG. 1 further comprises a second charge generation layer (CGL2) 250 disposed on the second light-emitting unit 240, comprising a second n-type charge generation layer (n-CGL2) 251 and a second p-type charge generation layer (p-GCL2) 252, wherein the second p-type charge generation layer (p-CGL2) 252 may optionally also comprise the compound of Formula (IId) and an organic hole transport material. Wherein the organic electroluminescent device 100 of FIG. 2 further differs from FIG. 1 in that it further comprises a third light-emitting unit 340 disposed on the second charge generation layer (CGL2) 250, comprising a third hole transport layer (HTL3) 341, a third electron blocking layer (EBL3) 342, a third emission layer (EML3) 343, a third hole blocking layer (HBL3) 344, and a third electron transport layer (ETL3) 345.

Figure 3:
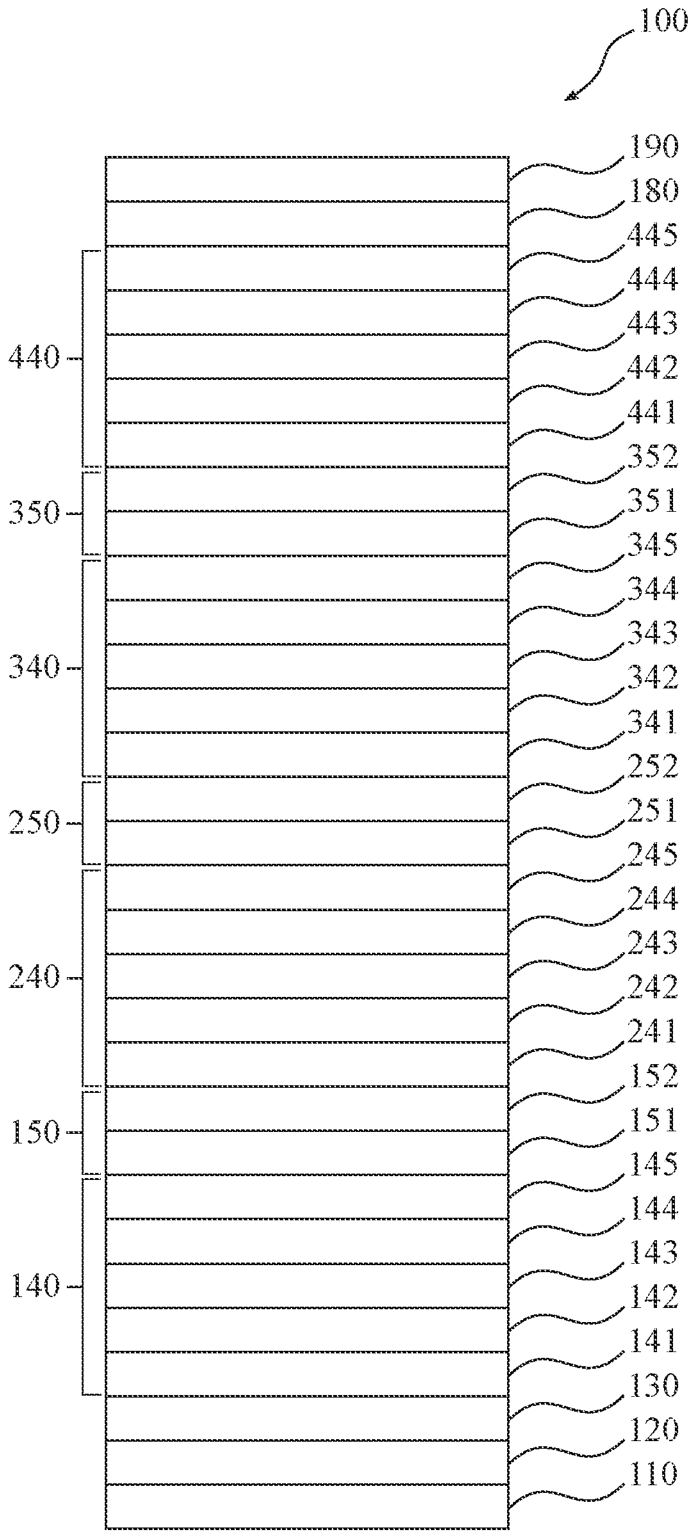
FIG. 3 is a schematic sectional view of a stacked organic electroluminescent device according to another exemplary embodiment of the present invention.

FIG. 3 is a schematic sectional view of a stacked organic electroluminescent device 100, according to another exemplary embodiment of the present invention. FIG. 3 differs from FIG. 2 in that the organic electroluminescent device 100 of FIG. 2 further comprises a third charge generation layer (CGL3) 350 disposed on the third light-emitting unit 340, comprising a third n-type charge generation layer (n-CGL3) 351 and a third p-type charge generation layer (p-GCL3) 352, wherein the third p-type charge generation layer (p-CGL3) 352 may optionally also comprise the compound of Formula (IId) and an organic hole transport material. Wherein the organic electroluminescent device 100 of FIG. 3 further differs from FIG. 2 in that it further comprises a fourth light-emitting unit 440 disposed on the third charge generation layer (CGL3) 350, comprising a fourth hole transport layer (HTL4) 441, a fourth electron blocking layer (EBL4) 442, a fourth emission layer (EML4) 443, a fourth hole blocking layer (HBL4) 444, and a fourth electron transport layer (ETL4) 445.

While not shown in FIGS. 1, 2, and 3 a capping and/or a sealing layer may further be formed on the cathode layer

190, in order to seal the organic electroluminescent device 100. In addition, various other modifications may be applied thereto.

Hereinafter, one or more exemplary embodiments of the present invention will be described in detail with, reference to the following examples. However, these examples are not intended to limit the purpose and scope of the one or more exemplary embodiments of the present invention.

DETAILED DESCRIPTION

The invention is furthermore illustrated by the following examples which are illustrative only and non-binding.

Compounds of Formula (I) is represented by Formula (IId):

(IId)

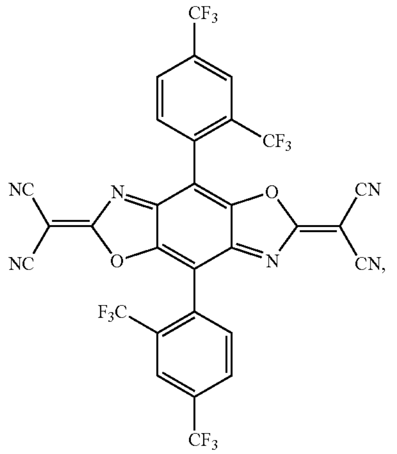

Formula (IId) may be prepared as for example described by Tlach et al. in Journal of Organic Chemistry 2011, 76, 8670. For example according to the synthesis of compound B13 as described below.

Synthesis of (IId):

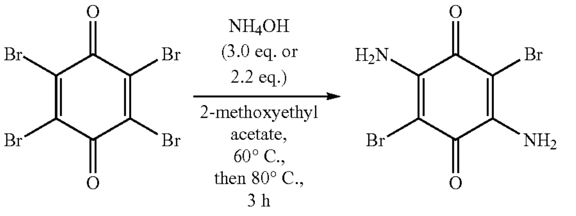 [SMILES: O=C1C(Br)=C(Br)C(=O)C(Br)=C1Br ; NC1=C(Br)C(=O)C(N)=C(Br)C1=O]

Step 1: 3,6-Diamino-2,5-dibromo-1,4-benzoquinone (IM-1)

A 500 mL, three-neck round-bottom flask was equipped with an addition funnel and mechanical stirrer and charged with 42.9 g (100 mmol) of p-bromanil and 170 mL of 2-methoxyethyl acetate. The slurry was vigorously stirred while heating to 60° C. The mixture was removed from the heat source and the addition funnel charged with 43.3 mL (300 mmol) of 27% $NH_4OH$ and added dropwise over 25 min (the reaction exothermed to over 100° C. during the addition). The reaction mixture was allowed to cool to approximately 80° C., stirred at this temperature for 3 h, and allowed to cool to room temperature overnight. The dark red mixture was filtered and the collected precipitate washed with large portions of distilled water. The collected solid was placed in a flask containing acetone, stirred, and refiltered. The precipitate was then washed with acetone and dried in vacuo to yield. Because of the limited solubility of this compound it was used without further purification or analysis.

Brick-Red Powder

Yield 27.9 g, 94%.

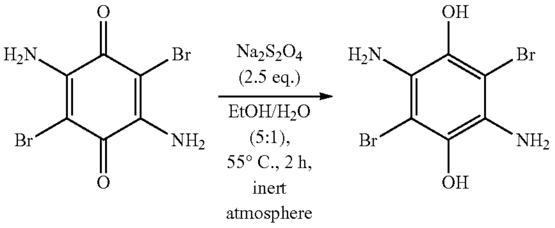 [SMILES: NC1=C(Br)C(=O)C(N)=C(Br)C1=O ; Nc1c(O)c(Br)c(N)c(O)c1Br]

Step 2: 3,6-Diamino-2,5-dibromo-1,4-hydroquinone (IM-2)

All solvents were thoroughly degassed prior to use

A 100 mL round-bottom flask equipped with a large stir bar was charged with 3.26 g (11.0 mmol) of 3,6-diamino-2,5-dibromo-1,4-benzoquinone (3), 33 mL of ethanol, and 7 mL of distilled water. The flask was fitted with an addition funnel and heated to 55° C. with stirring under argon atmosphere. The addition funnel was charged with 4.78 g (27.5 mmol) of $Na_2S_2O_4$ dissolved in 50 mL of distilled water, the solution added dropwise, and the mixture stirred for 1 h. The mixture was allowed to cool to room temperature and the precipitate filtered and washed with distilled water and cold ethanol. The resulting solid was dried in vacuo to yield. Because of the insolubility and air sensitivity of this compound it was used immediately without further purification or analysis.

Tan powder,

Yield 3.07 g, 94%.

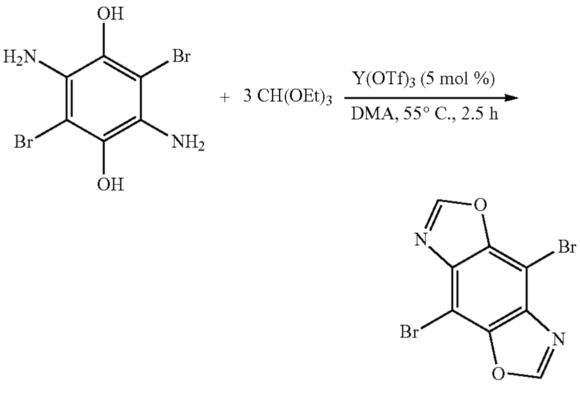

Step 3: Preparation of 4,8-Dibromobenzobisoxazole (IM-3)

A dry round-bottom flask was placed under an argon atmosphere and charged with 1.37 g (2.55 mmol; 5 mol %) of $Y(OTf)_3$, and 52 mL of DMA, and 22.7 mL (3 eq., 153.1 mmol) of triethylorthoformate. The mixture was warmed to 55° C., and 15.2 g (51 mmol) of 3,6-diamino-2,5-dibromo-1,4-hydroquinone was added portion wise over 30 min and stirred at 55° C. for 2 h. The mixture was allow to cool room temperature and diluted with water. The resulting precipitate was collected by filtration and washed with distilled water and cold ethanol.

Purified by Recrystallization from 800 mL Acetic Acid to Yield White Needles,

Yield 12.9 g, 80% yield (HPLC 90.3%)

mp>260° C.; $^{1}$H NMR (400 MHz, DMSO-d6) δ 9.05 (2H, s); $^{13}$C NMR (100 MHz, DMSO-d6) δ 92.4, 137.7, 145.7, 156.3.

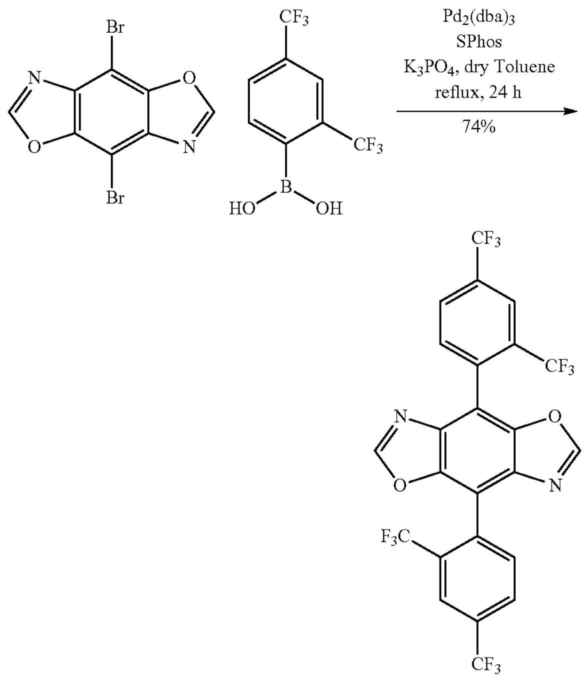

Step 4: 4,8-bis(2,4-bis(trifluoromethyl)phenyl)benzo(1,2-d:4,5-d']bis(oxazole) (IM-4)

In a 500 ml 3-neck round bottom flask the dibromide (5.00 g, 15.73 mmol), boronic acid (16.23 g, 4eq, 62.91 mmol) and potassium phosphate (53.41 g, 16eq, 252 mmol) were suspended in 300 mL dry degassed toluene under inert gas atmosphere. Subsequently, the $Pd_2dba_3$ (0.72 g, 0.05eq, 0.786 mmol) and SPhos (1.29 g, 0.2eq, 3.15eq) were added to the mixture and the red mixture was stirred under reflux for 24 hours. After cooling down to room temperature, the base was filtered off, washed with toluene and the filtrate was concentrated. The hot toluene solution was then filtrated over 20 mm Flurosil and 20 mm Silica, which was subsequently washed with hot Chloroform. After removing the solvents and drying in vacuo, the product was obtained as a white solid Yield: 6.8 g (74%, 11.64 mmol, HPLC 97.3%)

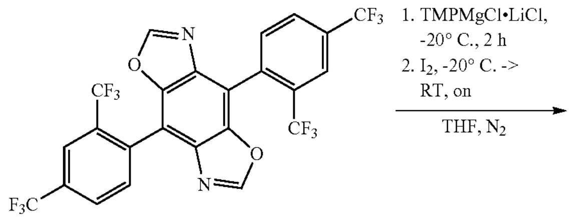

-continued

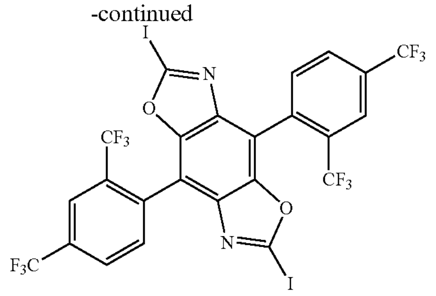

Step 5: 4,8-bis(2,4-bis(trifluoromethyl)phenyl)-2,6-diiodo-benzo[1,2-d:4,5-d']bis(oxazole) (IM-5)

To a solution of intermediate 4 (3 g, 5.13 mmol, 1.0 eq) in THF (60 mL) was added a 1M solution of TMPMgCl·LiCl in THF/Toluene (20.5 mL, 20.5 mmol, 4.0 eq) at −25° C. under inert gas atmosphere. After stirring the reaction for 2 h at −20° C., Iodine (15.62 g, 61.6 mmol, 12 eq) was dissolved in THF (40 mL) and added to the reaction via syringe. The cooling bath was removed after 30 min and the reaction was stirred at room temperature overnight. A solution of $Na_2S_2O_3$ in $H_2O$ (50 mL) was added and the reaction was stirred additional 5 minutes. An aqueous solution of $NH_4Cl$ (50 mL) and ethyl acetate (50 mL) were added, the phases were separated and the aqueous phase was reextracted with ethyl acetate (50 mL). The combined organic phase were washed with brine (2×50 mL), dried over $Na_2SO_4$, and concentrated to dryness to yield a brown solid. The brown solid was stirred in 10 mL ACN at 0° C., the solid was filtrated and washed with small amounts of cold ACN to yield a beige solid (3.72 g). The beige solid was purified by column chromatography (nHex:EA 39:1→1:1; Rf (nHex/EA 9:1): 0.20) to obtain a light yellow solid (2.09 g, yield: 49%, HPLC 96.9%).

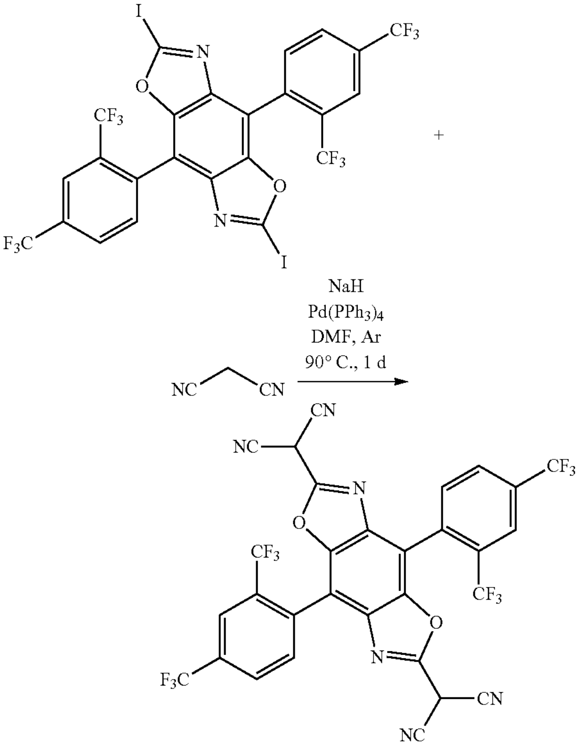

Step 6: 2,2'-(4,8-bis(2,4-bis(trifluoromethyl)phenyl)benzo[1,2-d:4,5-d']bis(oxazole)-2,6-diyl)dimalononitrile (IM-6)

To a suspension of NaH (368 mg, 6.5 eq, 15.3 mmol) in anh. DMF (20 mL) a solution of malononitrile was added (934 mg, 6 eq, 14.1 mmol) in anh. DMF (20 mL) at 0° C. under inert gas atmosphere. The reaction mixture was stirred at 0° C. for 10 min, then at room temperature for 20 min. Intermediate 5 (1.97 g, 1 eq, 2.36 mmol) and $Pd(PPh_3)_4$ (545 mg, 0.2 eq, 470 mol) were added as solids and the reaction mixture was heated to 90° C. for 1 d. The reaction mixture was then cooled to 0° C., followed by the addition of 10 mL water. By addition of 4M HCl (approx. 40 mL), pH was adjusted to ≤1 and a beige solid precipitated. The mixture was filtered and washed with water (150 mL) to yield a brown solid. The brown solid was dried in vacuo to remove water completely, then stirred in 5 mL of DCM at 0° C. The solid was filtrated and washed with small amounts of cold DCM to yield a light grey solid (900 mg, 54%, HPLC 96.4%).

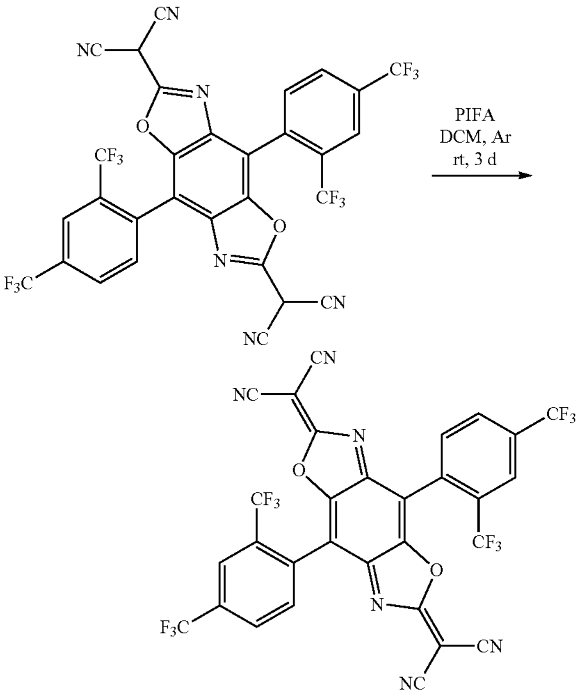

Step 7: 2,2'-(4,8-bis(2,4-bis(trifluoromethyl)phenyl)benzo(1,2-d:4,5-d']bis(oxazole)-2,6-diylidene)dimalononitrile (B13)

To a suspension of Intermediate 6 (500 mg, 700 mol, 1 eq) in anhydrous DCM (60 mL) PIFA (317 mg, 740 μmol, 1.1 eq) was added as a solid at 0° C. under inert gas atmosphere. The mixture was stirred at rt for 3 d, then the purple reaction mixture was concentrated to about 10 mL. nHex (90 mL) was added and the mixture was filtered. The obtained solid was washed with DCM/nHex 1:2 (40 mL) to yield the final product as a purple solid (320 mg, 64%).

Calculated HOMO and LUMO

The HOMO and LUMO are calculated with the program package TURBOMOLE V6.5 (TURBOMOLE GmbH, Litzenhardtstrasse 19, 76135 Karlsruhe, Germany). The optimized geometries and the HOMO and LUMO energy levels of the molecular structures are determined by applying the hybrid functional B3LYP with a 6-31G* basis set in the gas phase. If more than one conformation is viable, the conformation with the lowest total energy is selected.

Melting Point

The melting point (Tm) is determined as peak temperatures from the DSC curves of the above TGA-DSC measurement or from separate DSC measurements (Mettler Toledo DSC822e, heating of samples from room temperature to completeness of melting with heating rate 10 K/min under a stream of pure nitrogen. Sample amounts of 4 to 6 mg are placed in a 40 μL Mettler Toledo aluminum pan with lid, a <1 mm hole is pierced into the lid).

Glass Transition Temperature

The glass transition temperature (Tg) is measured under nitrogen and using a heating rate of 10 K per min in a Mettler Toledo DSC 822e differential scanning calorimeter as described in DIN EN ISO 11357, published in March 2010.

Thermogravimetric Analysis

The term "TGA5%" denotes the temperature at which 5% weight loss occurs during thermogravimetric analysis and is measured in ° C.

The TGA5% value may be determined by heating a 9-11 mg sample in a thermogravimetric analyzer at a heating rate of 10 K/min in an open 100 μL aluminum pan, under a stream of nitrogen at a flow rate of 20 mL/min in the balance area and of 30 mL/min in the oven area.

The TGA5% value may provide an indirect measure of the volatility and/or decomposition temperature of a compound. In first approximation, the higher the TGA5% value the lower is the volatility of a compound and/or the higher the decomposition temperature.

According to one embodiment, the TGA5% value of compound of Formula (I) is selected in the range of ≥280° C. and ≤420° C.; preferably of ≥290° C. and ≤410° C., also preferred of ≥295° C. and ≤410° C.

Rate Onset Temperature

The rate onset temperature (TRO) is determined by loading 100 mg compound into a VTE source. As VTE source a point source for organic materials may be used as supplied by Kurt J. Lesker Company (www.lesker.com) or CreaPhys GmbH (http://www.creaphys.com). The VTE source is heated at a constant rate of 15 K/min at a pressure of less than $10^{-5}$ mbar and the temperature inside the source measured with a thermocouple. Evaporation of the compound is detected with a QCM detector which detects deposition of the compound on the quartz crystal of the detector. The deposition rate on the quartz crystal is measured in Ångstrom per second. To determine the rate onset temperature, the deposition rate is plotted against the VTE source temperature. The rate onset is the temperature at which noticeable deposition on the QCM detector occurs. For accurate results, the VTE source is heated and cooled three time and only results from the second and third run are used to determine the rate onset temperature.

To achieve good control over the evaporation rate of an organic compound, the rate onset temperature may be in the range of 185 to 280° C. If the rate onset temperature is below 185° C. the evaporation may be too rapid and therefore difficult to control. If the rate onset temperature is above 280° C. the evaporation rate may be too low which may result in low tact time and decomposition of the organic compound in VTE source may occur due to prolonged exposure to elevated temperatures.

The rate onset temperature is an indirect measure of the volatility of a compound. The higher the rate onset temperature the lower is the volatility of a compound.

Dipole Moment

The dipole moment $|\vec{\mu}|$ of a molecule containing N atoms is given by:

$$\vec{\mu} = \sum_{i}^{N} q_i \vec{r_i}$$

$$|\vec{\mu}| = \sqrt{\mu_x^2 + \mu_y^2 + \mu_z^2}$$

where $q_i$ and $\vec{r_i}$ are the partial charge and position of atom i in the molecule. The dipole moment was obtained from the optimized geometries at the same level of theory. The geometries of the molecular structures are optimized using the hybrid functional B3LYP with the 6-31G* basis set in the gas phase (program package TURBOMOLE V6.5, TURBOMOLE GmbH, Litzenhardtstrasse 19, 76135 Karlsruhe, Germany). If more than one conformation is viable, the conformation with the lowest total energy is selected to determine the structural and electronic parameters of the molecules.

General Procedure for Fabrication of OLEDs

For Example 2-1 to 2-3 in Table VIII, a glass substrate with an anode layer comprising a first anode sub-layer of 120 nm Ag, a second anode sub-layer of 8 nm ITO and a third anode sub-layer of 10 nm ITO was cut to a size of 50 mm×50 mm×0.7 mm, ultrasonically washed with water for 60 minutes and then with isopropanol for 20 minutes. The liquid film was removed in a nitrogen stream, followed by plasma treatment, to prepare the anode layer. The plasma treatment was performed in nitrogen atmosphere or in an atmosphere comprising 98 vol. % nitrogen and 2 vol.-% oxygen.

Then, a hole injection layer (HIL) having a thickness of 10 nm is formed on the anode layer by co-depositing compound 98 wt.-% BH-2 and 2 wt.-% of ND-1 or as comparative example a hole injection layer (HIL) having a thickness of 3 nm is formed on the anode layer by depositing CNHAT alone.

Then, a first hole transport layer (HTL1) having a thickness of 27 nm is formed on the HIL by depositing BH-2.

Then, a first electron blocking layer (EBL1) having a thickness of 5 nm is formed on the HTL1 by depositing N-([1,1'-biphenyl]-4-yl)-9,9-diphenyl-N-(4-(triphenylsilyl)phenyl)-9H-fluoren-2-amine.

Then, a first emission layer (EML1) having a thickness of 20 nm is formed on the EBL1 by co-depositing 97 vol.-% H09 (Sun Fine Chemicals, Korea) as EML host and 3 vol.-% BD200 (Sun Fine Chemicals, Korea) as fluorescent blue dopant.

Then, a first electron transport layer (ETL1) having a thickness of 5 nm is formed on the first emission layer by depositing 2-(3'-(9,9-dimethyl-9H-fluoren-2-yl)-[1,1'-biphenyl]-3-yl)-4,6-diphenyl-1,3,5-triazine.

Then, the n-CGL having a thickness of 10 nm is formed on the ETL by co-depositing 99 vol. % 2,2'-(1,3-Phenylene)bis[9-phenyl-1,10-phenanthroline] and 1 vol.-% Yb.

Then, the p-CGL having a thickness of 10 nm is formed on the n-CGL by co-depositing BH-2 as a matrix compound and a compound of Formula (I). The composition of the p-CGL, HTL as well as of the light emitting unit can be seen in Table I.

Then, a second hole transport layer (HTL2) having a thickness of 24 nm is formed on the p-CGL by depositing BH-2.

Then, a second electron blocking layer (EBL2) having a thickness of 5 nm is formed on the HTL2 by depositing N-([1,1'-biphenyl]-4-yl)-9,9-diphenyl-N-(4-(triphenylsilyl)phenyl)-9H-fluoren-2-amine.

Then, a second emission layer (EML2) having a thickness of 20 nm is formed on the EBL2 by co-depositing 97 vol. % H09 (Sun Fine Chemicals, Korea) as EML host and 3 vol.-% BD200 (Sun Fine Chemicals, Korea) as fluorescent blue dopant.

Then, a hole blocking layer (HBL) having a thickness of 5 nm is formed on the EML2 by depositing 2-(3'-(9,9-dimethyl-9H-fluoren-2-yl)-[1,1'-biphenyl]-3-yl)-4,6-diphenyl-1,3,5-triazine.

Then, a second electron transport layer (ETL2) having a thickness of 30 nm is formed on the HBL by co-depositing 4'-(4-(4-(4,6-diphenyl-1,3,5-triazin-2-yl)phenyl)naphthalen-1-yl)-[1,1'-biphenyl]-4-carbonitrile and LiQ in a ratio of 50:50 wt.-%.

Then, an electron injection layer (EIL) having a thickness of 2 nm is formed on the ETL2 by depositing Yb.

Then, the cathode layer having a thickness of 13 nm is formed on the EIL by co-depositing Ag:Mg (90:10 vol.-%) at a rate of 0.01 to 1/s at $10^7$ mbar.

Then, a capping layer having a thickness of 75 nm is formed on the cathode layer by depositing compound of Formula BH-2.

The OLED stack is protected from ambient conditions by encapsulation of the device with a glass slide. Thereby, a cavity is formed, which includes a getter material for further protection.

TABLE I

| Compositions of the p-CGL, HTL and light emitting unit | | |
|---|---|---|
| AN-1 | 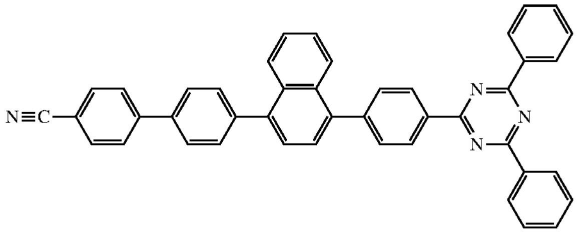 [SMILES: N#Cc1ccc(-c2ccc(-c3ccc(-c4ccc(-c5nc(-c6ccccc6)nc(-c6ccccc6)n5)cc4)c4ccccc34)cc2)cc1] | 4'-(4-(4-(4,6-diphenyl-1,3,5-triazin-2-yl)phenyl)naphthalen-1-yl)-[1,1'-biphenyl]-4-carbonitrile |

TABLE I-continued
| Compositions of the p-CGL, HTL and light emitting unit | | |
|---|---|---|
| AN-2 | 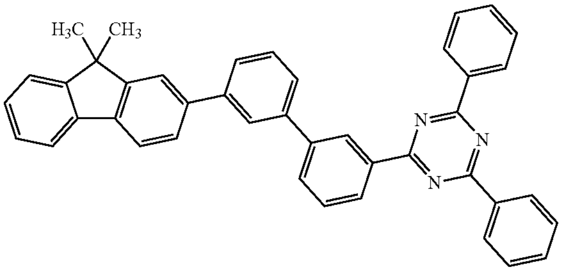 [SMILES: CC1(C)c2ccccc2-c2ccc(-c3cccc(-c4cccc(-c5nc(-c6ccccc6)nc(-c6ccccc6)n5)c4)c3)cc21] | 2-(3'-(9,9-dimethyl-9H-fluoren-2-yl)-[1,1'-biphenyl]-3-yl)-4,6-diphenyl-1,3,5-triazine |
| AN-3 | 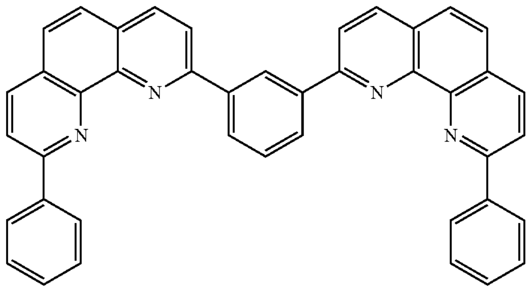 [SMILES: c1ccc(-c2ccc3ccc4ccc(-c5cccc(-c6ccc7ccc8ccc(-c9ccccc9)nc8c7n6)c5)nc4c3n2)cc1] | 2,2'-(1,3-Phenylene)bis[9-phenyl-1,10-phenanthroline] |
| BH-1 | 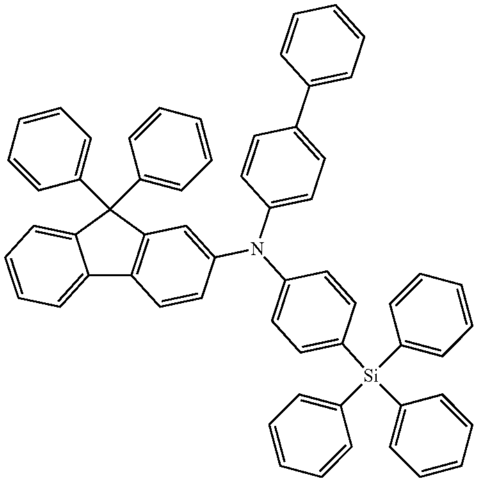 [SMILES: c1ccc(-c2ccc(N(c3ccc([Si](c4ccccc4)(c4ccccc4)c4ccccc4)cc3)c3ccc4c(c3)C(c3ccccc3)(c3ccccc3)c3ccccc3-4)cc2)cc1] | N-([1,1'-biphenyl]-4-yl)-9,9-diphenyl-N-(4-(triphenylsilyl)phenyl)-9H-fluoren-2-amine |

TABLE I-continued

| Compositions of the p-CGL, HTL and light emitting unit | | |
|---|---|---|
| BH-2 | 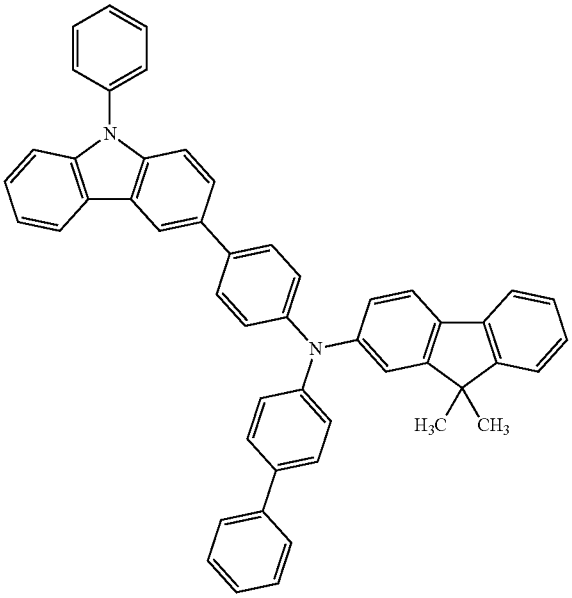 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21] | N-([1,1'-biphenyl]-4-yl)-9,9-dimethyl-N-(4-(9-phenyl-9H-carbazol-3-yl)phenyl)-9H-fluoren-2-amine |
| ND-1 | 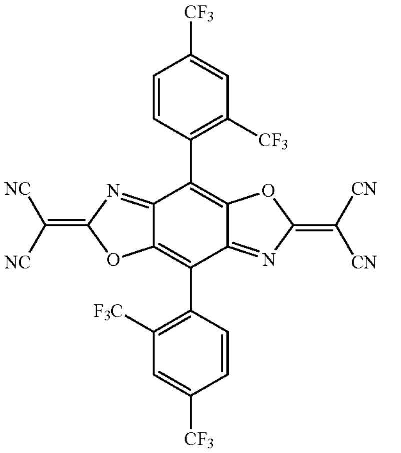 | (IId) |

To assess the performance of the inventive examples compared to the prior art, the current efficiency is measured at 20° C. The current-voltage characteristic is determined using a Keithley 2635 source measure unit, by sourcing a voltage in V and measuring the current in mA flowing through the device under test. The voltage applied to the device is varied in steps of 0.1V in the range between 0V and 10V. Likewise, the luminance-voltage characteristics and CIE coordinates are determined by measuring the luminance in cd/$m^2$ using an Instrument Systems CAS-140CT array spectrometer (calibrated by Deutsche Akkreditierungsstelle (DAkkS)) for each of the voltage values. The cd/A efficiency at 10 mA/cm2 is determined by interpolating the luminance-voltage and current-voltage characteristics, respectively.

In bottom emission devices, the emission is predominately Lambertian and quantified in percent external quantum efficiency (EQE). To determine the efficiency EQE in % the light output of the device is measured using a calibrated photodiode at 10 mA/cm2.

In top emission devices, the emission is forward directed, non-Lambertian and also highly dependent on the mirco-cavity. Therefore, the efficiency EQE will be higher compared to bottom emission devices. To determine the efficiency EQE in % the light output of the device is measured using a calibrated photodiode at 10 mA/$cm^2$.

Lifetime LT of the device is measured at ambient conditions (20° C.) and 30 mA/$cm^2$, using a Keithley 2400 sourcemeter, and recorded in hours.

The brightness of the device is measured using a calibrated photo diode. The lifetime LT is defined as the time till the brightness of the device is reduced to 97% of its initial value.

The increase in operating voltage AU is used as a measure of the operational voltage stability of the device. This increase is determined during the LT measurement and by subtracting the operating voltage after 1 hour after the start of operation of the device from the operating voltage after 50 hours.

$$\Delta U=[U50h)-U(1h)]$$

The smaller the value of ΔU the better is the operating voltage stability.

Technical Effect of the Invention

| | | B3LYP/6-31G* [eV] | Dipole moment [Debye] |
|---|---|---|---|
| CNHAT | 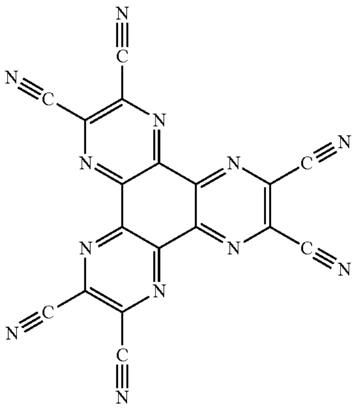 [SMILES: N#Cc1nc2c3nc(C#N)c(C#N)nc3c3nc(C#N)c(C#N)nc3c2nc1C#N] | −4.61 | 0.00 |
| Compound (IId) | 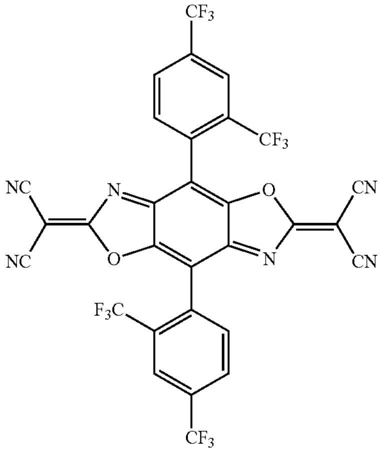 [SMILES: N#CC(C#N)=c1nc2c(-c3ccc(C(F)(F)F)cc3C(F)(F)F)c3oc(=C(C#N)C#N)nc3c(-c3ccc(C(F)(F)F)cc3C(F)(F)F)c2o1] | −5.35 | 0.06 |

Technical Effect of the Invention

| | p-HIL | p-CGL | Voltage at 15 mA/cm$^2$ relative to comparative example [%] | LT97 at 30 mA/cm$^2$ relative to comparative example [%] | Vrise (1-100 h) at 30 mA/cm$^2$ relative to comparative example [%] |
|---|---|---|---|---|---|
| Comp. Ex. | CNHAT, 3 nm | BH-2:ND-1 7 wt. % | 100.00 | 100.00 | 100.00 |

-continued

| | p-HIL | p-CGL | Voltage at 15 mA/cm$^2$ relative to comparative example [%] | LT97 at 30 mA/cm$^2$ relative to comparative example [%] | Vrise (1-100 h) at 30 mA/cm$^2$ relative to comparative example [%] |
|---|---|---|---|---|---|
| Inv. Ex. | BH-2:ND-1 2 wt. %, 10 nm | BH-2:ND-1 7 wt. % | 99.47 | 145.83 | 68.09 |

*n-CGL = AN-3:Yb 1%, 10 nm; ETL = AN-1:LiQ 50%

The inventive device exhibits approximately 99.500 of the operational voltage of the comparative device (comparative example 1). Thus, the operational voltage is much lower for the inventive device than for the comparative device (comparative example 1).

A lower operating voltage may be important for the battery life of organic electronic devices, in particular mobile devices.

The inventive device exhibits a lifetime approximately 145% higher lifetime in comparison to the comparative device (comparative example 1). Thus, the inventive device shows a much higher lifetime than the comparative device.

The inventive device (inventive examples 1 to 4) exhibits approximately 68% voltage increase over time in comparison to the comparative device (comparative example 1). Thus, the inventive device shows a much lower voltage increase over time in comparison to the comparative device.

A long lifetime and/or low voltage rise over time may result in improved long-term stability
of electronic devices.

The particular combinations of elements and features in the above detailed embodiments are exemplary only; the interchanging and substitution of these teachings with other teachings in this and the patents/applications incorporated by reference are also expressly contemplated. As those skilled in the art will recognize, variations, modifications, and other implementations of what is described herein can occur to those of ordinary skill in the art without departing from the spirit and the scope of the invention as claimed. Accordingly, the foregoing description is by way of example only and is not intended as limiting. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. The invention's scope is defined in the following claims and the equivalents thereto. Furthermore, reference signs used in the description and claims do not limit the scope of the invention as claimed.

The invention claimed is:

1. An organic electroluminescent device comprising an anode layer, a cathode layer, an organic semiconductor layer, at least one first or more charge generation layers, at least two or more light-emitting units, wherein each light-emitting unit comprises a light-emitting layer;

at least one charge generation layer comprises a p-type charge generation layer, wherein the organic semiconductor layer is arranged closer to the anode layer than the p-type charge generation layer, and wherein the organic semiconductor layer comprises an organic hole transport material and a compound of Formula (I), and the p-type charge generation layer comprises an organic hole transport material and a compound of Formula (I):

(I)

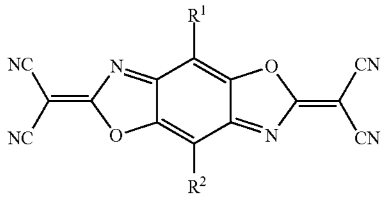

$R^1$ and $R^2$ are independently selected from the group comprising of substituted or unsubstituted phenyl, substituted or unsubstituted pyridinyl, substituted or unsubstituted pyrimidyl, substituted or unsubstituted triazinyl, wherein the one or more substituents on $R^1$ and $R^2$ are independently selected from the group comprising of partially fluorinated or perfluorinated $C_1$ to $C_6$ alkyl, $CF_3$, partially fluorinated or perfluorinated $C_1$ to $C_4$ alkoxy, $OCF_3$, partially fluorinated or perfluorinated $C_1$ to $C_4$ alkylsulfonyl, $SO_2CF_3$, F, CN, $NO_2$, $SF_5$, D and H; or $R^1$ has the Formula (IIa):

(IIa)

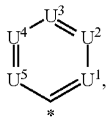

and $R^2$ has the Formula (IIb), (IIb)

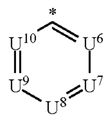

wherein $U^1$ is selected from $CQ^1$ or N; $U^2$ is selected from $CQ^2$ or N; $U^3$ is selected from $CQ^3$ or N;

$U^4$ is selected from $CQ^4$ or N; $U^5$ is selected from $CQ^5$ or N; $U^6$ is selected from $CQ^6$ or N;

$U^7$ is selected from $CQ^7$ or N; $U^8$ is selected from $CQ^8$ or N; $U^9$ is selected from $CQ^9$ or N;

$U^{10}$ is selected from $CQ^{10}$ or N; wherein $Q^1$, $Q^2$, $Q^3$, $Q^4$, $Q^5$, $Q^6$, $Q^7$, $Q^8$, $Q^9$ and $Q^{10}$ are independently selected from the group comprising of the group comprising of partially fluorinated or perfluorinated $C_1$ to $C_6$ alkyl, $CF_3$, partially fluorinated or perfluorinated $C_1$ to $C_4$ alkoxy, $OCF_3$, partially fluorinated or perfluorinated $C_1$ to $C_4$ alkylsulfonyl, $SO_2CF_3$, F, CN, $NO_2$, $SF_5$, D and H;

wherein the asterisk "*" denotes the binding position; and wherein the organic semiconductor layer and the p-type charge generation layer comprises the same compound according to Formula (I).

2. The organic electroluminescent device according to claim 1, wherein $R^1$ and $R^2$ are independently selected from the group comprising of substituted or unsubstituted phenyl, substituted or unsubstituted pyridinyl, substituted or unsubstituted pyrimidyl, substituted or unsubstituted triazinyl wherein the one or more substituents on $R^1$ or $R^2$ are independently selected from the group comprising of partially fluorinated or perfluorinated $C_1$ to $C_6$ alkyl, $CF_3$, $OCF_3$, $SO_2CF_3$, F, CN, $NO_2$, $SF_5$, D and H.

3. The organic electroluminescent device according to claim 1, wherein $R^1$ and $R^2$ are selected the same from the group comprising of substituted or unsubstituted phenyl, substituted or unsubstituted pyridinyl, substituted or unsubstituted pyrimidyl, substituted or unsubstituted triazinyl wherein the one or more substituents on $R^1$ or $R^2$ are independently selected from the group comprising of partially fluorinated or perfluorinated $C_1$ to $C_6$ alkyl, $CF_3$, $OCF_3$, $SO_2CF_3$, F, CN, $NO_2$, $SF_5$, D and H.

4. The organic electroluminescent device according to claim 1, wherein $R^1$ and $R^2$ are independently selected from the group comprising of substituted or unsubstituted phenyl, wherein the one or more substituents on $R^1$ or $R^2$ are independently selected from the group comprising of partially fluorinated or perfluorinated $C_1$ to $C_6$ alkyl or $CF_3$.

5. The organic electroluminescent device according to claim 1, wherein compound of Formula (I) is represented by Formulae (IIc):

(IIc)

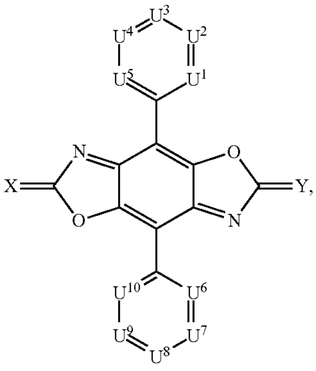

wherein $U^1$ is selected from $CQ^1$ or N;
$U^2$ is selected from $CQ^2$ or N;
$U^3$ is selected from $CQ^3$ or N;
$U^4$ is selected from $CQ^4$ or N;
$U^5$ is selected from $CQ^5$ or N;
$U^6$ is selected from $CQ^6$ or N;
$U^7$ is selected from $CQ^7$ or N;
$U^8$ is selected from $CQ^8$ or N;
$U^9$ is selected from $CQ^9$ or N;
$U^{10}$ is selected from $CQ^{10}$ or N;
$Q^1$, $Q^2$, $Q^3$, $Q^4$, $Q^5$, $Q^6$, $Q^7$, $Q^8$, $Q^9$, $Q^{10}$ are independently selected from the group comprising of partially fluorinated or perfluorinated $C_1$ to $C_6$ alkyl, $CF_3$, partially fluorinated or perfluorinated $C_1$ to $C_4$ alkoxy, $OCF_3$, partially fluorinated or perfluorinated $C_1$ to $C_4$ alkylsulfonyl, $SO_2CF_3$, F, CN, $NO_2$, $SF_5$, D and H;
X and Y are $C(CN)_2$.

6. The organic electroluminescent device according to claim 1, wherein $R^1$ and $R^2$ are independently selected or selected the same from the group comprising B1 to B47:

(B1)

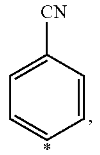

(B2)

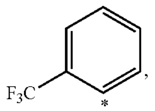

(B3)

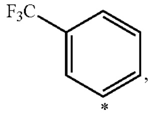

(B4)

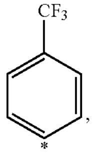

(B5)

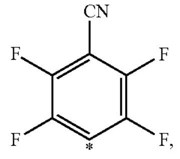

(B6)

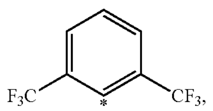

(B7)

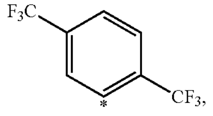

(B8)

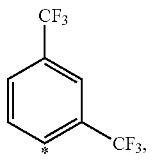

(B9)

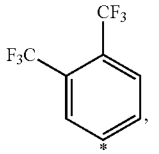

(B10)

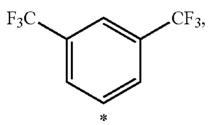

-continued
(B11)
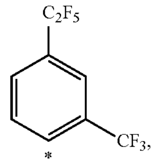
(B12)
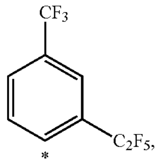
(B13)
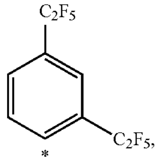
(B14)
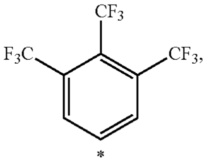
(B15)
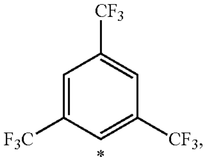
(B16)
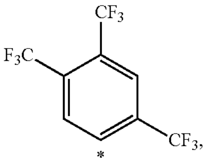
(B17)
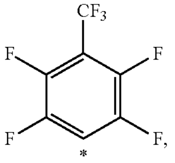
(B18)
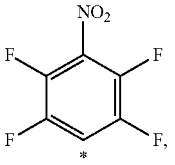
-continued
(B19)
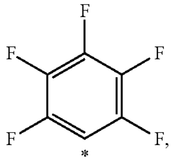
(B20)
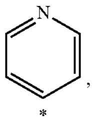
(B21)
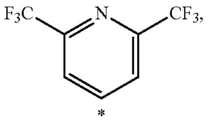
(B22)
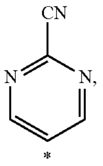
(B23)
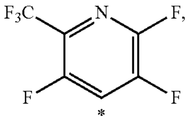
(B24)
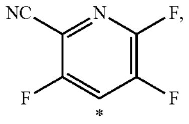
(B25)
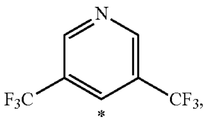
(B26)
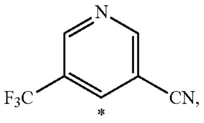
(B27)
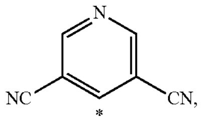
(B28)
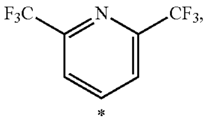

-continued
(B29)
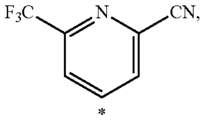
(B30)
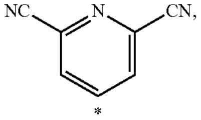
(B31)
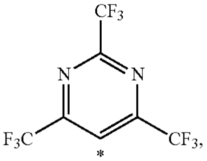
(B32)
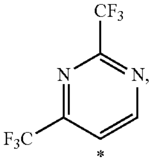
(B33)
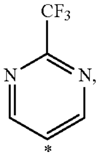
(B34)
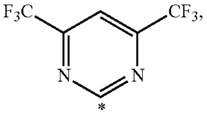
(B35)
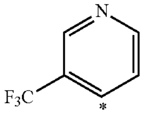
(B36)
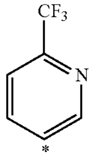
(B37)
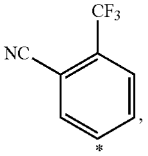
(B38)
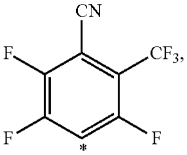
-continued
(B39)
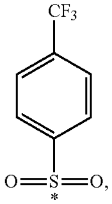
(B40)
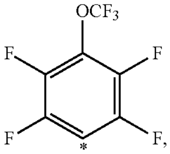
(B41)
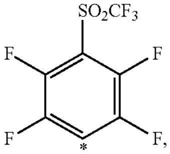
(B42)
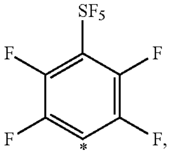
(B43)
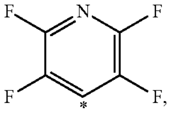
(B44)
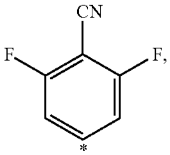
(B45)
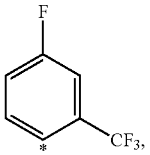
(B46)
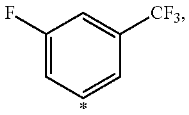
(B47)
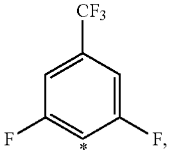
wherein
the asterisk “*” denotes the binding position.

7. The organic electroluminescent device according to claim 1, wherein the substituents $R^1$ and $R^2$ of Formula (I) are selected from the group comprising:

$R^1$=B1 and $R^2$=B1,
$R^1$=B2 and $R^2$=B2,
$R^1$=B3 and $R^2$=B3,
$R^1$=B4 and $R^2$=B4,
$R^1$=B2 and $R^2$=B3,
$R^1$=B2 and $R^2$=B4,
$R^1$=B3 and $R^2$=B4,
$R^1$=B5 and $R^2$=B5,
$R^1$=B6 and $R^2$=B6,
$R^1$=B7 and $R^2$=B7,
$R^1$=B8 and $R^2$=B8,
$R^1$=B9 and $R^2$=B9,
$R^1$=B10 and $R^2$=B10,
$R^1$=B6 and $R^2$=B7,
$R^1$=B6 and $R^2$=B8,
$R^1$=B6 and $R^2$=B9,
$R^1$=B6 and $R^2$=B10,
$R^1$=B7 and $R^2$=B7,
$R^1$=B7 and $R^2$=B8,
$R^1$=B7 and $R^2$=B9,
$R^1$=B7 and $R^2$=B10,
$R^1$=B8 and $R^2$=B8,
$R^1$=B8 and $R^2$=B9,
$R^1$=B8 and $R^2$=B10,
$R^1$=B8 and $R^2$=B11,
$R^1$=B12 and $R^2$=B12,
$R^1$=B13 and $R^2$=B13,
$R^1$=B14 and $R^2$=B14,
$R^1$=B15 and $R^2$=B15,
$R^1$=B16 and $R^2$=B16,
$R^1$=B17 and $R^2$=B17,
$R^1$=B18 and $R^2$=B18,
$R^1$=B19 and $R^2$=B19,
$R^1$=B20 and $R^2$=B20,
$R^1$=B21 and $R^2$=B21,
$R^1$=B22 and $R^2$=B22,
$R^1$=B23 and $R^2$=B23,
$R^1$=B24 and $R^2$=B24,
$R^1$=B25 and $R^2$=B25,
$R^1$=B26 and $R^2$=B26,
$R^1$=B27 and $R^2$=B27,
$R^1$=B28 and $R^2$=B28,
$R^1$=B29 and $R^2$=B29,
$R^1$=B30 and $R^2$=B30,
$R^1$=B31 and $R^2$=B31
$R^1$=B32 and $R^2$=B32,
$R^1$=B33 and $R^2$=B33,
$R^1$=B34 and $R^2$=B34,
$R^1$=B35 and $R^2$=B35,
$R^1$=B36 and $R^2$=B36,
$R^1$=B37 and $R^2$=B37,
$R^1$=B38 and $R^2$=B38,
$R^1$=B39 and $R^2$=B39,
$R^1$=B40 and $R^2$=B40,
$R^1$=B41 and $R^2$=B41,
$R^1$=B42 and $R^2$=B42,
$R^1$=B43 and $R^2$=B43,
$R^1$=B44 and $R^2$=B44.

8. The organic electroluminescent device according to claim 1, wherein at least one or more light-emitting unit comprises each at least one hole transport layer, at least one electron blocking layer, at least one emission layer, at least one hole blocking layer, and at least one an electron transport layer.

9. The organic electroluminescent device according to claim 1, wherein the organic electronic device comprises at least two light-emitting units of a first light-emitting unit and a second light-emitting unit, and wherein the first light-emitting unit is arranged closer to the anode than the second light-emitting unit, wherein each light-emitting unit is free of a hole injection layer, and wherein the semiconductor layer is a hole injection layer and arranged between the anode and the first light emitting unit.

10. The organic electroluminescent device according to claim 1, wherein the organic electronic device comprises at least three light-emitting units of a first light-emitting unit, a second light emitting unit and a third light-emitting unit, and wherein the first light-emitting unit is arranged closer to the anode than the second light-emitting unit, and wherein the third light emitting unit is arranged closer to the cathode layer than the second light-emitting unit, wherein each light-emitting are free of a hole injection layer, and wherein the semiconductor layer is a hole injection layer and arranged between the anode and the first light emitting unit.

11. The organic electroluminescent device according to claim 1, wherein between adjacent light-emitting units a charge generation layer is disposed.

12. The organic electroluminescent device according to claim 1, wherein a first charge generation layer is disposed between a first light-emitting unit and a second light-emitting unit, wherein the first light-emitting unit is arranged closer to the anode than the second light-emitting unit.

13. The organic electroluminescent device according to claim 1, wherein the organic electroluminescent device comprises:

at least three light-emitting units, and at least two charge generation layers, wherein the first charge generation layer is disposed between a set of two adjacent light-emitting units and the second charge generation layer is disposed between two adjacent light-emitting units, wherein between two adjacent light emitting units not more than one charge generation is arranged.

14. The organic electroluminescent device according to claim 1, wherein the organic electroluminescent device comprises:

at least four light-emitting units and at least three charge generation layers, wherein the first charge generation layers is disposed between a set of adjacent two light-emitting units, and the second charge generation layer is disposed between two adjacent light-emitting units, and the third charge generation layer is disposed between two adjacent light-emitting units, wherein between two adjacent light emitting units not more than one charge generation is arranged.

15. The organic electroluminescent device according to claim 1, wherein a charge generation layer comprises a n-type charge generation layer and the p-type charge generation layer.

16. The organic electroluminescent device according to claim 15, wherein the n-type charge generation layer and the p-type charge generation layer of a charge generation layer are arranged in a direct contact.

17. The organic electroluminescent device according to claim 15, wherein the n-type charge generation layer is arranged closer to the anode layer than the p-type charge generation layer.

18. The organic electroluminescent device according to claim 1, wherein a hole transport layer is arranged in direct contact with the p-type charge generation layer.

19. The organic electroluminescent device according to claim 18, wherein the hole transport layer is arranged closer to the cathode than the p-type charge generation layer.

20. The organic electroluminescent device according to claim 15, wherein the n-type charge generation layer comprises a material selected from the group comprising a metal dopant or a metal dopant and a host material.

21. The organic electroluminescent device according to claim 15, wherein an electron transport layer is in direct contact to the n-type charge generation layer.

22. The organic electroluminescent device according to claim 1, wherein the p-type charge generation is in direct contact to a hole transport layer.

23. The organic electroluminescent device according to claim 15, wherein the electron transport layer is in direct contact to the n-type charge generation layer and the p-type charge generation is in direct contact to a hole transport layer.

24. The organic electroluminescent device according to claim 1, wherein electron transport layer is free of a material selected from the group comprising a metal dopant.

25. The organic electroluminescent device according to claim 1, wherein the organic electroluminescent device comprises at least two charge generation layers contain the same compound of Formula (I), at least three charge generation layers contain the same compound of Formula (I), four charge generation layers contain the same compound of Formula (I), or all charge generation layers contains the same compound of Formula (I).

26. The organic electroluminescent device according to claim 1, wherein the p-type charge generation layer and the hole injection layer comprise an identical covalent matrix compound.

27. The organic electroluminescent device according to claim 1, wherein the p-type charge generation layer comprises an organic hole transport material and a compound of Formula (I).

28. An organic electronic device comprising the organic electronic device of claim 1, whereby the organic electronic device is an electroluminescent device, an organic light emitting diode (OLED), a light emitting device, thin film transistor, a battery, a display device or an organic photovoltaic cell (OPV).

* * * * *